United States Patent
Namerikawa et al.

(10) Patent No.: US 8,847,681 B2
(45) Date of Patent: Sep. 30, 2014

(54) COMBINER FOR DOHERTY AMPLIFIER

(75) Inventors: Masahiko Namerikawa, Seto (JP);
Shinsuke Yano, Nagoya (JP); Yasufumi Horio, Nagoya (JP); Tatsuya Tsuruoka, Ena (JP); Takami Hirai, Toyota (JP); Hideaki Okubo, Kawasaki (JP); Atsuo Mizuma, Saku (JP)

(73) Assignee: NGK Insulators, Ltd., Nagoya (JP)

( * ) Notice: Subject to any disclaimer, the term of this patent is extended or adjusted under 35 U.S.C. 154(b) by 617 days.

(21) Appl. No.: 12/909,226

(22) Filed: Oct. 21, 2010

(65) Prior Publication Data
US 2011/0169590 A1    Jul. 14, 2011

Related U.S. Application Data

(60) Provisional application No. 61/254,336, filed on Oct. 23, 2009, provisional application No. 61/254,343, filed on Oct. 23, 2009.

(30) Foreign Application Priority Data

Sep. 15, 2010    (WO) .................. PCT/JP2010/065958

(51) Int. Cl.
*H03F 1/02* (2006.01)
*H01P 5/18* (2006.01)
*H01P 5/12* (2006.01)
*H03F 3/60* (2006.01)

(52) U.S. Cl.
CPC ........ *H03F 1/0288* (2013.01); *H03F 2200/204* (2013.01); *H01P 5/187* (2013.01); *H01P 5/12* (2013.01); *H03F 3/602* (2013.01)
USPC .............. 330/126; 333/116; 333/128; 330/54

(58) Field of Classification Search
CPC ....... H01P 5/184; H01P 5/187; H03F 1/0288; H03F 2200/204
USPC ........... 333/109, 116, 128, 136, 185; 330/54, 330/126
See application file for complete search history.

(56) References Cited

U.S. PATENT DOCUMENTS 5,650,756 A    7/1997    Hayashi
5,966,059 A  *  10/1999   Sigmon .......................... 333/128

(Continued)

FOREIGN PATENT DOCUMENTS

JP    06-216680 A1    8/1994
JP    07-106898 A1    4/1995

(Continued)

OTHER PUBLICATIONS

Chinese Office Action (Application No. 201080047831.4) dated May 4, 2014 (with English translation of pertinent portion).

(Continued)

*Primary Examiner* — Benny Lee
*Assistant Examiner* — Rakesh Patel
(74) *Attorney, Agent, or Firm* — Burr & Brown, PLLC

(57) ABSTRACT

A combiner for a Doherty amplifier includes, on and in a dielectric substrate, a carrier input terminal, a peak input terminal, an output terminal, a combining point for combining an output signal from the carrier amplifier and an output signal from the peak amplifier, a first λ/4 line connected between the carrier input terminal and the combining point, a second λ/4 line connected between the combining point and the output terminal, and a first directional coupler. The first directional coupler includes a third λ/4 line electromagnetically coupled to one, to be monitored, of the first λ/4 line and the second λ/4 line.

12 Claims, 45 Drawing Sheets

(56) References Cited

U.S. PATENT DOCUMENTS

| | | | |
|---|---|---|---|
| 6,528,732 B1 * | 3/2003 | Okubora et al. | 174/255 |
| 6,700,444 B2 | 3/2004 | Pengelly | |
| 6,791,417 B2 | 9/2004 | Pengelly et al. | |
| 6,801,083 B2 * | 10/2004 | Ishigami et al. | 330/52 |
| 6,825,738 B2 * | 11/2004 | Shumovich | 333/112 |
| 7,262,656 B2 * | 8/2007 | Shiikuma | 330/124 R |
| 7,268,617 B2 | 9/2007 | Kijima | |
| 7,576,626 B2 * | 8/2009 | Gorbachov | 333/112 |
| 7,671,699 B2 * | 3/2010 | Wren | 333/109 |
| 7,786,797 B2 | 8/2010 | Okazaki et al. | |
| 2008/0266020 A1 * | 10/2008 | Nosaka | 333/26 |
| 2010/0013521 A1 | 1/2010 | Mizuma et al. | |

FOREIGN PATENT DOCUMENTS

| | | |
|---|---|---|
| JP | 2002-124840 A1 | 4/2002 |
| JP | 2005-525727 A1 | 8/2005 |
| JP | 2006-67176 | 3/2006 |
| JP | 2006-173722 | 6/2006 |
| JP | 2006-174409 A1 | 6/2006 |
| JP | 2006-525751 A1 | 11/2006 |
| JP | 2007-173647 | 7/2007 |
| JP | 2007-228062 | 9/2007 |
| JP | 2008-022513 | 1/2008 |
| JP | 2008-219175 | 9/2008 |
| JP | 2008-252215 A1 | 10/2008 |
| JP | 2009-176839 | 8/2009 |
| JP | 2009-206675 | 9/2009 |
| JP | 2010-206351 | 9/2010 |
| WO | 2008/136080 A1 | 11/2008 |

OTHER PUBLICATIONS

Japanese Office Action (Application No. 2011-537180) dated Jul. 15, 2014 (with English translation of pertinent portion).

* cited by examiner

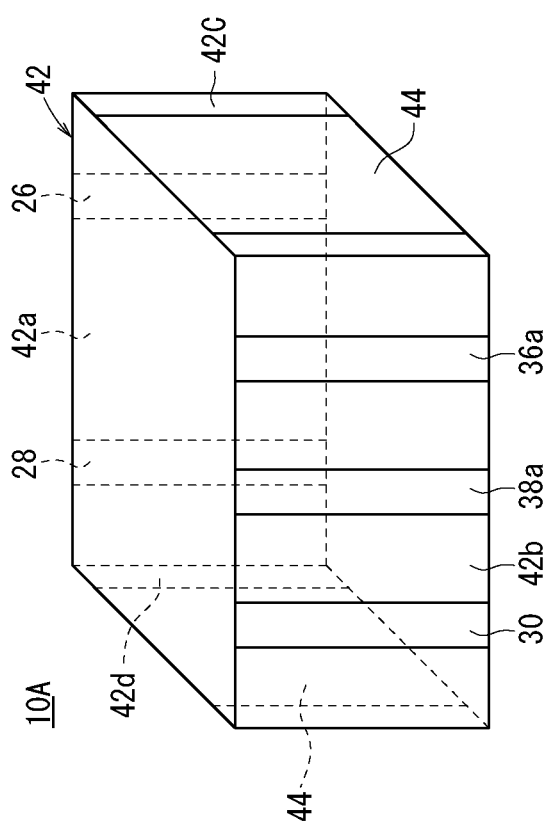

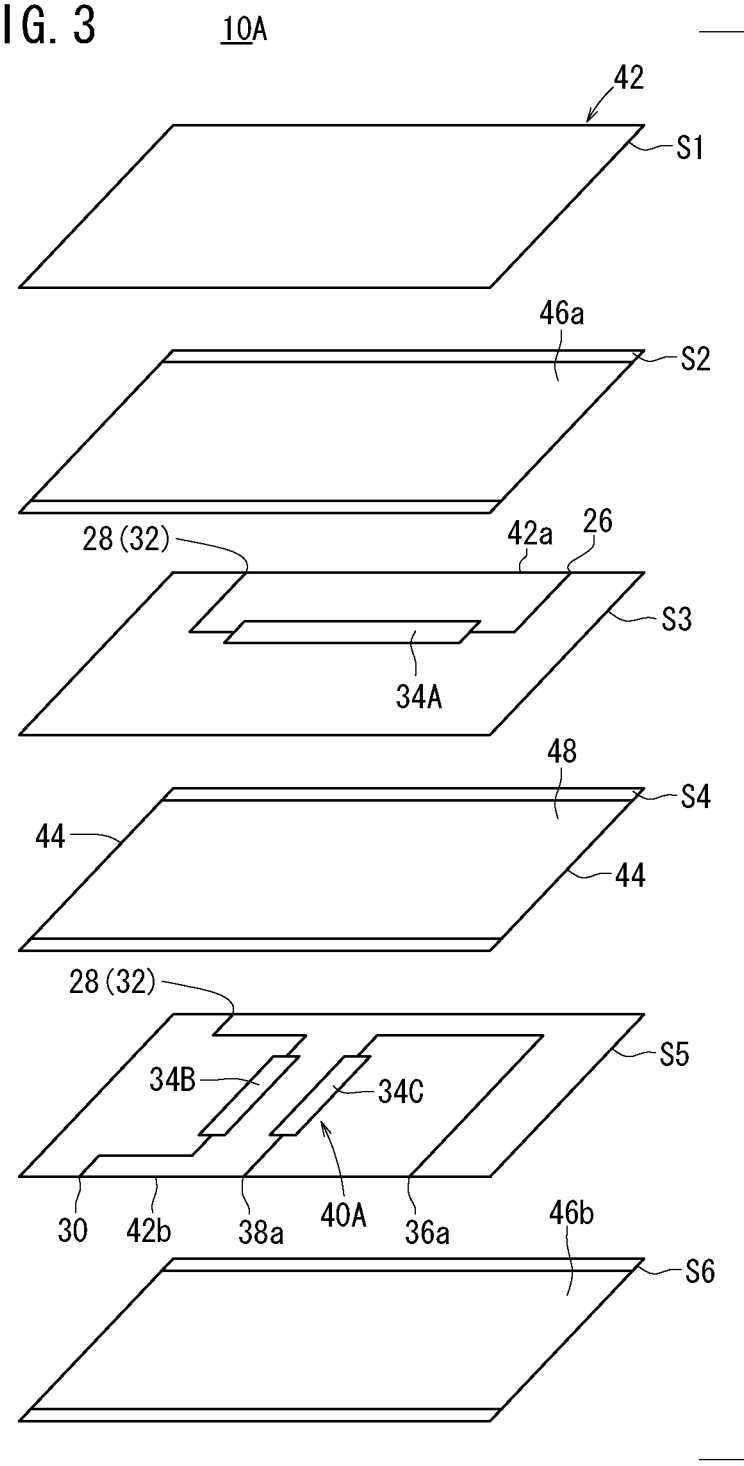

COMBINER FOR DOHERTY AMPLIFIER

CROSS-REFERENCE TO RELATED APPLICATION

This application is based upon and claims the benefit of priority from U.S. Provisional Patent Applications No. 61/254,336 filed on Oct. 23, 2009 and No. 61/254,343 filed on Oct. 23, 2009, and International Application No. PCT/JP2010/065958 filed on Sep. 15, 2010, of which the contents are incorporated herein by reference.

BACKGROUND OF THE INVENTION

1. Field of the Invention

The present invention relates to a combiner for being connected to the output stage of a Doherty amplifier and combining an output signal from a carrier amplifier and an output signal from a peak amplifier.

2. Description of the Related Art

Recently, cellular telephone base stations have incorporated transmission amplifiers for communicating with cellular telephones that are present in the areas covered by the base stations. The transmission amplifier is required to be adapted for an increased number of cellular telephones in the areas and an increased communication rate which results from and wider usage of data communications in the cellular telephone environment. Therefore, the transmission amplifier needs to reduce a gain distortion and a phase distortion of its output signal. The transmission amplifier is a circuit with maximum electric power consumption in the base station. Consequently, it is important for cellular telephone service providers to improve the amplifier efficiency of the transmission amplifier in order to meet demands for a reduction in the cost of consumed electric power and demands for a reduction in greenhouse gas emissions that have been posed on the cellular telephone service providers for environmental protection.

Generally, there is a trade-off between the gain and phase distortions of the output signal of an amplifier and the amplifier efficiency thereof. At present, efforts are being made to seek a technology for improving those characteristics comprehensively. Specifically, in order to improve the gain distortion and the phase distortion of the output signal of a transmission amplifier, the output signal of the transmission amplifier is partly monitored and digitally processed, and an input signal applied to the transmission amplifier is adjusted to reduce the distortions based on the digitally processed signal. Such a process is known as a so-called DPD (Digital Pre Distortion) technology.

Heretofore, a Doherty amplifier is widely used as the transmission power amplifier in cellular telephone base stations for improving the amplifier efficiency with which to amplify cellular telephone signals.

The Doherty amplifier comprises a carrier amplifier and a peak amplifier connected in parallel to each other. The carrier amplifier and the peak amplifier are controlled in operation to improve the amplifier efficiency with which to amplify a signal such as a cellular telephone signal wherein the difference between the average power and the peak power is large.

To meet an increase in the communication rate for cellular telephone and an increase in the number of cellular telephones accommodated in base station areas, it is necessary to control a distortion of the output signal of a transmission amplifier. For such distortion control, a circuit based on the DPD technology has been used.

Specifically, the output signal of a Doherty amplifier which is produced by combining the output signals of the carrier and peak amplifiers thereof is partly extracted and digitally processed, and the input signal applied to the Doherty amplifier is adjusted to reduce distortions of the output signal of the Doherty amplifier based on the digitally processed signal.

To perform the above process, the circuit based on the DPD technology includes a Doherty amplifier combiner for combining output signals of the carrier and peak amplifiers and a directional coupler having a coupling in the range from −20 dB to −40 dB, the directional coupler being connected between the Doherty amplifier combiner and an output antenna. The directional coupler produces an output signal which is supplied as an input signal to a digital processor.

One conventional Doherty amplifier combiner is disclosed in Japanese Laid-Open Patent Publication No. 2008-252215. The disclosed conventional Doherty amplifier combiner is a circuit connected to the output terminal of a Doherty amplifier, for combining output signals of the carrier and peak amplifiers thereof. Specifically, the disclosed conventional Doherty amplifier combiner is in the form of a chip including, in a dielectric substrate, a first $\lambda/4$ line connected between a combining point where the output signals of the carrier and peak amplifiers are combined and the carrier amplifier and a second $\lambda/4$ line connected between the combining point and an output terminal.

The signal which passes through the directional coupler is output from the Doherty amplifier and hence has a high power level ranging from several tens W to several hundreds W. However, the directional coupler loses a large amount of electric power because it causes a large power consumption loss.

Due to errors caused when a circuit board on which the Doherty amplifier combiner and the directional coupler are mounted is manufactured and errors when the Doherty amplifier combiner and the directional coupler are installed on the circuit board, the output signal from the directional coupler tends to change in level and phase, and hence the digital processor tends to fail to carry out a sufficient corrective process. In such a case, the amplifier efficiency of the Doherty amplifier has to be sacrificed in order to keep the distortions of the amplifier output signal at a prescribed level.

The DPD technology referred to above makes it possible for an amplifier having a simple AM/AM distortion (gain distortion) curve shown in FIG. 44 of the accompanying drawings to perform a highly advanced distortion correcting process. On the other hand, the Doherty amplifier has an AM/AM distortion curve including an inflection point Pb shown in FIG. 45 of the accompanying drawings because of a mechanism wherein the peak amplifier starts to operate after the carrier amplifier starts to be saturated. The inflection point Pb becomes greater as the peak amplifier starts to operate at a higher output level in order to increase the efficiency of the Doherty amplifier. Consequently, if the distortions are to be reduced to a value allowable for the amplifier, then the efficiency of the Doherty amplifier has to be sacrificed.

SUMMARY OF THE INVENTION

It is an object of the present invention to provide a Doherty amplifier combiner which is capable of improving problematic gain and phase distortions of a Doherty amplifier without causing a reduction in the amplifier efficiency of the Doherty amplifier, and which is made up of a reduced number of parts, thereby achieving a small and light circuit.

[1] According to a first aspect of the present invention, there is provided a combiner for a Doherty amplifier, for being connected to output terminals of a Doherty amplifier including a carrier amplifier and a peak amplifier and combining an output signal from the carrier amplifier and an output signal from the peak amplifier, the combiner comprising a first input terminal for being supplied with the output signal from the carrier amplifier, a second input terminal for being supplied with the output signal from the peak amplifier, an output terminal for outputting a signal obtained by combining the output signal from the carrier amplifier and the output signal from the peak amplifier, a combining point for combining the output signal from the carrier amplifier and the output signal from the peak amplifier, a first $\lambda/4$ line connected between the first input terminal and the combining point, a second $\lambda/4$ line connected between the combining point and the output terminal, and signal monitoring means for monitoring at least one of a signal flowing from the first input terminal to the combining point, a signal flowing from the second input terminal to the combining point, and a signal flowing from the combining point to the output terminal.

[2] In the first aspect, the signal monitoring means comprises a directional coupler, and the directional coupler has a third $\lambda/4$ line electromagnetically coupled to one, to be monitored, of the first $\lambda/4$ line and the second $\lambda/4$ line.

[3] In the first aspect, the combiner further comprises a monitor terminal connected to an end of the third $\lambda/4$ line, and a termination resistor connected to another end of the third $\lambda/4$ line.

[4] In the first aspect, the combiner further comprises a dielectric substrate comprising a plurality of stacked dielectric layers, wherein the first input terminal, the second input terminal, the output terminal, and the monitor terminal are disposed on surfaces of the dielectric substrate, and the first $\lambda/4$ line, the second $\lambda/4$ line, and the third $\lambda/4$ line are disposed in the dielectric substrate.

[5] In the first aspect, the combiner further comprises an inner-layer shield electrode disposed in the dielectric substrate and lying between the one, to be monitored, of the first $\lambda/4$ line and the second $\lambda/4$ line and the third $\lambda/4$ line, and the other, not to be monitored, of the first $\lambda/4$ line and the second $\lambda/4$ line.

[6] In the first aspect, the combiner further comprises a fourth $\lambda/4$ line connected to the third $\lambda/4$ line, for matching a characteristic impedance of the third $\lambda/4$ line to a characteristic impedance of the one, to be monitored, of the first $\lambda/4$ line and the second $\lambda/4$ line.

[7] In the first aspect, the one, to be monitored, of the first $\lambda/4$ line and the second $\lambda/4$ line, the third $\lambda/4$ line, and the fourth $\lambda/4$ line have respective characteristic impedances which are identical to each other.

[8] In the first aspect, the third $\lambda/4$ line is electromagnetically coupled to the second $\lambda/4$ line.

[9] In the first aspect, the third $\lambda/4$ line is electromagnetically coupled to the first $\lambda/4$ line.

[10] In the first aspect, the fourth $\lambda/4$ line has an end connected to an end of the third $\lambda/4$ line, and the combiner further comprises a termination resistor connected to another end of the third $\lambda/4$ line, and a monitor terminal connected to another end of the fourth $\lambda/4$ line.

[11] In the first aspect, the fourth $\lambda/4$ line has an end connected to an end of the third $\lambda/4$ line, the combiner further comprises a monitor terminal connected to another end of the third $\lambda/4$ line, and a termination resistor connected to another end of the fourth $\lambda/4$ line.

[12] In the first aspect, the combiner further comprises a dielectric substrate comprising a plurality of stacked dielectric layers, wherein the first input terminal, the second input terminal, the output terminal and the monitor terminal are disposed on surfaces of the dielectric substrate, and the first $\lambda/4$ line, the second $\lambda/4$ line, the third $\lambda/4$ line and the fourth $\lambda/4$ line are disposed in the dielectric substrate.

[13] In the first aspect, the combiner further comprises a first inner-layer shield electrode disposed in the dielectric substrate and lying between the one, to be monitored, of the first $\lambda/4$ line and the second $\lambda/4$ line and the third $\lambda/4$ line, and the other, not to be monitored, of the first $\lambda/4$ line and the second $\lambda/4$ line, and a second inner-layer shield electrode disposed in the dielectric substrate and lying between the one, to be monitored, of the first $\lambda/4$ line and the second $\lambda/4$ line, and the fourth $\lambda/4$ line.

[14] In the first aspect, the third $\lambda/4$ line and the fourth $\lambda/4$ line are connected to each other through a via hole.

[15] In the first aspect, the combiner further comprises a monitor circuit connected to the monitor terminal, for monitoring an output signal from the directional coupler, wherein the monitor circuit includes a diode.

[16] In the first aspect, the signal monitoring means comprises a directional coupler, and the directional coupler comprises a fifth $\lambda/4$ line connected between the second $\lambda/4$ line and the output terminal, and a sixth $\lambda/4$ line electromagnetically coupled to the fifth $\lambda/4$ line.

[17] In the first aspect, the combiner further comprises a monitor terminal connected to an end of the sixth $\lambda/4$ line, and a termination resistor connected to another end of the sixth $\lambda/4$ line.

[18] In the first aspect, the combiner further comprises a dielectric substrate comprising a plurality of stacked dielectric layers, wherein the first input terminal, the second input terminal, the output terminal, and the monitor terminal are disposed on surfaces of the dielectric substrate, and the first $\lambda/4$ line, the second $\lambda/4$ line, the fifth $\lambda/4$ line, and the sixth $\lambda/4$ line are disposed in the dielectric substrate.

[19] In the first aspect, the combiner further comprises an inner-layer shield electrode disposed in the dielectric substrate and lying between the first $\lambda/4$ line and the second $\lambda/4$ line, and the fifth $\lambda/4$ line and the sixth $\lambda/4$ line.

[20] In the first aspect, the signal monitoring means comprises a first monitor terminal for outputting amplitude information of a carrier signal from the carrier amplifier.

[21] In the first aspect, the signal monitoring means comprises a first monitor line extending parallel to a first line between the first input terminal and the first $\lambda/4$ line and electromagnetically coupled to the first line, and the first monitor line is connected to the first monitor terminal.

[22] In the first aspect, the combiner further comprises a first monitor circuit connected to the first monitor terminal, for monitoring an output signal from the first monitor line, wherein the first monitor circuit includes a diode.

[23] In the first aspect, the signal monitoring means comprises a second monitor terminal for outputting amplitude information of a peak signal from the peak amplifier.

[24] In the first aspect, the signal monitoring means comprises a second monitor line extending parallel to a second line between the second input terminal and the first $\lambda/4$ line and electromagnetically coupled to the second line, and the second monitor line is connected to the second monitor terminal.

[25] In the first aspect, the combiner further comprises a second monitor circuit connected to the second monitor terminal, for monitoring an output signal from the second monitor line, wherein the second monitor circuit includes a diode.

[26] In the first aspect, the signal monitoring means comprises a first monitor terminal for outputting amplitude information of a carrier signal from the carrier amplifier, a first monitor line extending parallel to a first line between the first input terminal and the first $\lambda/4$ line and electromagnetically coupled to the first line, the first monitor line being connected to the first monitor terminal, a second monitor terminal for outputting amplitude information of a peak signal from the peak amplifier, and a second monitor line extending parallel to a second line between the second input terminal and the first $\lambda/4$ line and electromagnetically coupled to the second line, the second monitor line being connected to the second monitor terminal.

[27] In the first aspect, the combiner further comprises a first monitor circuit connected to the first monitor terminal, for monitoring an output signal from the first monitor line, and a second monitor circuit connected to the second monitor terminal, for monitoring an output signal from the second monitor line, wherein the first monitor circuit and the second monitor circuit include diodes, respectively.

[28] In the first aspect, the signal monitoring means comprises a third monitor terminal for outputting amplitude information of an output signal from the Doherty amplifier, and a third monitor line extending parallel to a third line between the output terminal and the second $\lambda/4$ line and electromagnetically coupled to the third line, the third monitor line being connected to the third monitor terminal.

[29] In the first aspect, the combiner further comprises a third monitor circuit connected to the third monitor terminal, for monitoring an output signal from the third monitor line, wherein the third monitor circuit includes a diode.

[30] In the first aspect, the first input terminal and the first $\lambda/4$ line are capacitively coupled to each other, and the second input terminal and the first $\lambda/4$ line are capacitively coupled to each other.

[31] According to a second aspect of the present invention, there is provided a combiner for a Doherty amplifier, for being connected to output terminals of a Doherty amplifier including a plurality of carrier amplifiers and a peak amplifier and combining output signals from the carrier amplifiers and an output signal from the peak amplifier, the combiner comprising a plurality of first input terminals for being supplied with the output signals from the carrier amplifiers, a second input terminal for being supplied with the output signal from the peak amplifier, an output terminal for outputting a signal obtained by combining the output signals from the carrier amplifiers and the output signal from the peak amplifier, a combining point for combining the output signals from the carrier amplifiers and the output signal from the peak amplifier, a plurality of first $\lambda/4$ lines connected respectively between the first input terminals and the combining point, a second $\lambda/4$ line connected between the combining point and the output terminal, and signal monitoring means for monitoring at least one of signals flowing from the first input terminals to the combining point, a signal flowing from the second input terminal to the combining point, and a signal flowing from the combining point to the output terminal.

[32] In the second aspect, the combiner further comprises a dielectric substrate comprising a plurality of stacked dielectric layers, wherein the first input terminals, the second input terminal, and the output terminal are disposed on surfaces of the dielectric substrate, and the first $\lambda/4$ lines and the second $\lambda/4$ line are disposed in the dielectric substrate.

[33] In the second aspect, the combiner further comprises inner-layer shield electrodes disposed in the dielectric substrate and lying respectively between the first $\lambda/4$ lines and between the first $\lambda/4$ lines and the second $\lambda/4$ line.

[34] According to a third aspect, there is provided a combiner for Doherty amplifiers, comprising a first combining section for being connected to output terminals of a first Doherty amplifier including a first carrier amplifier and a first peak amplifier and combining an output signal from the first carrier amplifier and an output signal from the first peak amplifier, a second combining section for being connected to output terminals of a second Doherty amplifier including a second carrier amplifier and a second peak amplifier and combining an output signal from the second carrier amplifier and an output signal from the second peak amplifier, and a directional coupler comprising a seventh $\lambda/4$ line connected to an output terminal of the first combining section and an eighth $\lambda/4$ line connected to an output terminal of the second combining section.

[35] In the third aspect, the combiner further comprises a dielectric substrate comprising a plurality of stacked dielectric layers, wherein the first combining section, the second combining section, and the directional coupler are disposed in the dielectric substrate.

[36] In the third aspect, the combiner further comprises inner-layer shield electrodes disposed in the dielectric substrate and lying respectively between the first combining section, the second combining section, and the directional coupler.

[37] In the first through third aspects, the dielectric substrate has a plurality of grooves defined in a surface thereof which is opposite to another surface thereof on which a circuit board is to be placed.

[38] In the first through third aspects, the dielectric substrate has a thermal via defined therein.

As described above, the combiner for a Doherty amplifier according to the present invention is capable of improving problematic gain and phase distortions of a Doherty amplifier without causing a reduction in the amplifier efficiency of the Doherty amplifier, and is capable of reducing the number of parts, thereby achieving a small and light circuit.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 2 is a perspective view of the first combiner;

FIG. 3 is an exploded perspective view of the first combiner;

DESCRIPTION OF THE PREFERRED EMBODIMENTS

Figure 1:
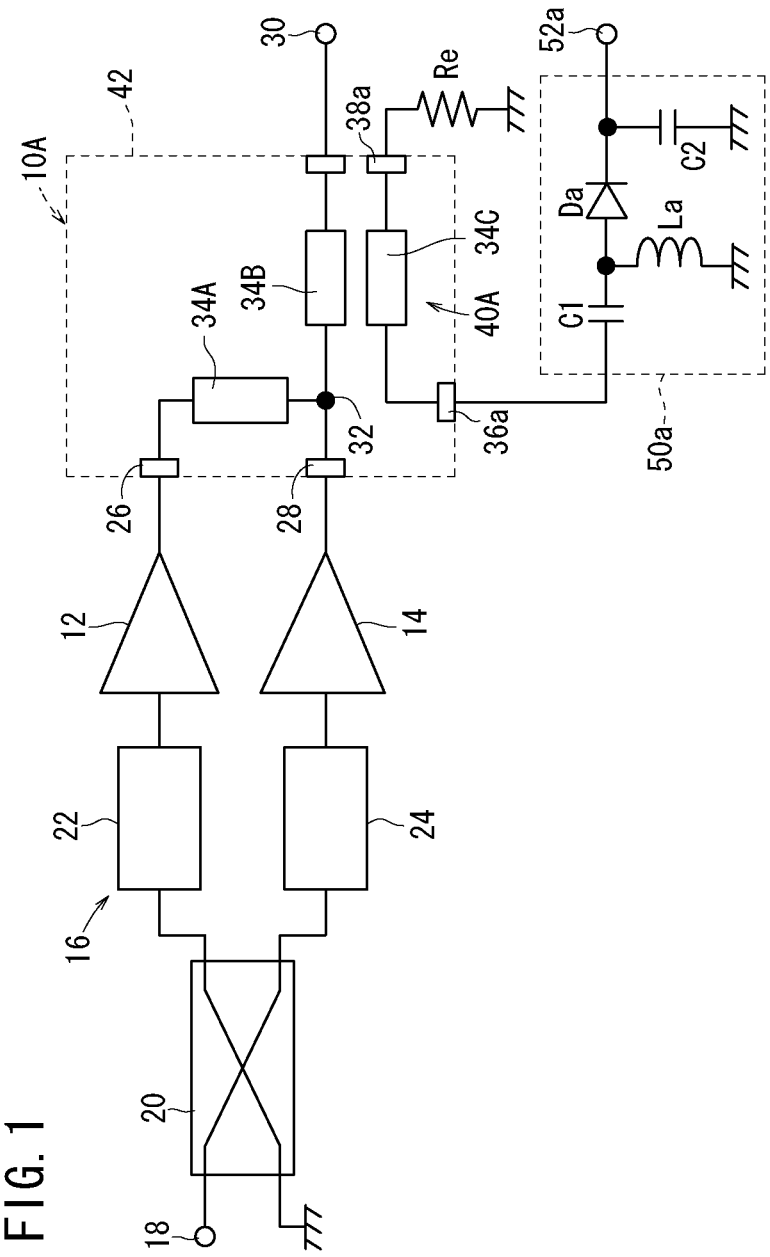
FIG. 1 is a block diagram showing a circuit arrangement of a combiner for a Doherty amplifier (first combiner) according to a first embodiment of the present invention.

Combiners for a Doherty amplifier according to preferred embodiments of the present invention will be described in detail below with reference to the accompanying drawings.

Like or corresponding parts are denoted by like or corresponding reference characters.

A combiner for a Doherty amplifier (hereinafter simply referred to as "first combiner 10A") according to a first embodiment of the present invention will be described below with reference to FIGS. 1 through 4B.

As shown in FIG. 1, the first combiner 10A is a circuit connected to the output terminals of a Doherty amplifier 16 which has a carrier amplifier 12 and a peak amplifier 14, for combining an output signal from the carrier amplifier 12 and an output signal from the peak amplifier 14.

As shown in FIG. 1, the Doherty amplifier 16 comprises a signal divider 20 for dividing an input signal from an input terminal 18 into two signals, a carrier impedance matching section 22 for achieving impedance matching between one of the outputs of the signal divider 20 and an input of the carrier amplifier 12, the carrier amplifier 12 described above that is biased into class AB (which operates when its input power level is low), a peak impedance matching section 24 for achieving impedance matching between the other output of the signal divider 20 and an input of the peak amplifier 14, and the peak amplifier 14 described above that is biased into class B or class C (which operates when its input power level is sufficiently high).

The first combiner 10A comprises a carrier input terminal 26 for being supplied with an output signal from the carrier amplifier 12, a peak input terminal 28 for being supplied with an output signal from the peak amplifier 14, an output terminal 30 for outputting a signal obtained by combining the output signal from the carrier amplifier 12 and the output signal from the peak amplifier 14, a combining point 32 for combining the output signal from the carrier amplifier 12 and the output signal from the peak amplifier 14, a first λ/4 line 34A connected between the carrier input terminal 26 and the combining point 32, a second λ/4 line 34B connected between the combining point 32 and the output terminal 30, and a third λ/4 line 34C electromagnetically coupled to the second λ/4 line 34B. A first monitor terminal 36a is connected to an end of the third λ/4 line 34C, and a termination resistor Re is connected to the other end of the third λ/4 line 34C through a first termination terminal 38a. The second λ/4 line 34B and the third λ/4 line 34C jointly make up a directional coupler (first directional coupler 40A).

The first combiner 10A and the first directional coupler 40A are integrally disposed in a dielectric substrate 42. Specifically, as shown in FIG. 2, the first combiner 10A has the dielectric substrate 42 which comprises a plurality of stacked dielectric layers sintered together. The dielectric substrate 42 has a first side surface 42a on which at least the carrier input terminal 26 and the peak input terminal 28 are disposed, and a second side surface 42b (opposite to the first side surface 42a) on which at least the output terminal 30, the first monitor terminal 36a and the first termination terminal 38a are disposed. The dielectric substrate 42 also has a third side surface 42c and a fourth side surface 42d (opposite to the third side surface 42c) on both of which respective shield terminals 44 are disposed.

As shown in FIG. 3, the first λ/4 line 34A which is disposed in the dielectric substrate 42 is connected between the carrier input terminal 26 and the peak input terminal 28. The second λ/4 line 34B which is disposed in the dielectric substrate 42 is connected between the peak input terminal 28 (doubling as the combining point 32) and the output terminal 30. The third λ/4 line 34C which is disposed in the dielectric substrate 42 is connected between the first monitor terminal 36a and the first termination terminal 38a. These components of the first combiner 10A and the first directional coupler 40A are constructed as one chip.

Specifically, the dielectric substrate 42 comprises first through sixth dielectric layers S1 through S6, arranged successively from above, stacked together. Each of the first through sixth dielectric layers S1 through S6 comprises a single layer or a plurality of layers.

The first combiner 10A also includes an upper shield electrode 46a disposed in an upper portion of the dielectric substrate 42 (on an upper surface of the dielectric substrate 42 or on a principal surface of a dielectric layer near the upper surface of the dielectric substrate 42), and a lower shield electrode 46b disposed in a lower portion of the dielectric substrate 42 (on a lower surface of the dielectric substrate 42 or on a principal surface of a dielectric layer near the lower surface of the dielectric substrate 42). Specifically, the upper shield electrode 46a is disposed on a principal surface of the second dielectric layer S2, and the lower shield electrode 46b is disposed on a principal surface of the sixth dielectric layer S6. The upper shield electrode 46a and the lower shield electrode 46b are connected to the shield terminals 44.

Further, the first combiner 10A includes the first λ/4 line 34A disposed on a principal surface of the third dielectric layer S3, the second λ/4 line 34B and third λ/4 line 34C of the first directional coupler 40A disposed on a principal surface of the fifth dielectric layer S5, and an inner-layer shield electrode 48 disposed on a principal surface of the fourth dielectric layer S4 positioned between the third dielectric layer S3 and the fifth dielectric layer S5. The inner-layer shield electrode 48 is connected to the shield terminals 44.

As shown in FIG. 1, a first monitor circuit 50a is electrically connected to the first monitor terminal 36a. The first monitor circuit 50a is a circuit for monitoring the level of a signal which flows from the combining point 32 to the output terminal 30. The first monitor circuit 50a comprises a coupling capacitor C1 and a PIN diode Da which are connected between the first monitor terminal 36a and a first monitor output terminal 52a, an inductor La serving as a biasing circuit for the PIN diode Da, and a capacitor C2 for storing a detected current from the PIN diode Da as an electric charge and outputting the stored electric charge as a detected and rectified signal (a signal representative of a signal level: current and voltage).

Operation and advantages of the first combiner 10A will be described below in comparison with a general combiner for a Doherty amplifier (hereinafter referred to as "ordinary combiner 200").

Generally, the Doherty amplifier 16 has a carrier amplifier 12 biased into class AB and a peak amplifier 14 biased into class B or class C. Up to an input level where the peak amplifier 14 operates, the carrier amplifier 12 operates alone. When the carrier amplifier 12 enters its saturation region, i.e., when the carrier amplifier 12 starts to lose its linearity, the peak amplifier 14 starts to operate, and cooperates with the carrier amplifier 12 to drive a load.

Figure 4A:
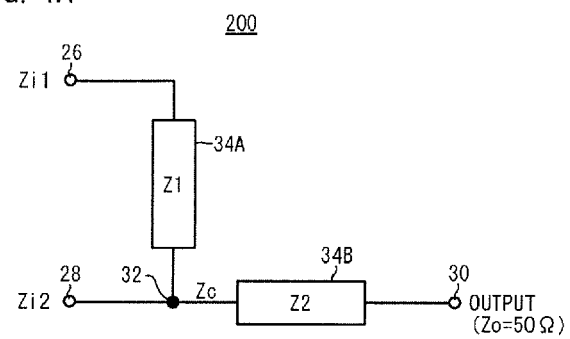
FIG. 4A is a block diagram showing the relationship between impedances of an ordinary prior art combiner for a Doherty amplifier.

The impedances of components of the ordinary combiner 200 will be analyzed below. As shown in FIG. 4A, if the output load has an impedance Zo, then an impedance Zc of the second λ/4 line 34B as seen from the combining point 32 is expressed by:

$$Zc = Z2^2/Zo$$

where Z2 represents a characteristic impedance of the second λ/4 line 34B.

An impedance of the first λ/4 line 34A as seen from the carrier amplifier 12 (a port impedance Zi1 of the carrier input terminal 26), and an impedance of the first λ/4 line 34A as seen from the peak amplifier 14 (a port impedance Zi2 of the peak input terminal 28) are different in a low power mode and a high power mode.

Specifically, in the low power mode (when the peak amplifier 14 is not in operation), since the port impedance Zi2 is essentially infinitely large (open), the port impedances Zi1, Zi2 are expressed by:

$$Zi1 = Z1^2/Zc \text{ (lower power mode)}$$

$$Zi2 = \text{infinitely large (low power mode)}$$

where Z1 represents a characteristic impedance of the first λ/4 line 34A.

In the high power mode (when the peak amplifier 14 is in operation), since the output load is equally shared, the port impedances Zi1, Zi2 are expressed by:

$$Zi1 = Z1^2/2Zc \text{ (high power mode)}$$

$$Zi2 = 2Zc \text{ (high power mode)}.$$

When the Doherty amplifier 16 is used in a high frequency range, since generally the port impedances Zi1, Zi2 are set to be equal to each other in the high power mode, the following equation is satisfied:

$Z1^2/2Zc=2Zc$, as a result, $Z1=2Zc$.

If 2Zc is indicated as K, then the port impedances and the characteristic impedances of the ordinary combiner 200 are given as shown in Table 1 below:

TABLE 1

|  | Port Impedance (Ω) | | | Characteristic Impedance (Ω) | |
| --- | --- | --- | --- | --- | --- |
|  | Zi1 | Zi2 | Zo | Z1 | Z2 |
| Low Power | 2K | ∞ | 50 | K | √(50 × (K/2)) |
| High Power | K | K |  |  |  |

Figure 4B:
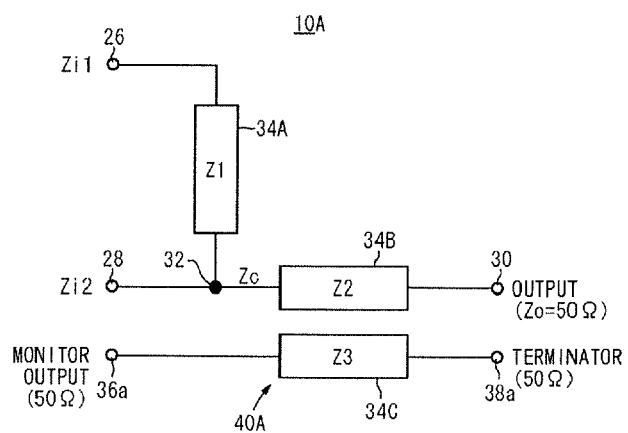
FIG. 4B is a block diagram showing the relationship between impedances of the first combiner.

In view of the above impedances of the ordinary combiner 200, the impedances of components of the first combiner 10A will be analyzed below. As shown in FIG. 4B, because $Zc=Z2^2/Zo$, the characteristic impedance Z2 of the second λ/4 line 34B is expressed by:

$Z2=\sqrt{(50\times(K/2))}$

As the impedances of the first monitor terminal 36a and the termination resistor Re are of 50 ohms each, the characteristic impedance Z3 of the third λ/4 line 34C is also of 50 ohms. The port impedances and the characteristic impedances of the first combiner 10A are given as shown in Table 2 below:

TABLE 2

|  | Port Impedance (Ω) | | | Characteristic Impedance (Ω) | | |
| --- | --- | --- | --- | --- | --- | --- |
|  | Zi1 | Zi2 | Zo | Z1 | Z2 | Z3 |
| Low Power | 2K | ∞ | 50 | K | √(50 × (K/2)) | 50 |
| High Power | K | K |  |  |  |  |

If K=100 ohms, then since the characteristic impedance Z2 of the second λ/4 line 34B of the first directional coupler 40A and the characteristic impedance Z3 of the third λ/4 line 34C thereof are of 50 ohms each, the directionality of the first directional coupler 40A, i.e., the ratio of the output signal from the first monitor terminal 36a and the output signal from the first termination terminal 38a, is sufficiently high. If K is not of 100 ohms, then as the characteristic impedances Z2, Z3 are different from each other, the directionality of the first directional coupler 40A is low depending on the difference between the impedances.

In the first combiner 10A, the combining section for the Doherty amplifier and the first directional coupler 40A which follows the combining section are integrally formed with each other. Therefore, the connection between the combining section and the first directional coupler 40A is not affected by manufacturing errors (variations) of the Doherty amplifier 16. As a result, the first directional coupler 40A produces a stable output signal, so that the distortions of the output signal from the Doherty amplifier 16 can be corrected by digital processing without a reduction in the amplifier efficiency of the Doherty amplifier 16.

In the first combiner 10A, the combining section and the first directional coupler 40A are constructed in the form of striplines in the dielectric substrate 42 and stacked one on the other. Accordingly, the area in which the first combiner 10A is mounted on a circuit board is reduced. If an unwanted signal leaked between the combining section and the first directional coupler 40A, then it would appear as noise in an input signal supplied to the digital distortion correcting circuit, and as a result, hinder the digital distortion correcting circuit from correcting the distortions sufficiently. According to the first combiner 10A, the inner-layer shield electrode 48 is disposed between the first λ/4 line 34A and the second and third λ/4 lines 34B, 34C of the first directional coupler 40A. The inner-layer shield electrode 48 is effective to prevent an unwanted signal from leaking between the combining section and the first directional coupler 40A. Therefore, the above problems can be avoided.

The third λ/4 line 34C is formed for being electromagnetically coupled to the second λ/4 line 34B of the combining section. Consequently, the combining section and the directional coupler are integrally formed with each other in one dielectric substrate 42. As a result, the first combiner 10A is free of a loss which would otherwise be caused by the directional coupler. The overall efficiency of the Doherty amplifier 16 is thus increased without a reduction in the distortion correcting capability. Furthermore, as the output signal from the Doherty amplifier 16 is monitored using the second λ/4 line 34B, the output signal from the Doherty amplifier 16 does not suffer a loss, and hence the amplifier efficiency of the Doherty amplifier 16 is improved without its gain and phase distortions being increased.

Since the first monitor terminal 36a is connected to the first directional coupler 40A, the output signal from the Doherty amplifier 16 can be monitored through the first monitor terminal 36a. Therefore, the amplifier efficiency of the Doherty amplifier 16 is improved without its gain and phase distortions being increased. In particular, since the first monitor circuit 50a is connected to the first monitor terminal 36a and is of a circuit arrangement including the diode Da, the first monitor circuit 50a is capable of detecting a high-frequency signal from the Doherty amplifier 16. The envelope component of the high-frequency signal from the Doherty amplifier 16 can be input to a DPD digital processing circuit, and the gain and phase distortions can be efficiently improved according to the DPD technology.

Stated otherwise, the first combiner 10A allows the output signal from the Doherty amplifier 16 to be monitored highly accurately. The gain and phase distortions of the Doherty amplifier 16 can thus be improved without a reduction in the efficiency of the Doherty amplifier 16. The stripline structure in the dielectric substrate 42 makes the first combiner 10A resistant to influence from external circuits, prevents a signal from leaking between the combining section and the first directional coupler 40A, and is effective in reducing the gain and phase distortions of the Doherty amplifier 16.

The first combiner 10A is also effective to reduce the number of parts required for reducing output and phase distortions of the Doherty amplifier 16, resulting in a reduction in the size and weight of the circuit for reducing the distortions of the Doherty amplifier 16. As a consequence, increase in the construction cost of a cellular telephone base station due to an increased number of devices on the antenna can be suppressed. Also, the reduced number of parts results in a reduced number of joints between the parts, and thus, reliability of the circuit is enhanced.

A process of producing (manufacturing) the first combiner 10A will be described below with reference to FIGS. 5 through 8C.

First, a first ceramic compact 62A (see FIG. 7B) having a patterned conductor 60 which forms the first λ/4 line 34A and the like is formed, and a second ceramic compact 62B (see FIG. 8C) without a patterned conductor 60 is formed. Next, the first ceramic compact 62A and the second ceramic compact 62B are stacked together into a ceramic stack. Then, the ceramic stack is burned, and thus the first combiner 10A is produced.

First, a process of producing the first ceramic compact 62A having the patterned conductor 60 will be described below.

Figure 5:
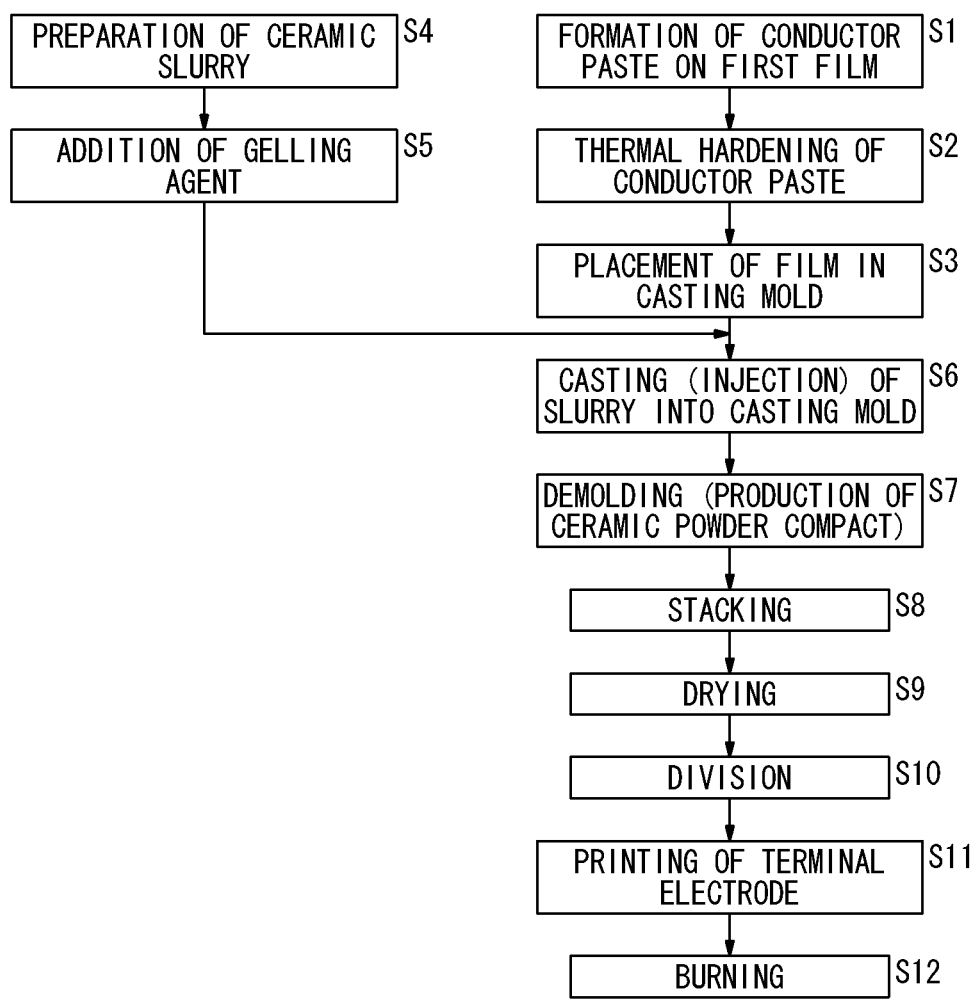
FIG. 5 is a flowchart showing a process of manufacturing the first combiner.
Figure 6A:
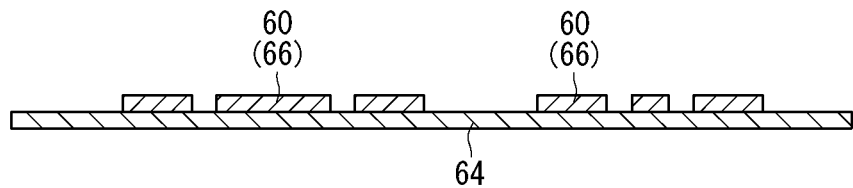
FIG. 6A is a cross-sectional view of a structure obtained when a patterned conductor is formed of a conductor paste formed on a film.

In step S1 of FIG. 5, as shown in FIG. 6A, a conductor paste 66 is printed on a film 64 to form a plurality of electrode patterns. In step S2, the conductor paste 66 printed on the film 64 are thermally hardened to form the patterned conductor 60 on the film 64.

The conductor paste 66 contains a resin and a powder of at least one metal selected from silver (Ag), gold (Au) and copper (Cu) series metals. The resin used in the conductor paste 66 is preferably a thermosetting resin precursor. In this case, the thermosetting resin precursor is preferably a self-reactive, resol-type phenolic resin. The film 64 is a PET (polyethylene terephthalate) film coated with a silicone release agent.

Preferably, the film 64 should be previously subjected to an annealing treatment at 150° C. for 10 minutes or more in order to prevent shrinkage and warping in the step of thermally hardening the conductor paste 66. As described above, the conductor paste 66 is printed and then hardened under heating. The hardening conditions may be controlled depending on the type of a hardening agent. For example, the resol-type phenolic resin is hardened at 80° C. to 150° C. for 10 to 60 minutes.

Figure 6B:
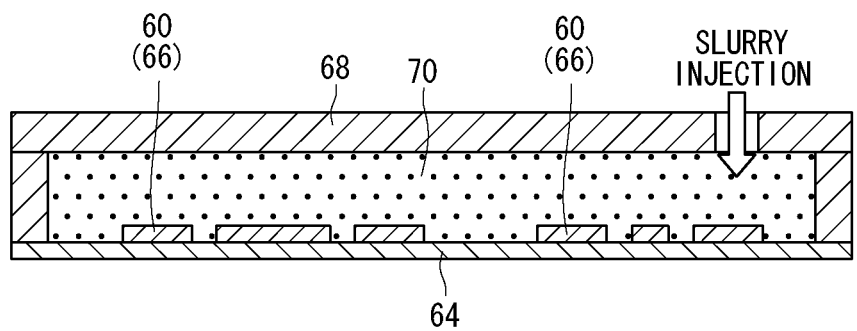
FIG. 6B is a cross-sectional view of a structure obtained when a slurry is injected into a casting mold after the film is placed in the casting mold.

In step S3 of FIG. 5, as shown in FIG. 6B, the casting mold 68 is assembled, and the film 64 having the patterned conductor 60 is placed in the casting mold 68.

Meanwhile, in steps S4 and S5 of FIG. 5, the slurry 70 to be injected into the casting mold 68 is prepared.

In step S4 of FIG. 5, a ceramic slurry is prepared. The ceramic slurry contains a ceramic powder prepared by mixing a titanium oxide- or barium oxide-based powder with a sintering aid of a borosilicate glass. Specifically, the ceramic slurry is a mixture of 100 parts by weight of the ceramic powder and an organic dispersion medium, which contains 27 parts by weight of an aliphatic dibasic acid ester, 3 parts by weight of triacetin, and 3 parts by weight of polycarboxylic acid copolymer (an organic dispersing agent).

In step S5 of FIG. 5, 1 to 10 parts by weight of a modified derivative of polymethylene polyphenyl polyisocyanate and 0.05 to 2.7 parts by weight of ethylene glycol are used as gelling agents, and 0.03 to 0.3 parts by weight of 6-dimethylamino-1-hexanol is used as a reaction catalyst. The agents are added to the above ceramic slurry, and the resulting mixture is stirred to prepare the gel casting slurry 70. That is, the slurry 70 contains a thermosetting resin precursor.

Figure 6C:
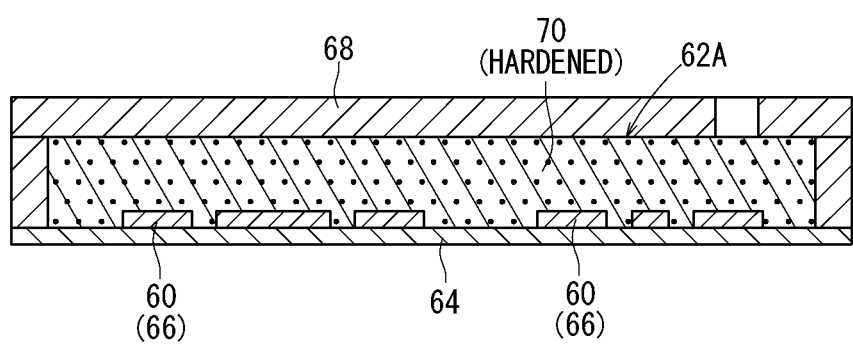
FIG. 6C is a cross-sectional view of a structure obtained when the slurry injected into casting the mold is hardened into a first ceramic compact.

In step S6 of FIG. 5, as shown in FIG. 6B, the slurry 70 is cast (injected) into the casting mold 68. Thus, a space in the casting mold 68 is filled with the slurry 70. The slurry 70 is a gel casting slurry, and thereby can be hardened without modification in the space. Thus, as shown in FIG. 6C, the first ceramic compact 62A is produced in the casting mold 68.

Figure 7A:
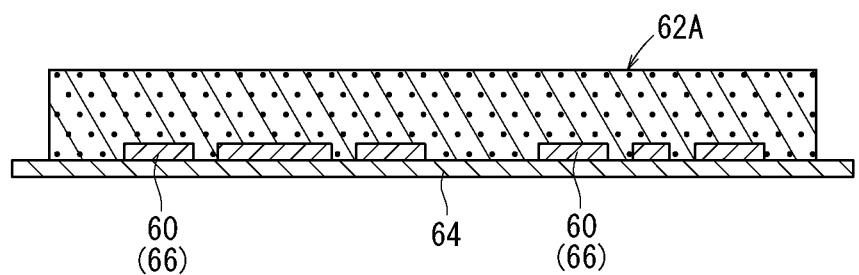
FIG. 7A is a cross-sectional view of a structure obtained when the first ceramic compact together with the film is removed from the casting mold.
Figure 7B:
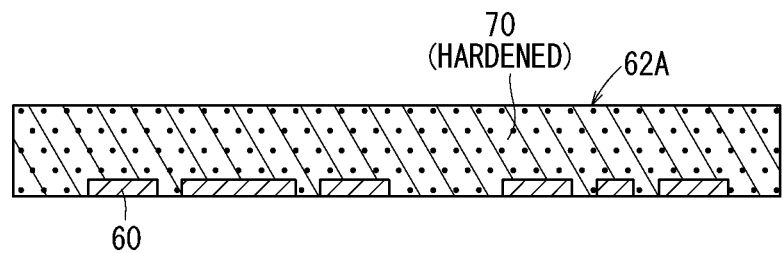
FIG. 7B is a cross-sectional view of a structure obtained when the first ceramic compact is separated from the film.

In step S7, the casting mold 68 is dismantled. In this case, the first ceramic compact 62A is disposed on the film 64 as shown in FIG. 7A. Thus, the first ceramic compact 62A having the buried, patterned conductor 60 can be obtained by removing the film 64 from the first ceramic compact 62A, as shown in FIG. 7B.

Figure 8A:
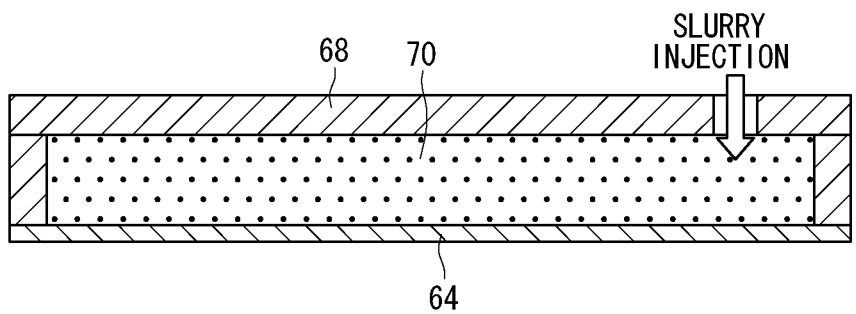
FIG. 8A is a cross-sectional view of a structure obtained when a slurry is injected into a casting mold after a film without a patterned conductor of a conductor paste is placed in the casting mold.
Figure 8B:
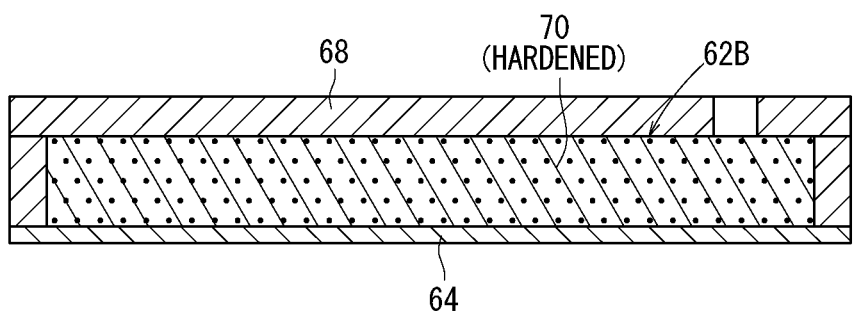
FIG. 8B is a cross-sectional view of a structure obtained when the slurry injected into the casting mold is hardened into a second ceramic compact.
Figure 8C:
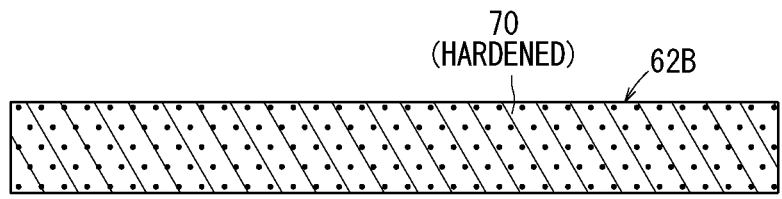
FIG. 8C is a cross-sectional view of a structure obtained when the second ceramic compact together with the film is removed from the casting mold and then the second ceramic compact is separated from the film.

Next, a process of producing the second ceramic compact 62B without a patterned conductor 60 will be described below. The process of producing the second ceramic compact 62B is basically the same as the process of producing the first ceramic compact 62A, but differs therefrom in that the processes in steps S1, S2 of FIG. 5 are not performed and that a film 64 without a patterned conductor 60 is placed in the casting mold 68. Thus, the second ceramic compact 62B without the patterned conductor 60 is obtained through steps S4 to S7. More specifically, as shown in FIG. 8A, the film 64 without the patterned conductor 60 is placed in the casting mold 68, and after the slurry 70 is cast (injected) into the casting mold 68, the slurry 70 is hardened at room temperature, a drying temperature, etc, as shown in FIG. 8B. Thereafter, the film 64 is removed, and then the second ceramic compact 62B is obtained as shown in FIG. 8C. In the following descriptions, the first and second ceramic compacts 62A, 62B will be referred to collectively as ceramic compacts 62 as long as the ceramic compacts do not have to be distinguished between the first ceramic compact 62A and second ceramic compact 62B.

Then, in step S8 of FIG. 5, a plurality of the ceramic compacts 62 are stacked to obtain a ceramic stack. Reactive functional groups of the ceramic compacts 62 are not completely reacted at room temperature, 1 to 48 hours after the casting. The ceramic compacts 62 are pressed in this state at a pressure of 5 to 100 kgf/cm$^2$. The pressure is appropriately selected depending on the strength of the ceramic compacts 62 and the acceptable stacking error.

When the pressure is too low in the stacking step, delamination is often caused in the burned product due to bonding failure, though the undesirable displacement of the stack is reduced. On the other hand, when the pressure is too high in the stacking step, the ceramic compacts 62 are often deformed or broken by the pressure, though the delamination is prevented. When the pressure is within the above range, the displacement and the delamination can be preferably prevented. After the above pressing at 5 to 100 kgf/cm$^2$, the ceramic compacts 62 may be further pressed at 50 to 400 kgf/cm$^2$ to improve the integrity, if necessary.

In this step, remaining reactive components in the adjacent ceramic compacts 62 are reacted to improve the bonding between the ceramic compacts 62. From the viewpoint of reducing the time required for the hardening reaction, it is preferred that the ceramic compacts 62 are stacked under heating at 60° C. to 80° C.

In view of producing the ceramic stack under a lower pressure, it is preferred that an adhesion layer is applied and printed on each interface of the ceramic compacts 62 in the stacking step. The adhesion layer may contain the same components as those of the slurry 70, but the reaction catalyst is not needed in the adhesion layer. The hardening reaction of the adhesion layer can be completed in a practically acceptable time due to the reaction catalyst remaining in the ceramic compacts 62.

It is also preferred that the sufficiently hardened or dried ceramic compacts 62 are stacked after applying or printing an adhesive paste onto the ceramic compacts 62. The adhesive paste may be prepared by mixing an inorganic powder equal to those in the ceramic compacts 62, a butyral resin, an acrylic resin, a butyl carbitol acetate medium, and/or an organic medium such as an aliphatic dibasic acid ester.

The adhesion between the ceramic compacts 62 can be improved in the above manner so as to prevent the delamination. When the adhesive paste is used, a medium may remain in the ceramic compacts 62, and may be removed beforehand by drying at 60° C. to 100° C. In the case of removing the medium, the resultant ceramic compact 62 is poor in plasticity, and thereby is difficult to handle. Therefore, it is preferred that 1 to 10 parts by weight of a plasticizer (DOP or DBP) is added to the unhardened slurry in order to improve the plasticity of the dried ceramic compact 62.

The ceramic stack is dried in step S9 of FIG. 5, and then is divided into a plurality of chips in step S10. In step S11, a terminal electrode is formed by printing on the upper or side surface of each chip. In step S12, each chip is burned to produce a plurality of the first combiners 10A.

Advantageous effects of the producing process according to the present embodiment will be described below. When a slurry containing a thermoplastic resin for the conventional ceramic part precursor is dried and shrunk, a boundary surface between the slurry and a patterned conductor is often gapped or cracked, and a green sheet is often warped. In the present invention, the above problem is solved such that the slurry 70 contains the thermosetting resin precursor, and the thermosetting resin precursor is hardened in the drying step to form a three dimensional network structure, whereby the shrinkage is reduced so that the above problems are solved.

In this case, it is preferred that the medium for the slurry 70 exhibits a low vapor pressure at a temperature for hardening the thermosetting resin precursor, so that the shrinkage due to the removal of the medium is lowered in the thermal hardening step. Particularly if a resin that is hardened at room temperature is used, processes and apparatuses therefor can be simplified.

A polyurethane resin is advantageous in that the elasticity of the hardened resin can be easily controlled, and that a flexible compact can be easily produced. A hard compact is not suitable for handling in a post-process in some cases. Though the thermosetting resin having the three-dimensional network structure is generally hard, the polyurethane resin can provide a flexible compact. A formed tape is often required to have a flexibility, and the polyurethane resin is particularly preferably used for forming such a tape. Further, a thermoplastic resin may be added to the slurry to control the properties of the slurry.

In conventional methods, when the slurry is applied, a conductor paste containing a thermoplastic resin is dissolved in a medium of the slurry, and the pattern is deformed. In the present invention, since the conductor paste 66 contains the thermosetting resin precursor, the medium resistance of the conductor paste 66 is improved, and the pattern is not deformed.

The thermosetting resin precursor irreversibly forms the three dimensional network structure in the hardening step. After the hardening step, the thermosetting resin precursor is not soluble in the medium. In general, the thermosetting resin precursor is higher in solvent resistance than the thermoplastic resin.

The thermosetting resin precursor is preferably a phenol resin, an epoxy resin, or a polyester resin. The preferred resins are advantageous in that the molecular weight of an unhardened prepolymer and the properties of a paste can be controlled. A thermoplastic resin may be used in combination with the thermosetting resin in order to control the paste properties.

Particularly an epoxy resin and a phenol resin can be hardened by heating without hardening agents, and are suitable for efficient use of the conductor paste 66. Another thermosetting resin precursor has to be used in combination with a hardening agent. Although the hardening agent should be mixed with the thermosetting resin precursor before the conductor paste 66 is printed, and the mixture cannot be stored. Thus, in a case where the residual conductor paste 66 is recovered and stored after the printing, the thermosetting epoxy or phenol resin that can be hardened without hardening agents are preferably used.

Because the conventional ceramic compact using the thermoplastic resin as a binder often has density unevenness, the burned ceramic body has a large dimensional unevenness, and the burned, buried patterned conductor has a large dimensional unevenness. In the present invention, the thermosetting resin precursor is used as the binder for producing the first ceramic compact 62A having the buried patterned conductor 60, so that the burning unevenness can be reduced. For example, the dimension of the burned first ceramic compact 62A mainly depends on the green densities of portions other than the patterned conductor 60. The burned ceramic body of the first ceramic compact 62A has only a few spaces. In contrast, the above portions of the first ceramic compact 62A have a large number of spaces, and the shrinkage in the burning step depends on the volume of the spaces.

The medium in the conventional slurry containing the thermoplastic resin as a binder is dried and removed to obtain the ceramic compact. The application volume ratio of the slurry to the ceramic compact is high, and the density unevenness is increased due to the high application ratio. In the present invention, the thermosetting resin precursor is used as the binder for the slurry 70, so that the slurry 70 can be hardened without removing the medium. Therefore, the application ratio can be lowered, and the green density unevenness can be reduced. As a result, the dimensional unevenness of the burned ceramic body can be reduced, and further the dimensional unevenness of the buried patterned conductor 60 can be reduced.

A combiner for a Doherty amplifier (hereinafter simply referred to as "second combiner 10B") according to a second embodiment of the present invention will be described below with reference to FIGS. 9 through 11.

Figure 9:
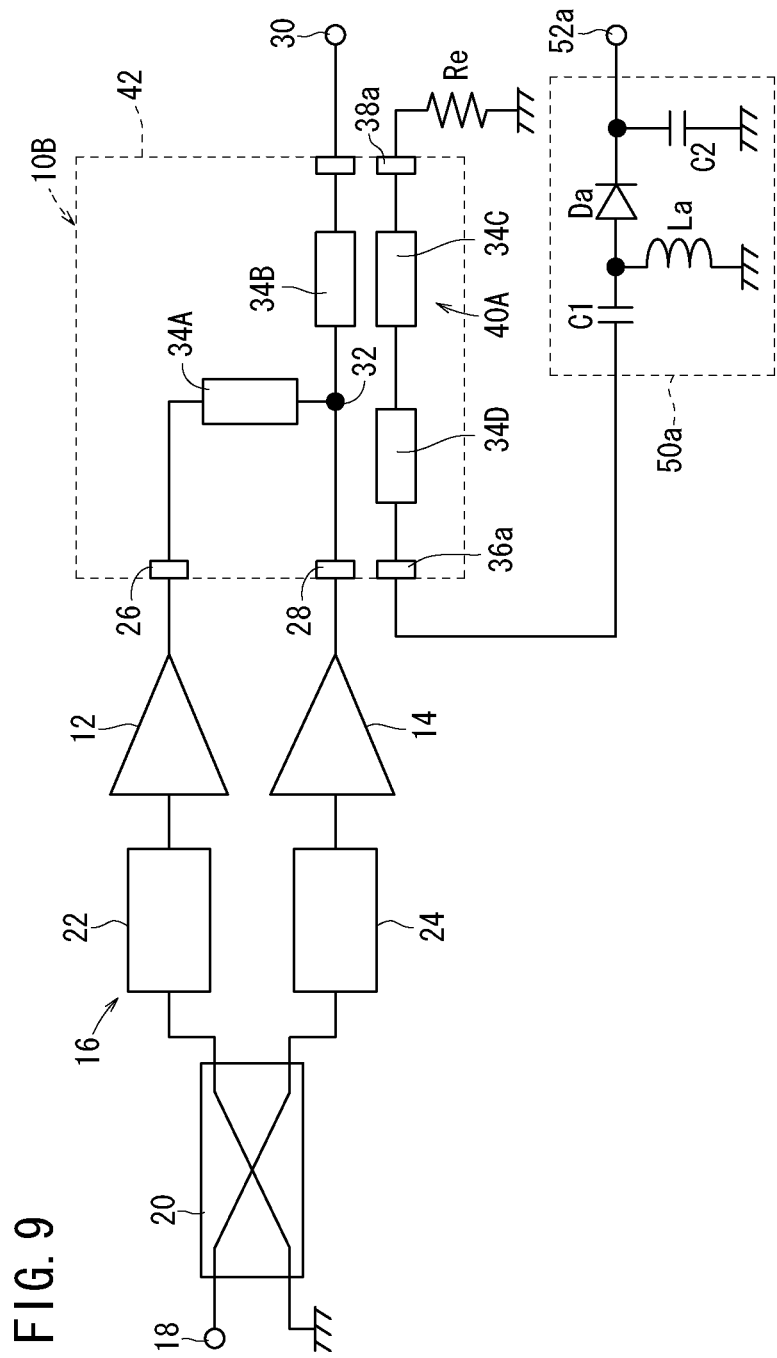
FIG. 9 is a block diagram showing a circuit arrangement of a combiner for a Doherty amplifier (second combiner) according to a second embodiment of the present invention.

As shown in FIG. 9, the second combiner 10B is substantially similar in structure to the first combiner 10A, but is different therefrom in that a fourth λ/4 line 34D is connected between the first monitor terminal 36a and the third λ/4 line 34C.

Figure 10:
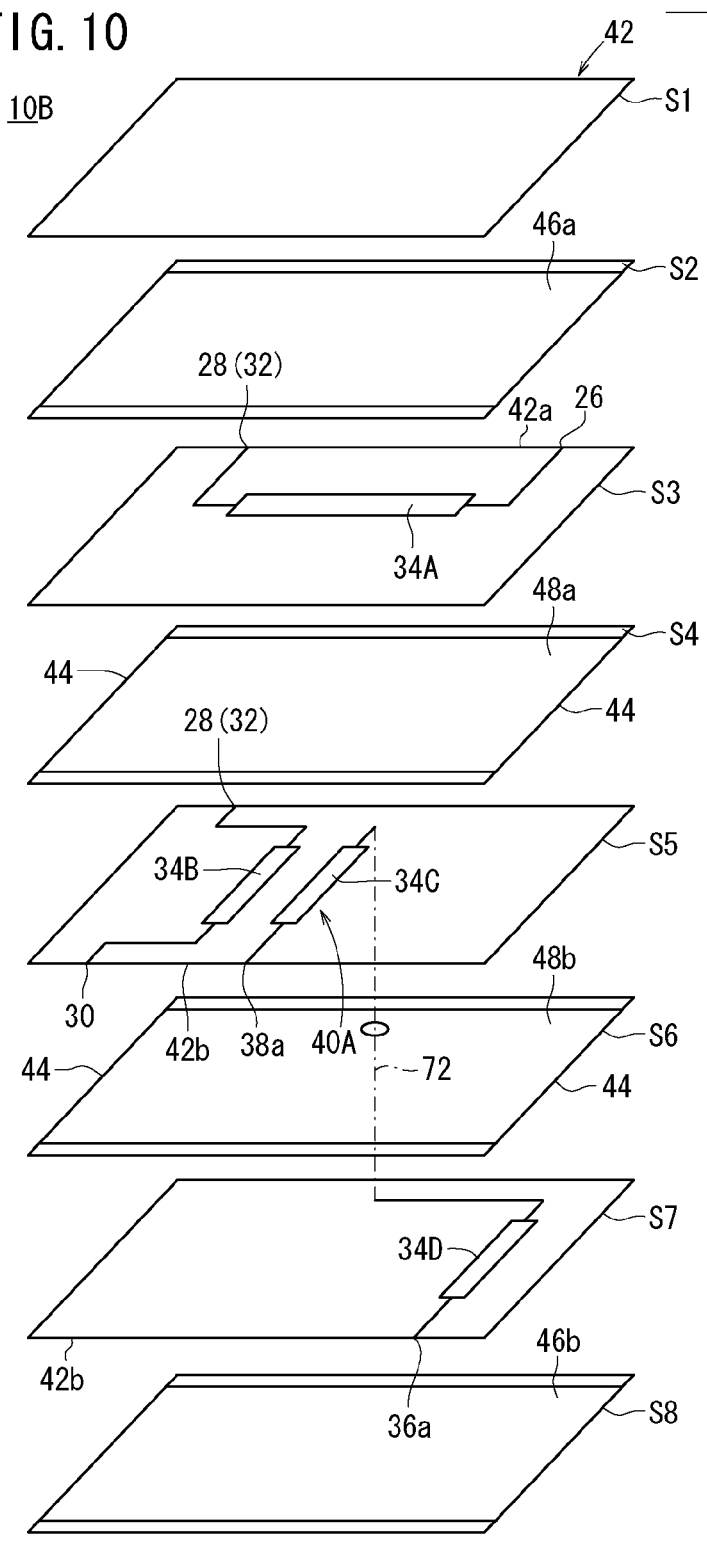
FIG. 10 is an exploded perspective view of the second combiner.
Figure 11:
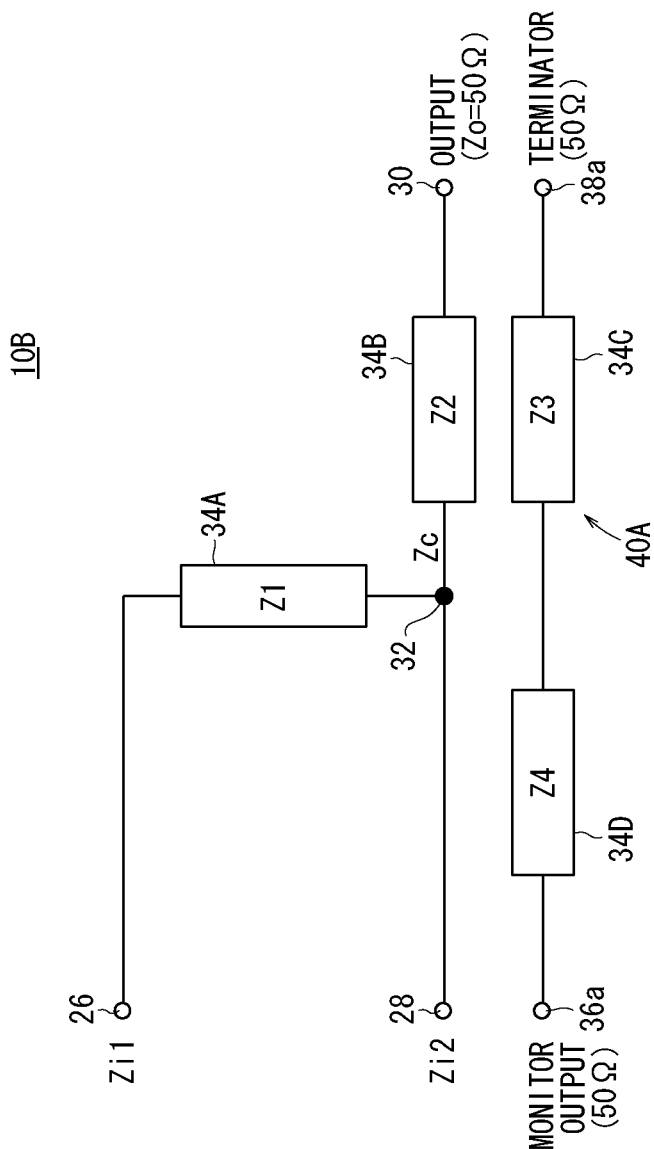
FIG. 11 is a block diagram showing the relationship between impedances of the second combiner.

As shown in FIG. 10, the second combiner 10B includes a dielectric substrate 42 comprising first through eighth dielectric layers S1 through S8, arranged successively from above, stacked together. A fourth λ/4 line 34D is disposed on a principal surface of the seventh dielectric layer S7. A first inner-layer shield electrode 48a is disposed on a principal surface of the fourth dielectric layer S4. A second inner-layer shield electrode 48b is disposed on a principal surface of the sixth dielectric layer S6. A lower shield electrode 46b is disposed on a principal surface of the eighth dielectric layer S8. The fourth λ/4 line 34D has an end connected to the first monitor terminal 36a and the other end connected to an end of the third λ/4 line 34C through a via hole 72 defined through the fifth dielectric layer S5 and the sixth dielectric layer S6. The first inner-layer shield electrode 48a and the second inner-layer shield electrode 48b are connected to the shield terminals 44.

As with the first combiner 10A, the second combiner 10B allows the distortions of the Doherty amplifier 16 to be corrected by digital processing without a reduction in the efficiency of the Doherty amplifier 16. The area in which the second combiner 10B is mounted on a circuit board is reduced. In the second combiner 10B, the first inner-layer shield electrode 48a is disposed between the first λ/4 line 34A and the second and third λ/4 lines 34B, 34C of the first directional coupler 40A, and the second inner-layer shield electrode 48b is disposed between the third λ/4 line 34C and the fourth λ/4 line 34D. Consequently, an unwanted signal is prevented from leaking between the combining section and the first directional coupler 40A and also between the first directional coupler 40A and the fourth λ/4 line 34D, so that noise is prevented from being applied to the digital distortion correcting circuit.

Furthermore, since the combining section and the directional coupler are integrally formed with each other in one dielectric substrate 42, the second combiner 10B is free of a loss which would otherwise be caused by the directional coupler. The overall efficiency of the Doherty amplifier 16 is thus increased without a reduction in the distortion correcting capability.

The impedances of components of the second combiner 10B will be analyzed below. As shown in FIG. 11, since the fourth λ/4 line 34D is connected between the first monitor terminal 36a and the third λ/4 line 34C, an impedance of the third λ/4 line 34C as seen from the midpoint between the third λ/4 line 34C and the fourth λ/4 line 34D is made equivalent to the impedance Zc of the second λ/4 line 34B as seen from the combining point 32. Further, as shown in Table 3 below, the second λ/4 line 34B to be monitored, and the third λ/4 line 34C and the fourth λ/4 line 34D of the first directional coupler 40A have respective characteristic impedances Z2, Z3, Z4 each of √(50×(K/2)).

TABLE 3

| | Port Impedance (Ω) | | | Characteristic Impedance (Ω) | | | |
|---|---|---|---|---|---|---|---|
| | Zi1 | Zi2 | Zo | Z1 | Z2 | Z3 | Z4 |
| Low Power | 2K | ∞ | 50 | K | √(50× (K/2)) | √(50× (K/2)) | √(50× (K/2)) |
| High Power | K | K | | | | | |

The directionality of the first directional coupler 40A can thus be sufficiently high even if K is of neither 50 ohms nor 100 ohms.

A combiner for a Doherty amplifier (hereinafter simply referred to as "third combiner 10C") according to a third embodiment of the present invention will be described below with reference to FIGS. 12 and 13.

Figure 12:
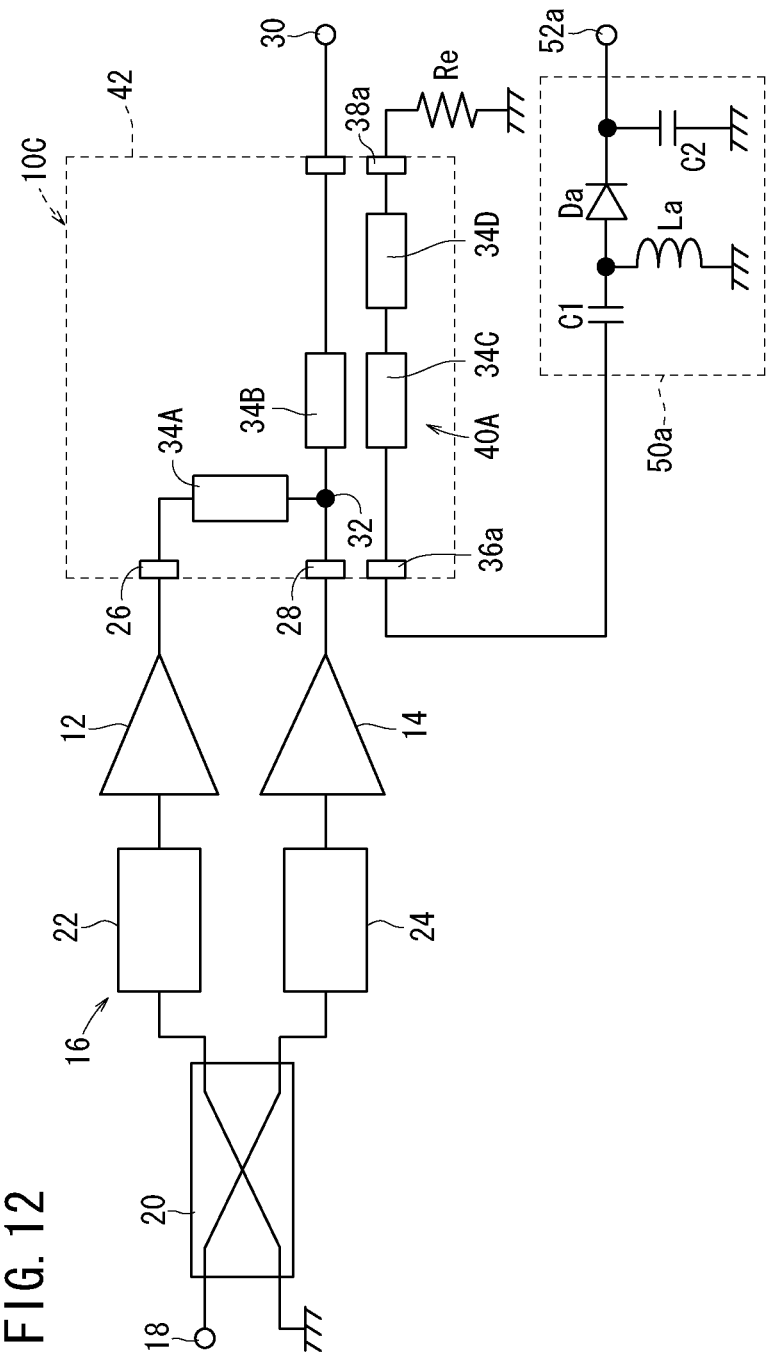
FIG. 12 is a block diagram showing a circuit arrangement of a combiner for a Doherty amplifier (third combiner) according to a third embodiment of the present invention.

As shown in FIG. 12, the third combiner 10C is substantially similar in structure to the second combiner 10B, but is different therefrom in that the fourth λ/4 line 34D is connected between the first termination terminal 38a and the third λ/4 line 34C.

Figure 13:
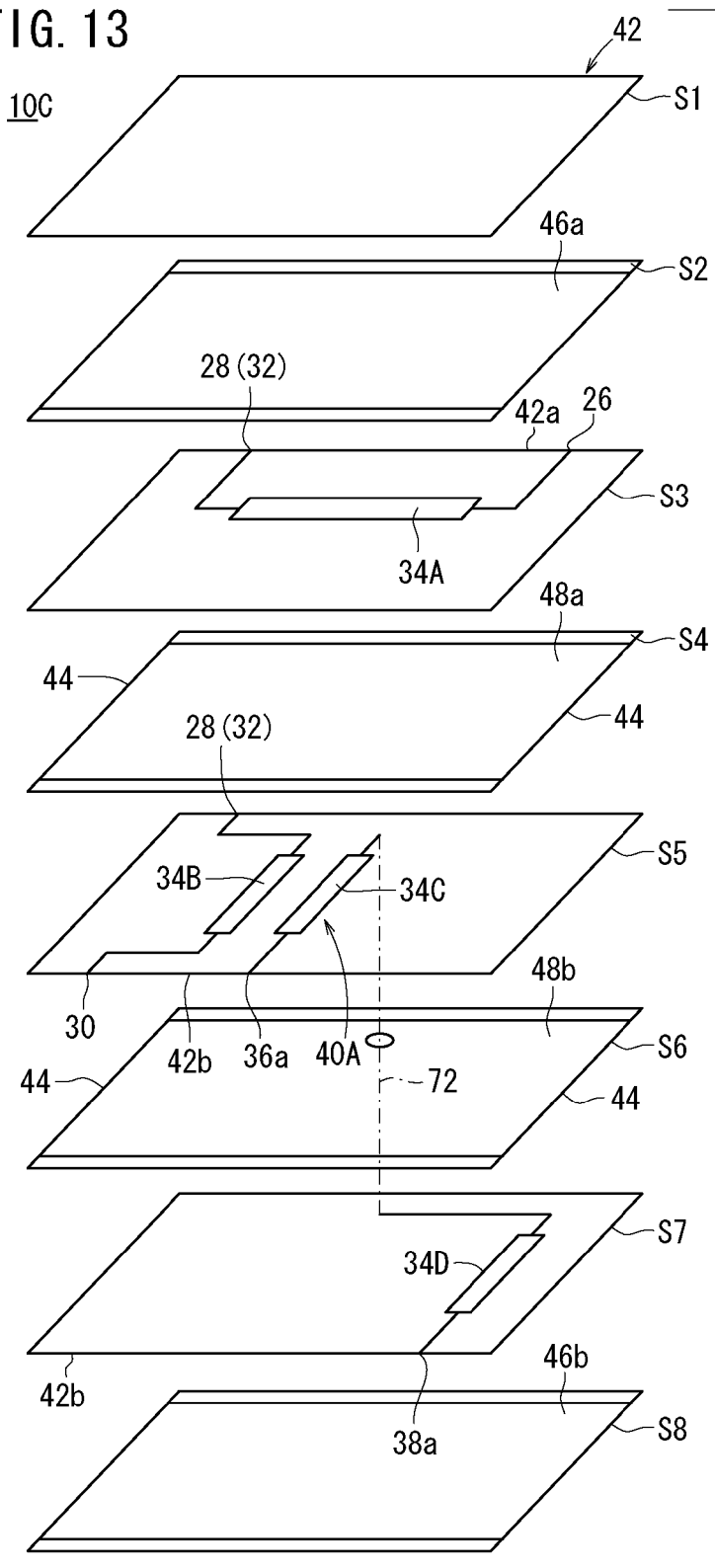
FIG. 13 is an exploded perspective view of the third combiner.

As shown in FIG. 13, the fourth λ/4 line 34D has an end connected to the first termination terminal 38a. The third λ/4 line 34C has an end connected to the first monitor terminal 36a. Also, the other end of the fourth λ/4 line 34D is connected to the other end of the third λ/4 line 34C through the via hole 72 defined through the fifth dielectric layer S5 and the sixth dielectric layer S6.

As with the second combiner 10B, the third combiner 10C allows the distortions of the Doherty amplifier 16 to be corrected by digital processing without a reduction in the efficiency of the Doherty amplifier 16. The area in which the third combiner 10C is mounted on a circuit board is reduced. An unwanted signal is prevented from leaking between the combining section and the first directional coupler 40A and also between the first directional coupler 40A and the fourth λ/4 line 34D, so that noise is prevented from being applied to the digital distortion correcting circuit.

Furthermore, since the combining section and the directional coupler are integrally formed with each other in one dielectric substrate 42, the third combiner 10C is free of a loss which would otherwise be caused by the directional coupler. The overall efficiency of the Doherty amplifier 16 is thus increased without a reduction in the distortion correcting capability.

The impedances of components of the third combiner 10C will be analyzed below. Since the fourth λ/4 line 34D is connected between the third λ/4 line 34C and the first termination terminal 38a, the second λ/4 line 34B, the third λ/4 line 34C, and the fourth λ/4 line 34D have respective characteristic impedances Z2, Z3, Z4 each of √(50×(K/2)), as shown in Table 4 below. However, an impedance of the third λ/4 line 34C as seen from the midpoint between the third λ/4 line 34C and the fourth λ/4 line 34D is different from the impedance Zc of the second λ/4 line 34B as seen from the combining point 32. Accordingly, unlike the second combiner 10B, the directionality of the first directional coupler 40A of the third combiner 10C is slightly poor.

TABLE 4

| | Port Impedance (Ω) | | | Characteristic Impedance (Ω) | | | |
|---|---|---|---|---|---|---|---|
| | Zi1 | Zi2 | Zo | Z1 | Z2 | Z3 | Z4 |
| Low Power | 2K | ∞ | 50 | K | √(50× (K/2)) | √(50× (K/2)) | √(50× (K/2)) |
| High Power | K | K | | | | | |

A combiner for a Doherty amplifier (hereinafter simply referred to as "fourth combiner 10D") according to a fourth embodiment of the present invention will be described below with reference to FIGS. 14 and 15.

Figure 14:
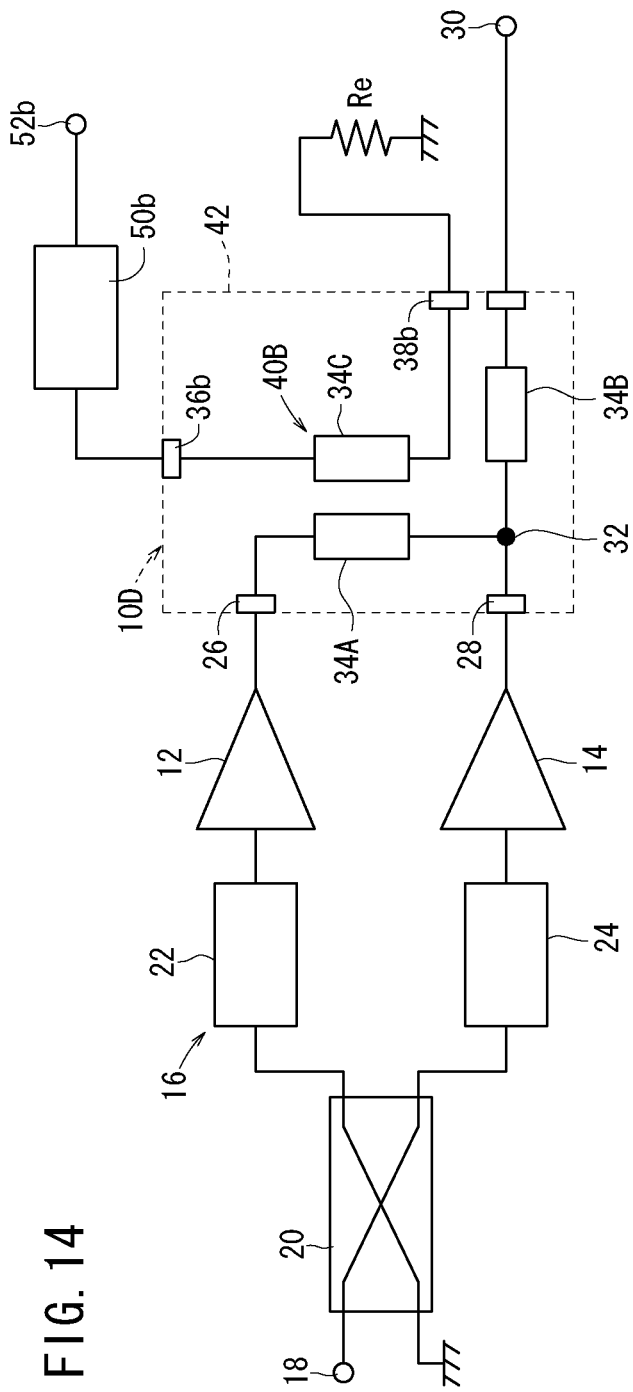
FIG. 14 is a block diagram showing a circuit arrangement of a combiner for a Doherty amplifier (fourth combiner) according to a fourth embodiment of the present invention.

As shown in FIG. 14, the fourth combiner 10D is substantially similar in structure to the first combiner 10A, but is different therefrom in that the third λ/4 line 34C is electromagnetically coupled to the first λ/4 line 34A. In other words, the fourth combiner 10D includes a second directional coupler 40B comprising the first λ/4 line 34A and the third λ/4 line 34C, instead of the first directional coupler 40A.

Figure 15:
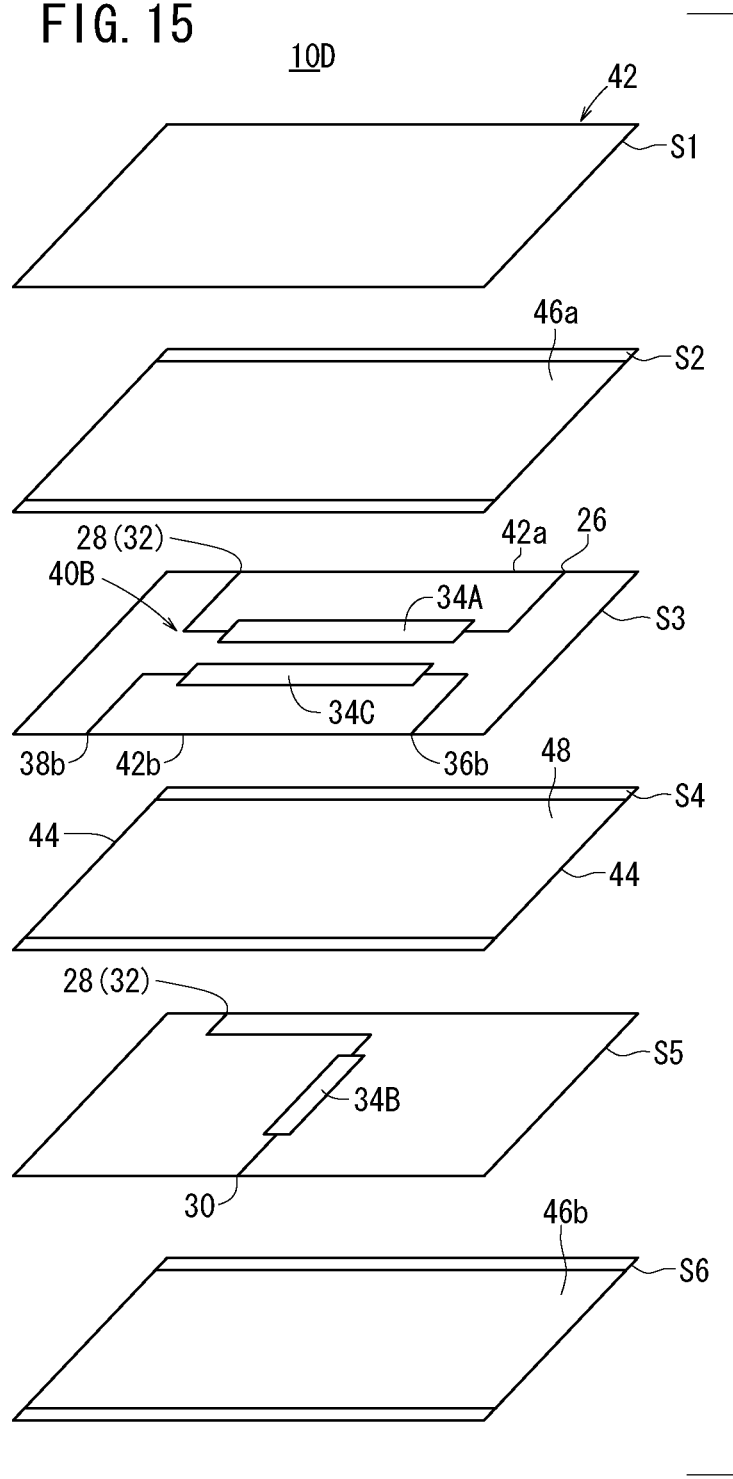
FIG. 15 is an exploded perspective view of the fourth combiner.

As shown in FIG. 15, the first λ/4 line 34A and the third λ/4 line 34C are disposed on a principal surface of the third dielectric layer S3, the second λ/4 line 34B is disposed on a principal surface of the fifth dielectric layer S5, and the inner-layer shield electrode 48 that is connected to the shield terminals 44 is disposed on a principal surface of the fourth dielectric layer S4. The first λ/4 line 34A is connected between the carrier input terminal 26 and the peak input terminal 28. The second λ/4 line 34B is connected between the peak input terminal 28 (doubling as the combining point 32) and the output terminal 30. The third λ/4 line 34C is connected between a second monitor terminal 36b and the second termination terminal 38b, which are disposed on the second side surface 42b of the dielectric substrate 42. These components of the fourth combiner 10D and the second directional coupler 40B are constructed as one chip.

As shown in FIG. 14, a second monitor circuit 50b is electrically connected between the second monitor terminal 36b and a second monitor output terminal 52b. The second monitor circuit 50b is a circuit for monitoring the level of a signal which flows from the carrier input terminal 26 to the combining point 32, and is of the same arrangement as the first monitor circuit 50a.

The fourth combiner 10D is capable of monitoring the output signal from the carrier amplifier 12. As the gain and phase of the carrier amplifier 12 can thus be appropriately corrected, the gain and phase distortions of the Doherty amplifier 16 can be corrected without a reduction in the amplifier efficiency of the Doherty amplifier 16.

As with the first combiner 10A, the stripline structure in the dielectric substrate 42 makes the fourth combiner 10D resistant to influence from external circuits, prevents a signal from leaking between the combining section and the directional coupler, and is effective in reducing the gain and phase distortions of the Doherty amplifier 16. The fourth combiner 10D is also effective to reduce the number of parts required for reducing output and phase distortions of the Doherty amplifier 16, thereby resulting in a reduction in the size and weight of the circuit for reducing the distortions of the Doherty amplifier 16. As a consequence, increase in the construction cost of a cellular telephone base station due to an increased number of devices on the antenna can be suppressed. Also, the reduced number of parts results in a reduced number of joints between the parts, and thus, reliability of the circuit is enhanced.

A combiner for a Doherty amplifier (hereinafter simply referred to as "fifth combiner 10E") according to a fifth embodiment of the present invention will be described below with reference to FIGS. 16 through 18.

Figure 16:
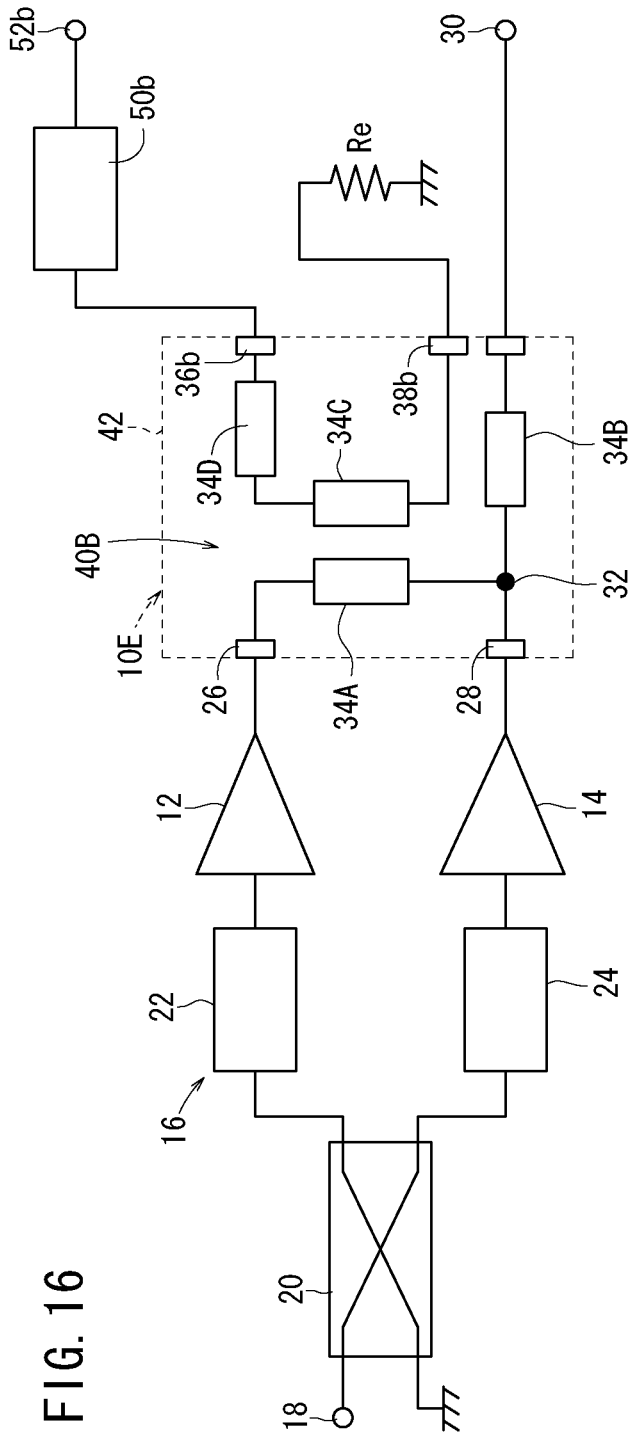
FIG. 16 is a block diagram showing a circuit arrangement of a combiner for a Doherty amplifier (fifth combiner) according to a fifth embodiment of the present invention.

As shown in FIG. 16, the fifth combiner 10E is substantially similar in structure to the fourth combiner 10D, but is different therefrom in that the fourth $\lambda/4$ line 34D is connected between the second monitor terminal 36$b$ and the third $\lambda/4$ line 34C.

Figure 17:
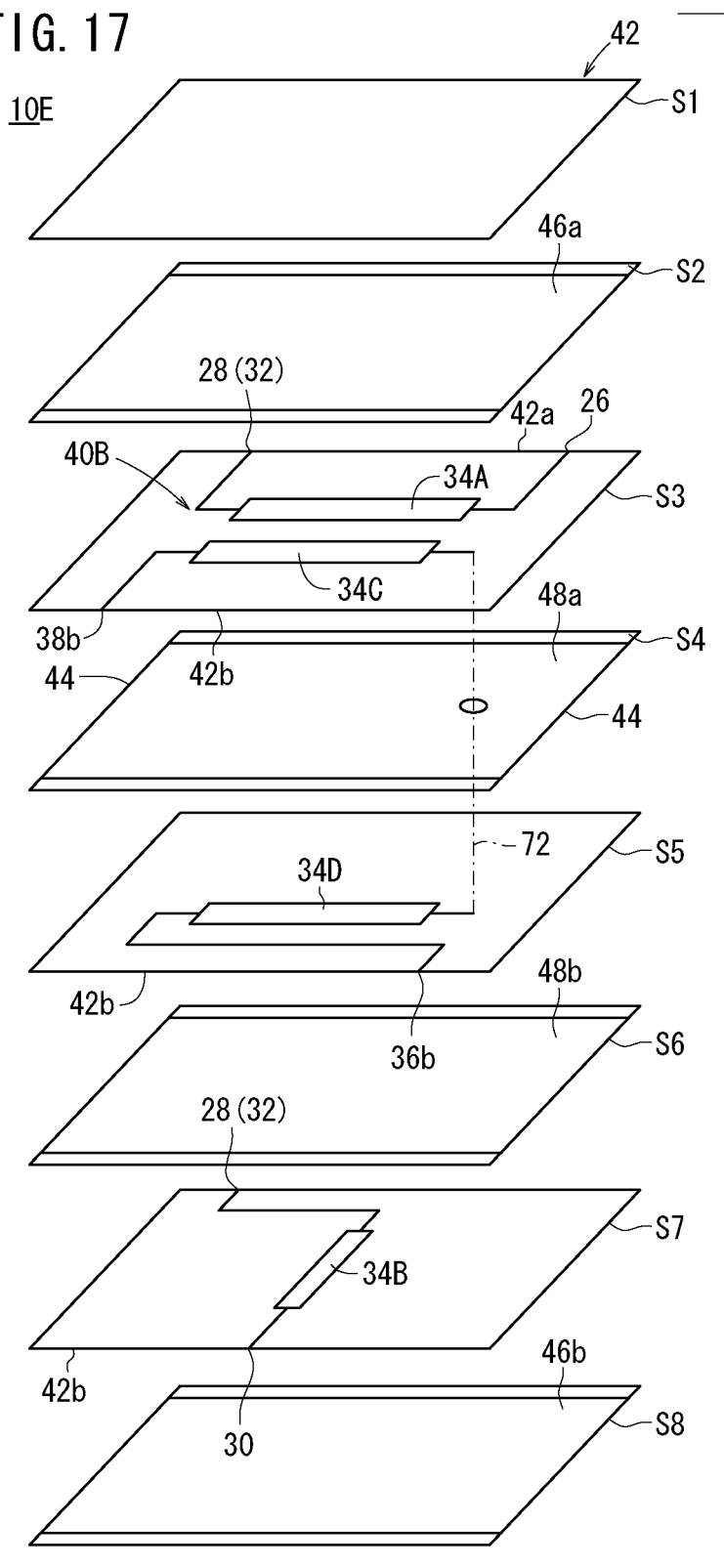
FIG. 17 is an exploded perspective view of the fifth combiner.
Figure 18:
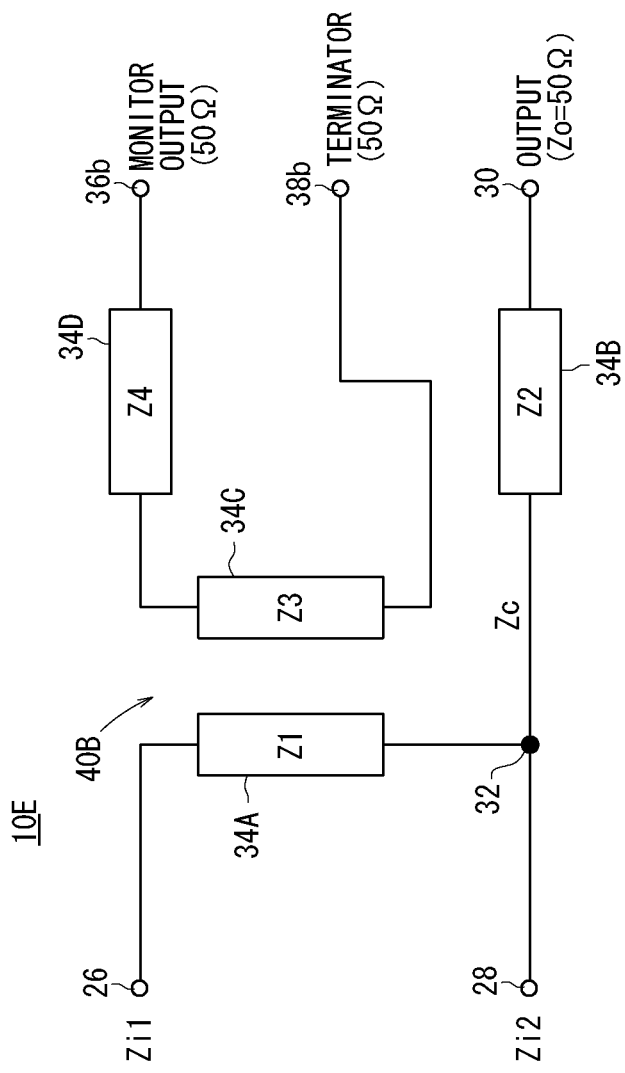
FIG. 18 is a block diagram showing the relationship between impedances of the fifth combiner.

As shown in FIG. 17, the fifth combiner 10E includes a dielectric substrate 42 comprising first through eighth dielectric layers S1 through S8, arranged successively from above, stacked together. The second $\lambda/4$ line 34B is disposed on a principal surface of the seventh dielectric layer S7. The fourth $\lambda/4$ line 34D is disposed on a principal surface of the fifth dielectric layer S5. The first inner-layer shield electrode 48$a$ is disposed on a principal surface of the fourth dielectric layer S4. The second inner-layer shield electrode 48$b$ is disposed on a principal surface of the sixth dielectric layer S6. The lower shield electrode 46$b$ is disposed on a principal surface of the eighth dielectric layer S8. The fourth $\lambda/4$ line 34D has an end connected to the second monitor terminal 36$b$ and the other end connected to an end of the third $\lambda/4$ line 34C through a via hole 72 defined through the third dielectric layer S3 and the fourth dielectric layer S4. The fifth combiner 10E offers the same advantages as the fourth combiner 10D.

The impedances of components of the fifth combiner 10E will be analyzed below. As shown in FIG. 18, since the fourth $\lambda/4$ line 34D is connected between the third $\lambda/4$ line 34C and the second monitor terminal 36$b$, the first $\lambda/4$ line 34A to be monitored, and the third $\lambda/4$ line 34C and the fourth $\lambda/4$ line 34D of the second directional coupler 40B have respective characteristic impedances Z1, Z3, Z4 each of K. The directionality of the second directional coupler 40B can thus be sufficiently high even if K is of neither 50 ohms nor 100 ohms.

TABLE 5

| | Port Impedance ($\Omega$) | | | Characteristic Impedance ($\Omega$) | | | |
|---|---|---|---|---|---|---|---|
| | Zi1 | Zi2 | Zo | Z1 | Z2 | Z3 | Z4 |
| Low Power | 2K | ∞ | 50 | K | $\sqrt{(50 \times (K/2))}$ | K | K |
| High Power | K | K | | | | | |

A combiner for a Doherty amplifier (hereinafter simply referred to as "sixth combiner 10F") according to a sixth embodiment of the present invention will be described below with reference to FIGS. 19 through 20.

Figure 19:
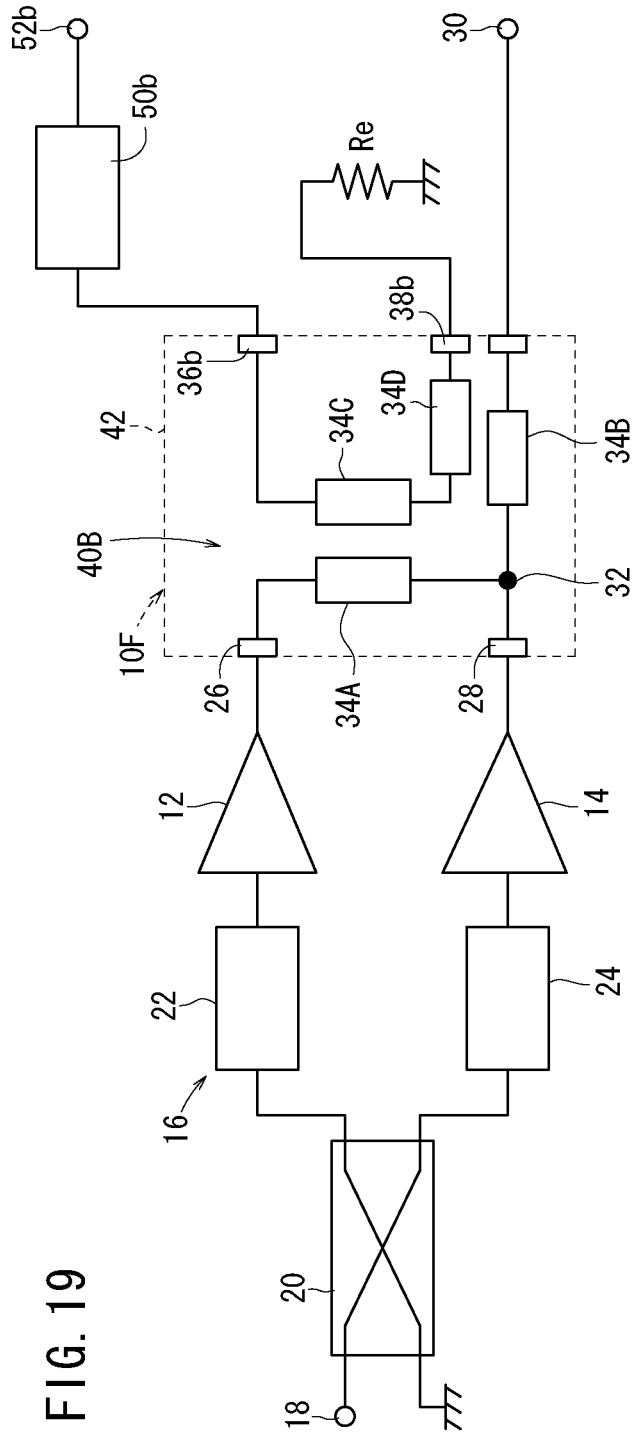
FIG. 19 is a block diagram showing a circuit arrangement of a combiner for a Doherty amplifier (sixth combiner) according to a sixth embodiment of the present invention.

As shown in FIG. 19, the sixth combiner 10F is substantially similar in structure to the fifth combiner 10E, but is different therefrom in that the fourth $\lambda/4$ line 34D is connected between the second termination terminal 38$b$ and the third $\lambda/4$ line 34C.

Figure 20:
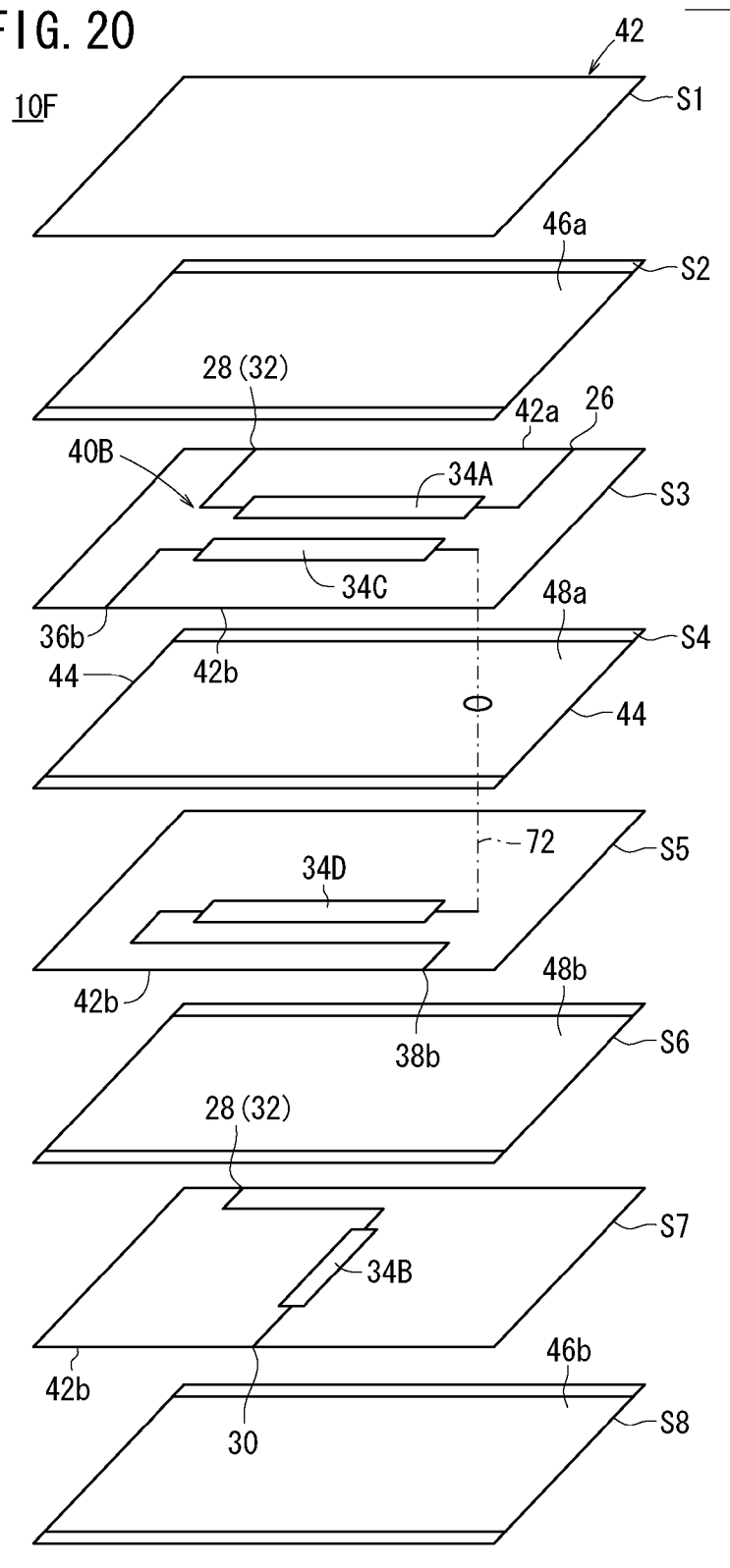
FIG. 20 is an exploded perspective view of the sixth combiner.

As shown in FIG. 20, in the sixth combiner 10F, the fourth $\lambda/4$ line 34D has an end connected to the second termination terminal 38$b$. The third $\lambda/4$ line 34C has an end connected to the second monitor terminal 36$b$. The other end of the fourth $\lambda/4$ line 34D is connected to the other end of the third $\lambda/4$ line 34C through a via hole 72 defined through the third dielectric layer S3 and the fourth dielectric layer S4. The sixth combiner 10F offers the same advantages as the fifth combiner 10E.

A combiner for a Doherty amplifier (hereinafter simply referred to as "seventh combiner 10G") according to a seventh embodiment of the present invention will be described below with reference to FIG. 21.

Figure 21:
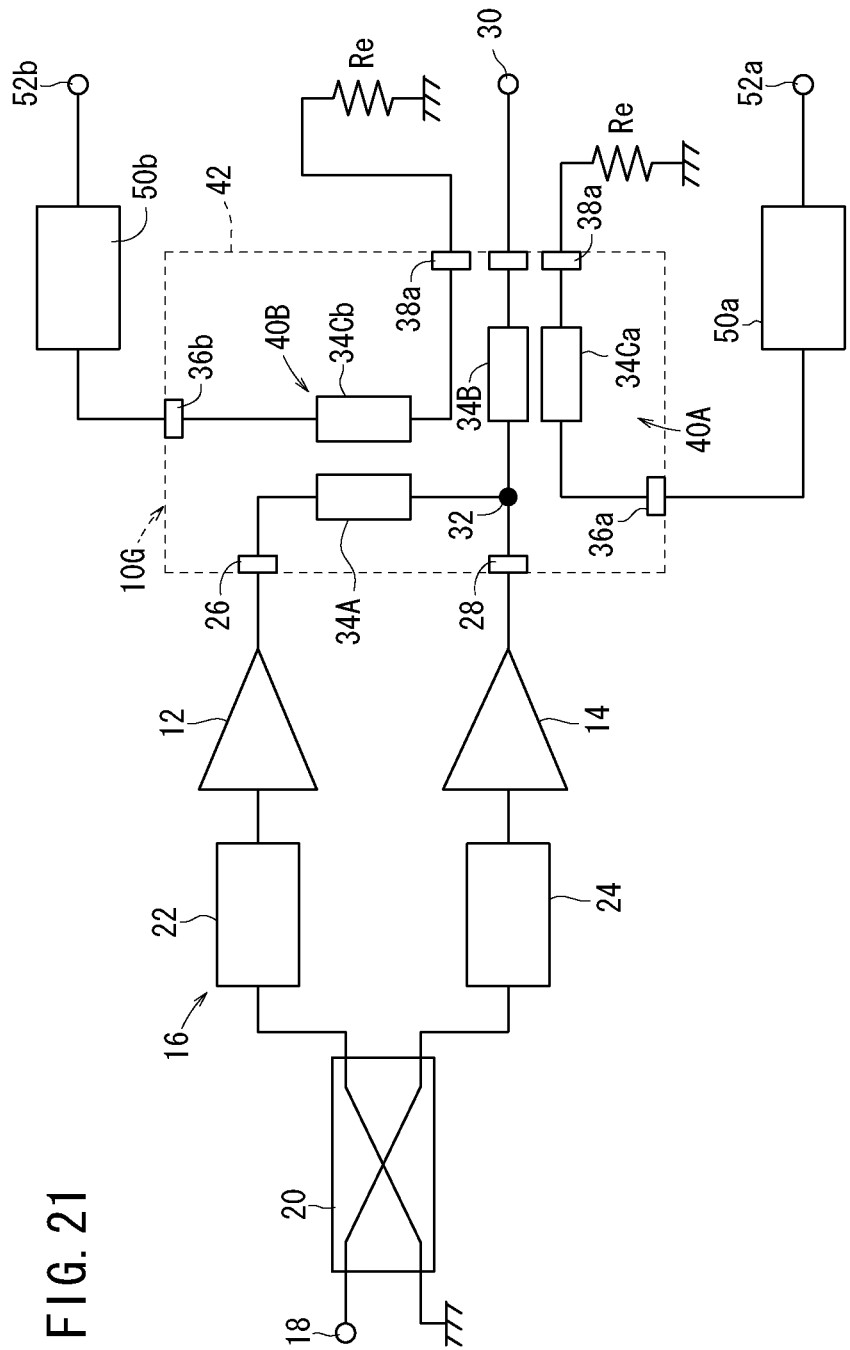
FIG. 21 is a block diagram showing a circuit arrangement of a combiner for a Doherty amplifier (seventh combiner) according to a seventh embodiment of the present invention.

As shown in FIG. 21, the seventh combiner 10G comprises a combination of the first combiner 10A and the fourth combiner 10D. That is, the seventh combiner 10G has two third $\lambda/4$ lines 34Ca, 34Cb. More specifically, the seventh combiner 10G comprises a first directional coupler 40A and a second directional coupler 40B. The first directional coupler 40A comprises the second $\lambda/4$ line 34B and the third $\lambda/4$ line 34Ca electromagnetically coupled to the second $\lambda/4$ line 34B. The second directional coupler 40B comprises the first $\lambda/4$ line 34A and the third $\lambda/4$ line 34Cb electromagnetically coupled to the first $\lambda/4$ line 34A. The seventh combiner 10G has both the advantages of the first combiner 10A and the fourth combiner 10D.

A combiner for a Doherty amplifier (hereinafter simply referred to as "eighth combiner 10H") according to an eighth embodiment of the present invention will be described below with reference to FIG. 22.

Figure 22:
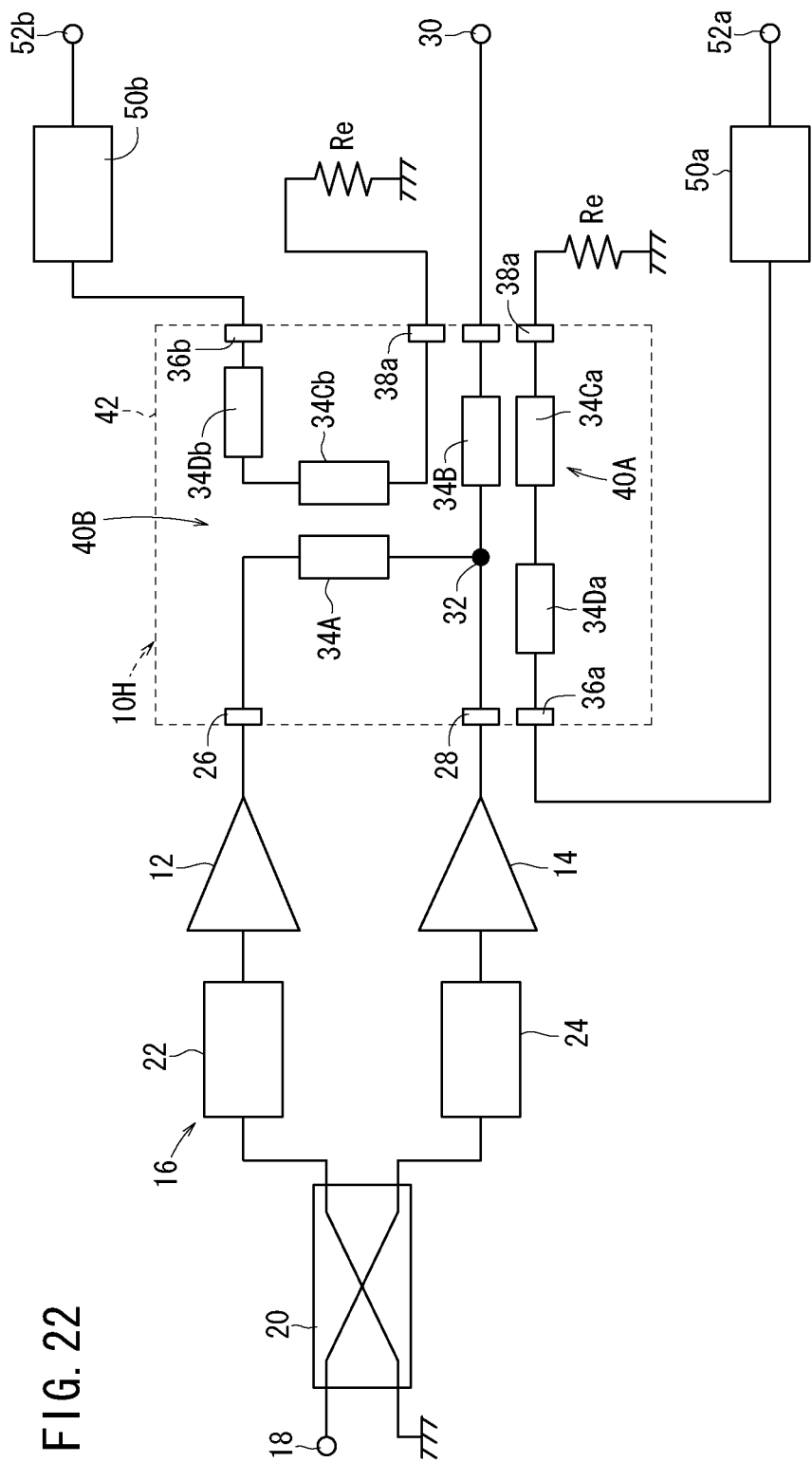
FIG. 22 is a block diagram showing a circuit arrangement of a combiner for a Doherty amplifier (eighth combiner) according to an eighth embodiment of the present invention.

As shown in FIG. 22, the eighth combiner 10H comprises a combination of the second combiner 10B and the fifth combiner 10E. That is, the eighth combiner 10H has two third $\lambda/4$ lines 34Ca, 34Cb and two fourth $\lambda/4$ lines 34Da, 34Db. More specifically, the eighth combiner 10H comprises a first directional coupler 40A and a second directional coupler 40B. The first directional coupler 40A comprises the second $\lambda/4$ line 34B and the third $\lambda/4$ line 34Ca electromagnetically coupled to the second $\lambda/4$ line 34B. The second directional coupler 40B comprises the first $\lambda/4$ line 34A and the third $\lambda/4$ line 34Cb electromagnetically coupled to the first $\lambda/4$ line 34A. The fourth $\lambda/4$ line 34Da is connected between the first directional coupler 40A and the first monitor terminal 36$a$, whereas the fourth $\lambda/4$ line 34Db is connected between the second directional coupler 40B and the second monitor terminal 36$b$. The eighth combiner 10H has both the advantages of the second combiner 10B and the fifth combiner 10E.

A combiner for a Doherty amplifier (hereinafter simply referred to as "ninth combiner 10I") according to a ninth embodiment of the present invention will be described below with reference to FIGS. 23 and 24.

Figure 23:
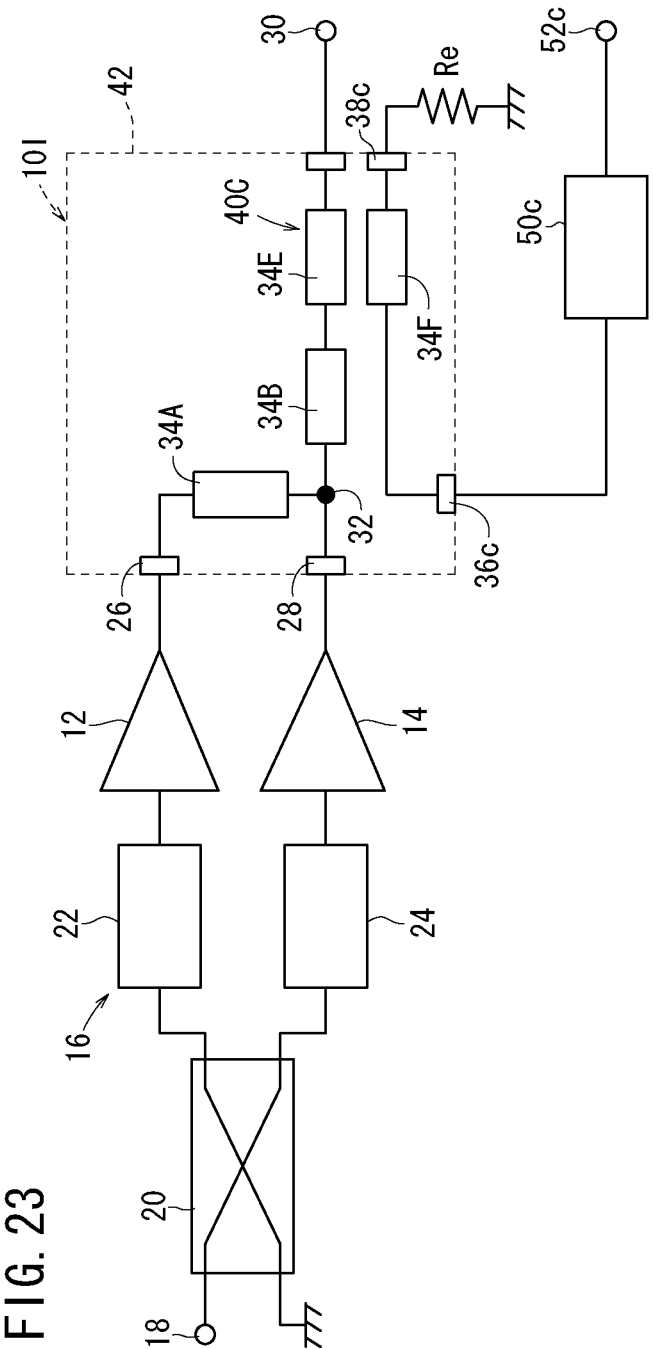
FIG. 23 is a block diagram showing a circuit arrangement of a combiner for a Doherty amplifier (ninth combiner) according to a ninth embodiment of the present invention.

As shown in FIG. 23, in the ninth combiner 10I, a fifth $\lambda/4$ line 34E is disposed between the second $\lambda/4$ line 34B and the output terminal 30, and a sixth $\lambda/4$ line 34F is disposed for being electromagnetically coupled to the fifth $\lambda/4$ line 34E. The sixth $\lambda/4$ line 34F has an end connected to a third monitor terminal 36$c$, and the other end connected to the termination resistor Re through a third termination terminal 38$c$. The fifth λ/4 line 34E and the sixth λ/4 line 34F jointly make up a directional coupler (third directional coupler 40C).

Figure 24:
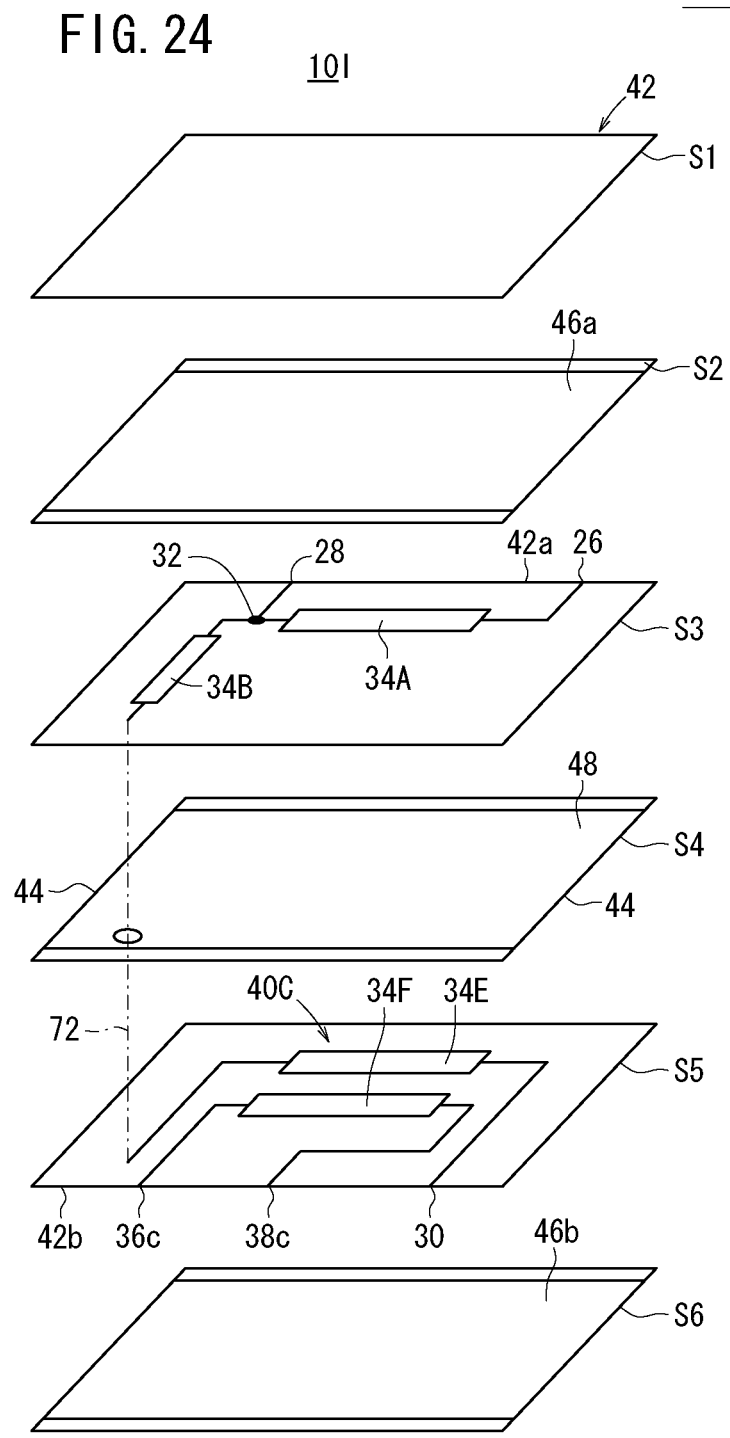
FIG. 24 is an exploded perspective view of the ninth combiner.

More specifically, as shown in FIG. 24, the ninth combiner 10I includes a dielectric substrate 42 comprising first through sixth dielectric layers S1 through S6, arranged successively from above, stacked together. The first λ/4 line 34A and the second λ/4 line 34B are disposed on a principal surface of the third dielectric layer S3. The fifth λ/4 line 34E and the sixth λ/4 line 34F are disposed on a principal surface of the fifth dielectric layer S5. The first λ/4 line 34A has an end connected to the carrier input terminal 26. The other end of the first λ/4 line 34A and the peak input terminal 28 are connected to an end of the second λ/4 line 34B through the combining point 32. The other end of the second λ/4 line 34B is connected to an end of the fifth λ/4 line 34E through a via hole 72 defined through the third dielectric layer S3 and the fourth dielectric layer S4. The other end of the fifth λ/4 line 34E is connected to the output terminal 30. The sixth λ/4 line 34F has an end connected to a third monitor terminal 36c, and the other end connected to a third termination terminal 38c.

As shown in FIG. 23, a third monitor circuit 50c is electrically connected between the third monitor terminal 36c and a third monitor output terminal 52c. The third monitor circuit 50c is a circuit for monitoring the level of a signal which flows from the combining point 32 to the output terminal 30, and is of the same arrangement as the first monitor circuit 50a.

As with the first combiner 10A, the ninth combiner 10I also allows the output signal from the Doherty amplifier 16 to be monitored highly accurately. The gain and phase distortions of the Doherty amplifier 16 can thus be improved without a reduction in the amplifier efficiency of the Doherty amplifier 16. The stripline structure in the dielectric substrate 42 makes the ninth combiner 10I resistant to influence from external circuits, prevents a signal from leaking between the combining section and the directional coupler, and is effective in reducing the gain and phase distortions of the Doherty amplifier 16.

The ninth combiner 10I is also effective to reduce the number of parts required for reducing output and phase distortions of the Doherty amplifier 16, resulting in a reduction in the size and weight of the circuit for reducing the distortions of the Doherty amplifier 16. As a consequence, increase in the construction cost of a cellular telephone base station due to an increased number of devices on the antenna can be suppressed. Also, the reduced number of parts results in a reduced number of joints between the parts, and thus, reliability of the circuit is enhanced.

A combiner for a Doherty amplifier (hereinafter referred to as "tenth combiner 10J") according to a tenth embodiment of the present invention will be described below with reference to FIGS. 25 and 26.

Figure 25:
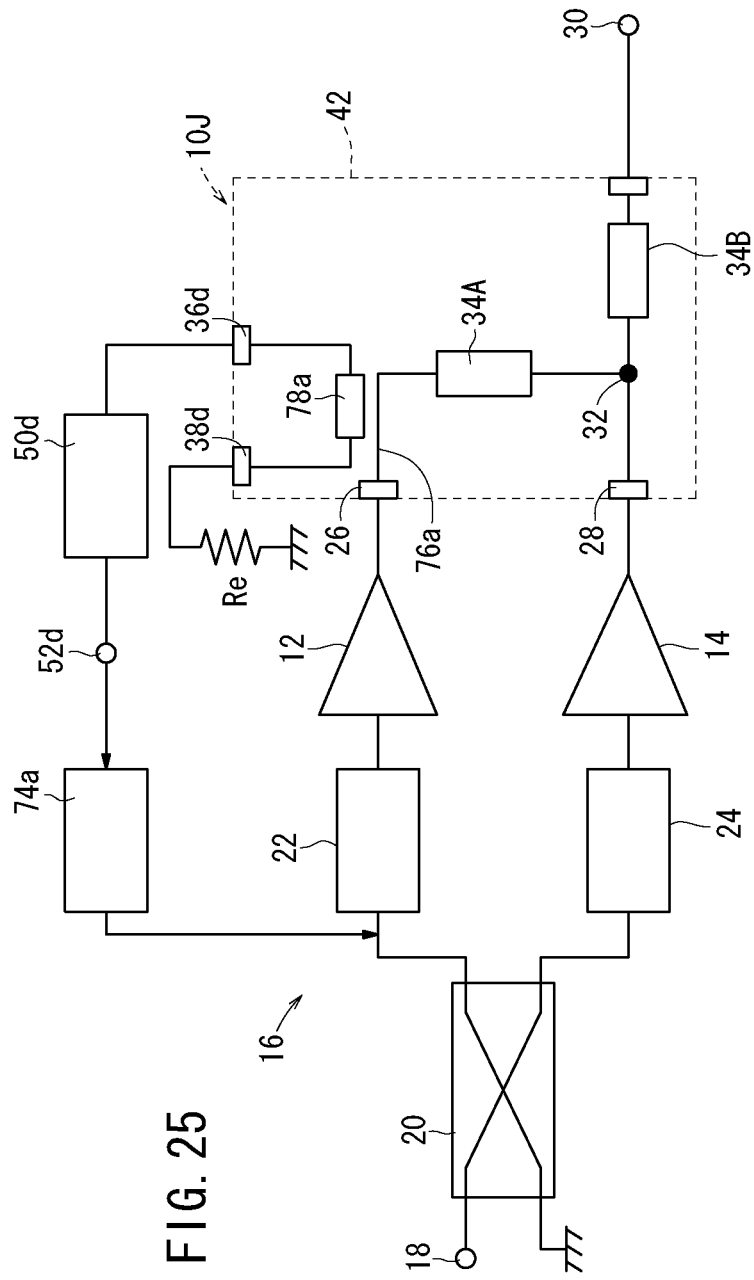
FIG. 25 is a block diagram showing a circuit arrangement of a combiner for a Doherty amplifier (tenth combiner) according to a tenth embodiment of the present invention.

As shown in FIG. 25, a Doherty amplifier 16 to be combined with the tenth combiner 10J is substantially similar in structure to the Doherty amplifier 16 to be combined with the first combiner 10A, but is different therefrom in that it includes a first controller 74a for controlling the gate bias voltage of the carrier amplifier 12.

The tenth combiner 10J includes a carrier input terminal 26, a peak input terminal 28 and an output terminal 30 which are identical to those of the first combiner 10A. The tenth combiner 10J also includes a fourth monitor terminal 36d for outputting the amplitude information of a carrier signal from the carrier amplifier 12, and a first monitor line 78a extending parallel to a first line 76a between the carrier input terminal 26 and the first λ/4 line 34A and electromagnetically coupled to the first line 76a.

Figure 26:
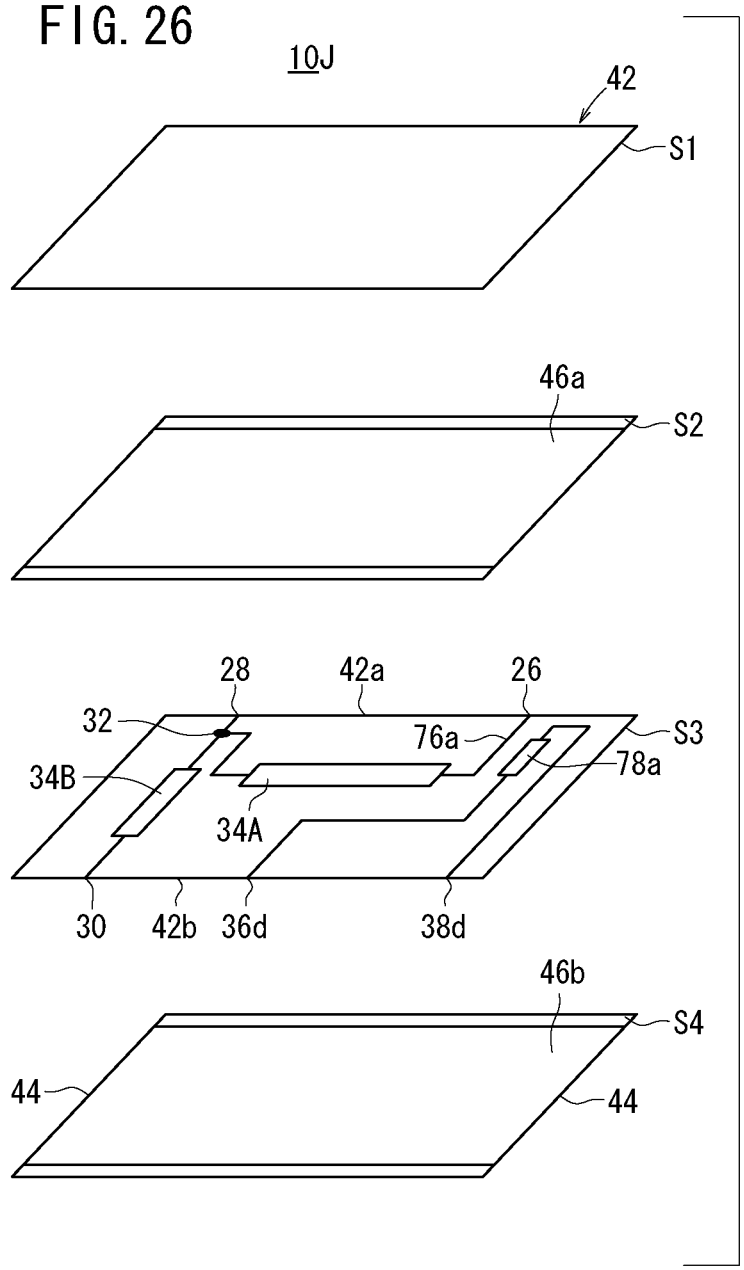
FIG. 26 is an exploded perspective view of the tenth combiner.

As shown in FIG. 26, at least the carrier input terminal 26 and the peak input terminal 28 are disposed on the first side surface 42a of the dielectric substrate 42, and at least the output terminal 30, the fourth monitor terminal 36d and a fourth termination terminal 38d are disposed on the second side surface 42b of the dielectric substrate 42.

The dielectric substrate 42 comprises first through fourth dielectric layers S1 through S4, arranged successively from above, stacked together. The first λ/4 line 34A, the second λ/4 line 34B, and the first monitor line 78a electromagnetically coupled to the first line 76a which extends from the carrier input terminal 26 to an end of the first λ/4 line 34A are disposed on a principal surface of the third dielectric layer S3. The other end of the first λ/4 line 34A and the peak input terminal 28 are connected through the combining point 32 to an end of the second λ/4 line 34B. The other end of the second λ/4 line 34B is connected to the output terminal 30. The first monitor line 78a has an end connected to the fourth monitor terminal 36d and the other end connected to the fourth termination terminal 38d.

As shown in FIG. 25, a fourth monitor circuit 50d is electrically connected to the fourth monitor terminal 36d. The fourth monitor circuit 50d is a circuit for monitoring the amplitude level of a carrier signal from the carrier amplifier 12 which is input to the carrier input terminal 26, and is of the same arrangement as the first monitor circuit 50a. The fourth monitor circuit 50d has a fourth monitor output terminal 52d which outputs a signal to the first controller 74a. The first controller 74a adjusts the gate bias voltage of the carrier amplifier 12 depending on the level of the signal output from the fourth monitor output terminal 52d.

The tenth combiner 10J is capable of monitoring saturation characteristics with respect to the amplitude of the carrier signal from the carrier amplifier 12. Therefore, the tenth combiner 10J can confirm the output level of the carrier amplifier 12 with respect to the input level thereof. By controlling the gate bias voltage of the carrier amplifier 12 while monitoring the saturation region, it is possible to improve AM/AM characteristics of the Doherty amplifier 16 to reduce the distortions thereof without a reduction in the efficiency thereof compared with conventional Doherty amplifiers. Furthermore, since the fourth monitor circuit 50d is of a circuit arrangement including the diode Da, the fourth monitor circuit 50d is capable of detecting a high-frequency signal from the carrier amplifier 12. Only amplitude information is required as a signal used to control the gate bias voltage. As the fourth monitor circuit 50d can produce a half-wave rectified signal, for example, it can supply amplitude information required to control the gate bias voltage of the carrier amplifier 12 to the first controller 74a.

A combiner for a Doherty amplifier (hereinafter referred to as "eleventh combiner 10K") according to a eleventh embodiment of the present invention will be described below with reference to FIGS. 27 and 28.

Figure 27:
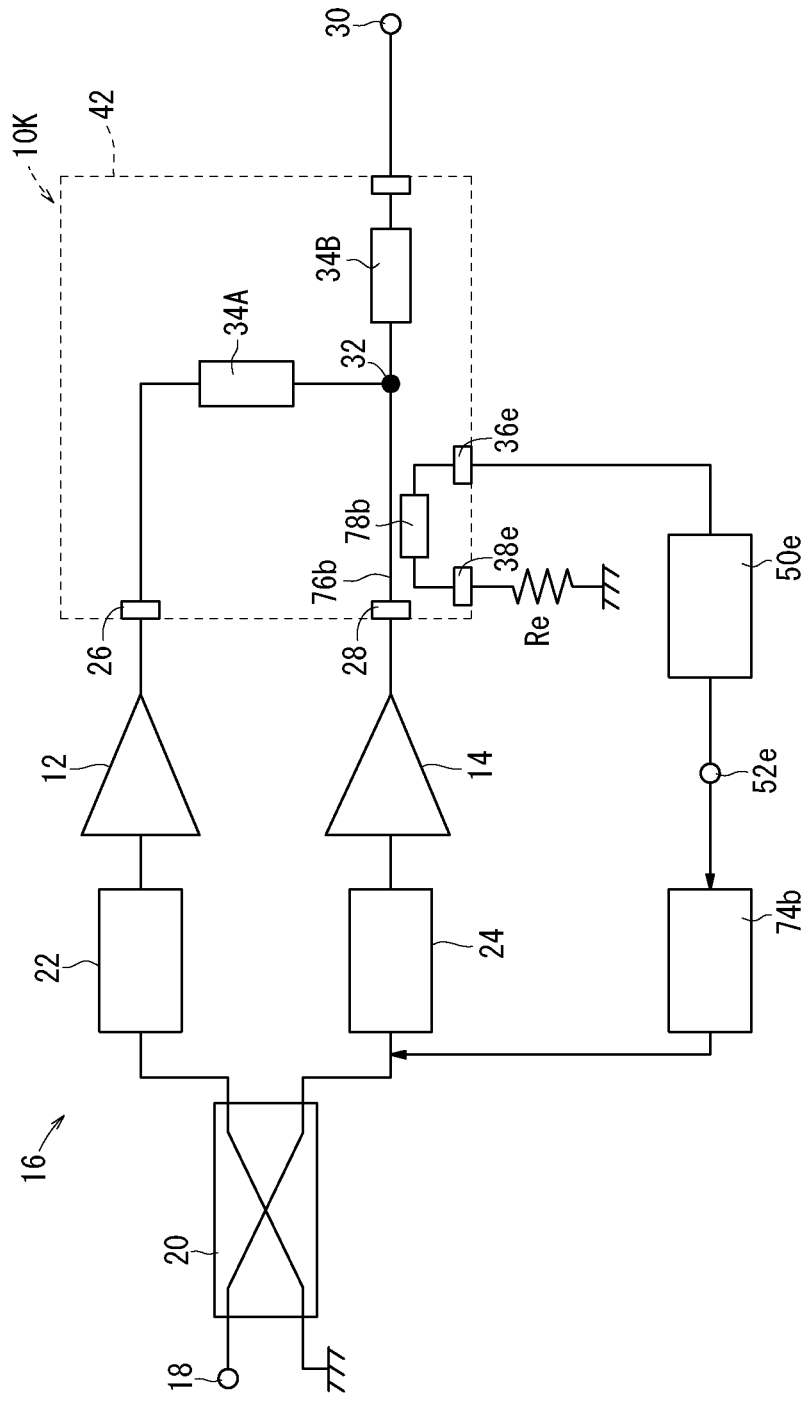
FIG. 27 is a block diagram showing a circuit arrangement of a combiner for a Doherty amplifier (eleventh combiner) according to an eleventh embodiment of the present invention.

As shown in FIG. 27, a Doherty amplifier 16 to be combined with the eleventh combiner 10K is substantially similar in structure to the Doherty amplifier 16 to be combined with the first combiner 10A, but is different therefrom in that it includes a second controller 74b for controlling the gate bias voltage of the peak amplifier 14.

The eleventh combiner 10K includes a carrier input terminal 26, a peak input terminal 28 and an output terminal 30 which are identical to those of the first combiner 10A. The eleventh combiner 10K also includes a fifth monitor terminal 36e for outputting the amplitude information of a peak signal from the peak amplifier 14, and a second monitor line 78b extending parallel to a second line 76b between the peak input terminal 28 and the first λ/4 line 34A and electromagnetically coupled to the second line 76b.

Figure 28:
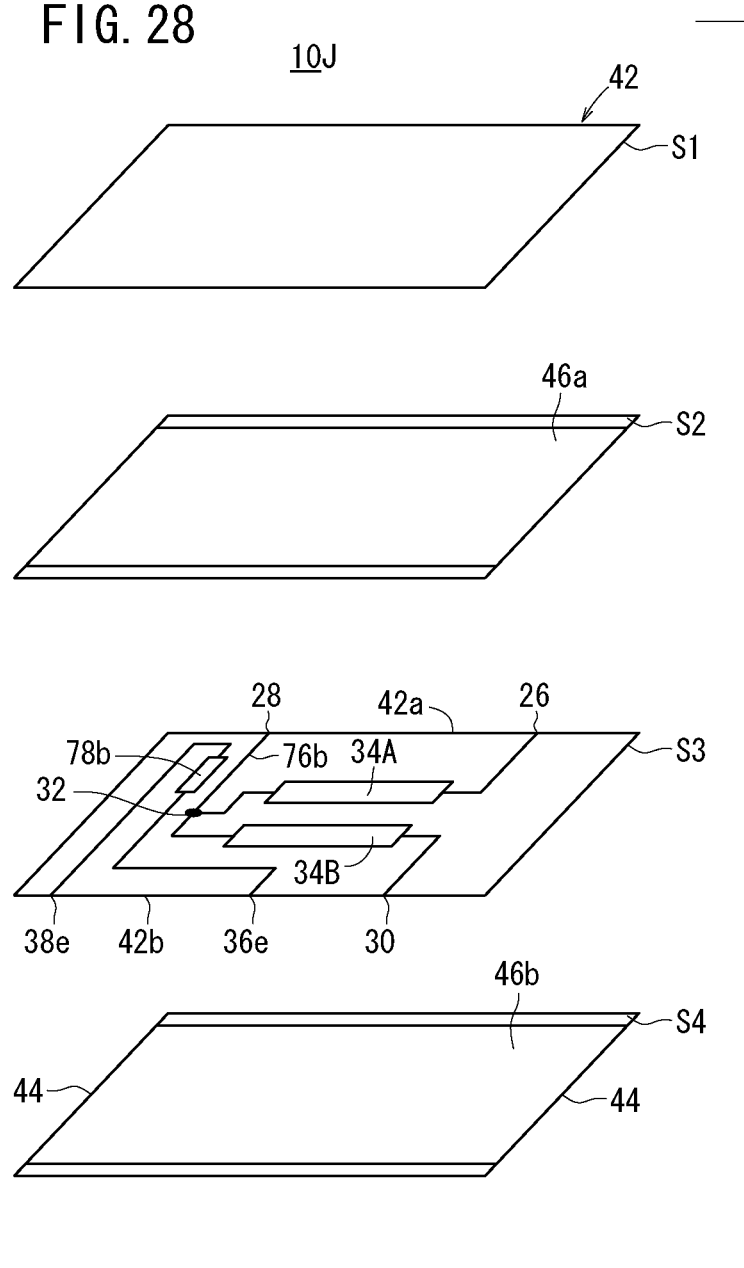
FIG. 28 is an exploded perspective view of the eleventh combiner.

As shown in FIG. 28, at least the carrier input terminal 26 and the peak input terminal 28 are disposed on the first side surface 42a of the dielectric substrate 42, and at least the output terminal 30, the fifth monitor terminal 36e, and a fifth termination terminal 38e are disposed on the second side surface 42b of the dielectric substrate 42.

The dielectric substrate 42 comprises first through fourth dielectric layers S1 through S4, arranged successively from above, stacked together. The first λ/4 line 34A, the second λ/4 line 34B, and the second monitor line 78b electromagnetically coupled to the second line 76b which extends from the peak input terminal 28 to the other end of the first λ/4 line 34A are disposed on a principal surface of the third dielectric layer S3. The end of the first λ/4 line 34A is connected to the carrier input terminal 26. The other end of the first λ/4 line 34A and the peak input terminal 28 are connected through the combining point 32 to an end of the second λ/4 line 34B. The other end of the second λ/4 line 34B is connected to the output terminal 30. The second monitor line 78b has an end connected to the fifth monitor terminal 36e and the other end connected to the fifth termination terminal 38e.

As shown in FIG. 27, a fifth monitor circuit 50e is electrically connected to the fifth monitor terminal 36e. The fifth monitor circuit 50e is a circuit for monitoring the level of a peak signal from the peak amplifier 14 which is input to the peak input terminal 28, and is of the same arrangement as the first monitor circuit 50a. The fifth monitor circuit 50e has a fifth monitor output terminal 52e which outputs a signal to the second controller 74b. The second controller 74b adjusts the gate bias voltage of the peak amplifier 14 depending on the level of the signal output from the fifth monitor output terminal 52e.

The eleventh combiner 10K is capable of monitoring an output signal from the peak amplifier 14, whereby the gate bias voltage of the peak amplifier 14 can be appropriately corrected. As a result, gain distortion, which would cause a problem in use of a Doherty amplifier 16, can be improved without reduction in the amplifier efficiency. Also, as the fifth monitor circuit 50e can produce a half-wave rectified signal, for example, it can supply amplitude information required to control the gate bias voltage of the peak amplifier 14 to the second controller 74b.

A combiner for a Doherty amplifier (hereinafter referred to as "twelfth combiner 10L") according to a twelfth embodiment of the present invention will be described below with reference to FIGS. 29 and 30.

Figure 29:
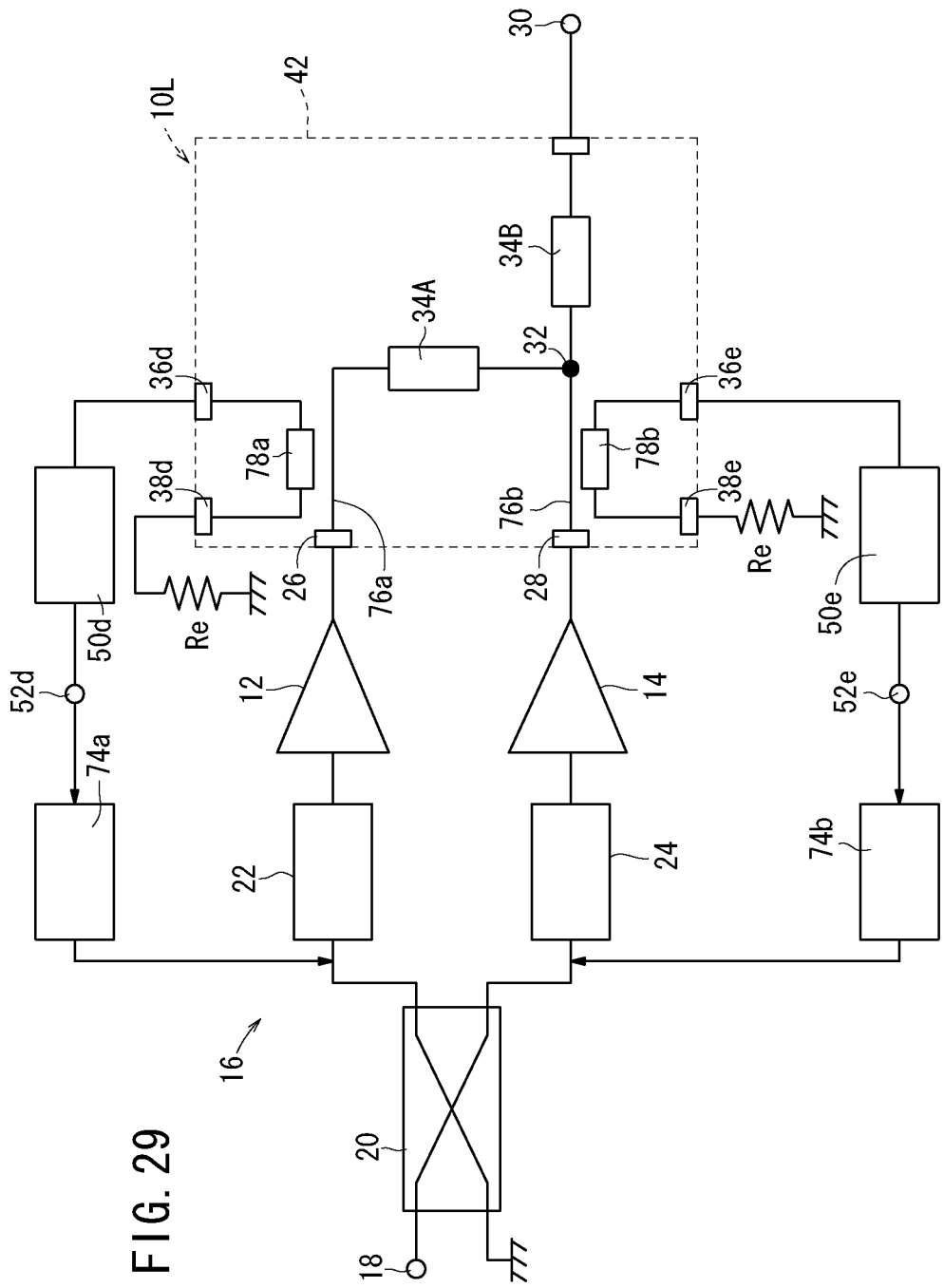
FIG. 29 is a block diagram showing a circuit arrangement of a combiner for a Doherty amplifier (twelfth combiner) according to a twelfth embodiment of the present invention.

As shown in FIG. 29, a Doherty amplifier 16 to be combined with the twelfth combiner 10L includes a first controller 74a for controlling the gate bias voltage of the carrier amplifier 12 and a second controller 74b for controlling the gate bias voltage of the peak amplifier 14.

The twelfth combiner 10L comprises a combination of the tenth combiner 10J and the eleventh combiner 10K. More specifically, as shown in FIG. 30, at least the carrier input terminal 26 and the peak input terminal 28 are disposed on the first side surface 42a of the dielectric substrate 42, and at least the output terminal 30, the fourth monitor terminal 36d, a fourth termination terminal 38d, a fifth monitor terminal 36e and a fifth termination terminal 38e are disposed on the second side surface 42b of the dielectric substrate 42.

The dielectric substrate 42 comprises first through fourth dielectric layers S1 through S4, arranged successively from above, stacked together. The first λ/4 line 34A, the second λ/4 line 34B, the first monitor line 78a, and the second monitor line 78b are disposed on a principal surface of the third dielectric layer S3. An end of the first λ/4 line 34A is connected to the carrier input terminal 26. The other end of the first λ/4 line 34A and the peak input terminal 28 are connected through the combining point 32 to an end of the second λ/4 line 34B. The other end of the second λ/4 line 34B is connected to the output terminal 30. The first monitor line 78a has an end connected to the fourth monitor terminal 36d and the other end connected to the fourth termination terminal 38d. The second monitor line 78b has an end connected to the fifth monitor terminal 36e and the other end connected to the fifth termination terminal 38e. A fourth monitor circuit 50d is connected to the fourth monitor terminal 36d, and a fifth monitor circuit 50e is connected to the fifth monitor terminal 36e. A signal output from a fourth monitor output terminal 52d of the fourth monitor circuit 50d is input to the first controller 74a, and a signal output from a fifth monitor output terminal 52e of the fifth monitor circuit 50e is input to the second controller 74b.

The twelfth combiner 10L has both the advantages of the tenth combiner 10J and the eleventh combiner 10K. More specifically, in addition to the gate bias voltage of the carrier amplifier 12, the gate bias voltage of the peak amplifier 14 can be also controlled. Thus, the output saturation point of the Doherty amplifier 16 can be increased. As a result, the back-off point can be improved in a distortion compensator according to the DPD technology or the like, and thus the efficiency can be further increased.

A combiner for a Doherty amplifier (hereinafter referred to as "thirteenth combiner 10M") according to a thirteenth embodiment of the present invention will be described below with reference to FIGS. 31 and 32.

Figure 31:
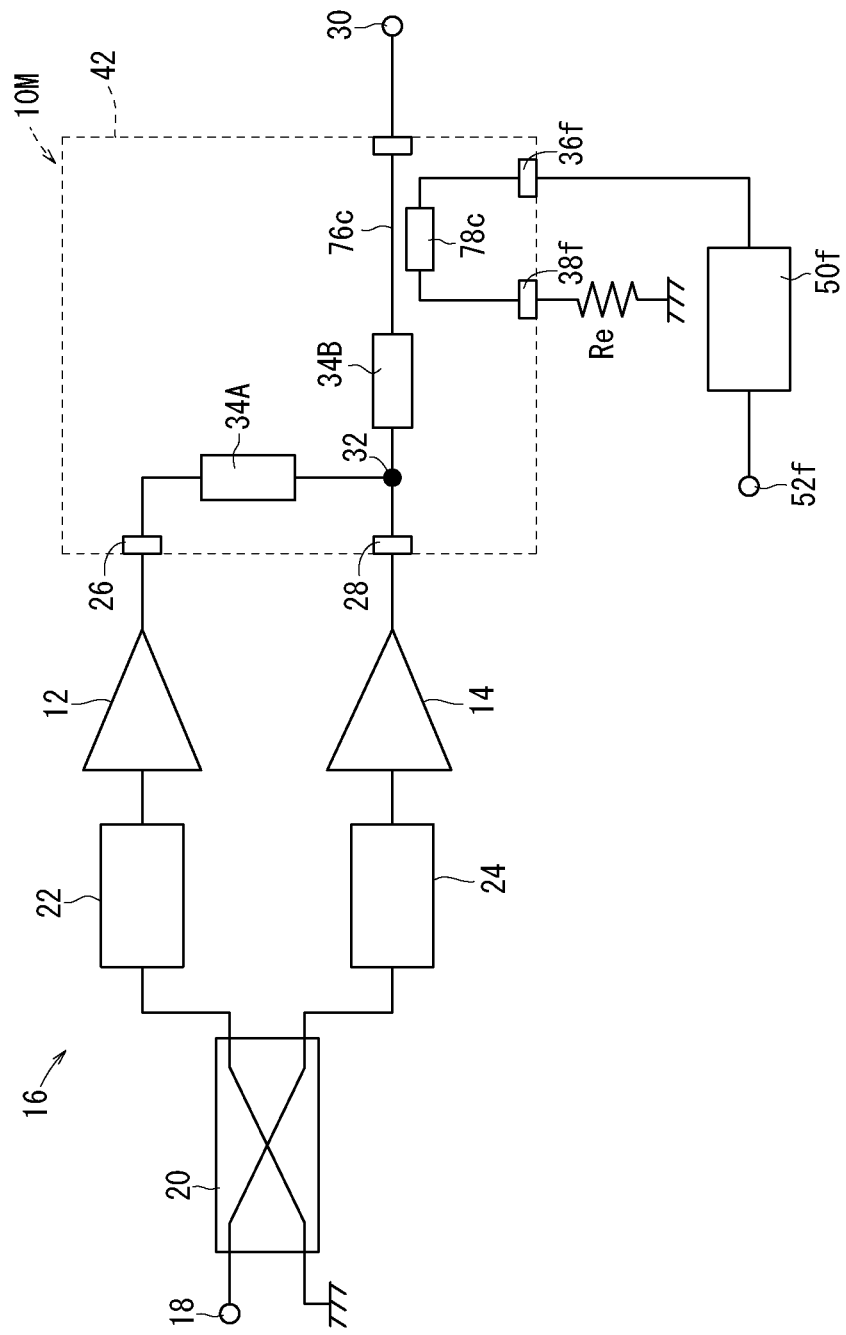
FIG. 31 is a block diagram showing a circuit arrangement of a combiner for a Doherty amplifier (thirteenth combiner) according to a thirteenth embodiment of the present invention.

As shown in FIG. 31, the thirteenth combiner 10M includes a carrier input terminal 26, a peak input terminal 28 and an output terminal 30 which are identical to those of the first combiner 10A. The thirteenth combiner 10M also includes a sixth monitor terminal 36f for outputting the amplitude information of an output signal from the Doherty amplifier 16, and a third monitor line 78c extending parallel to a third line 76c between the output terminal 30 and the second λ/4 line 34B and electromagnetically coupled to the third line 76c.

Figure 32:
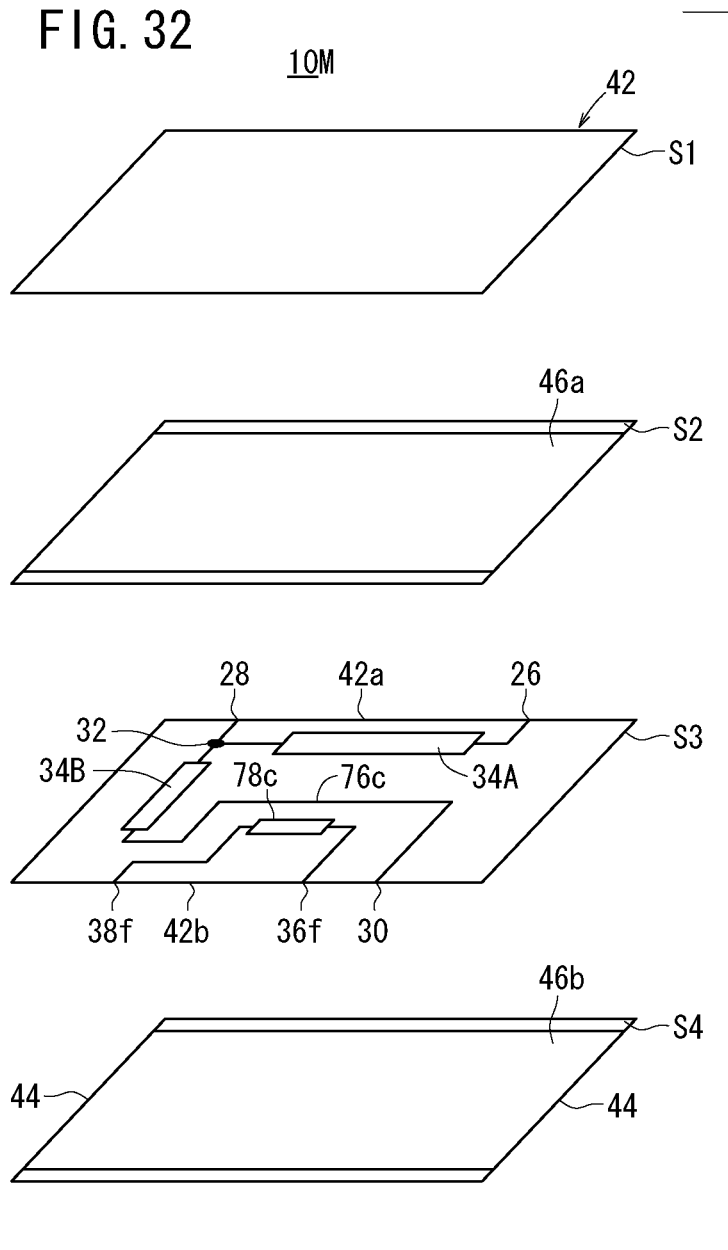
FIG. 32 is an exploded perspective view of the thirteenth combiner.

As shown in FIG. 32, at least the carrier input terminal 26 and the peak input terminal 28 are disposed on the first side surface 42a of the dielectric substrate 42, and at least the output terminal 30, the sixth monitor terminal 36f and a sixth termination terminal 38f are disposed on the second side surface 42b of the dielectric substrate 42.

The dielectric substrate 42 comprises first through fourth dielectric layers S1 through S4, arranged successively from above, stacked together. The first λ/4 line 34A, the second λ/4 line 34B, and the third monitor line 78c electromagnetically coupled to the third line 76c which extends from the end of the second λ/4 line 34B to the output terminal 30 are disposed on a principal surface of the third dielectric layer S3. The end of the first λ/4 line 34A is connected to the carrier input terminal 26. The other end of the first λ/4 line 34A and the peak input terminal 28 are connected through the combining point 32 to the other end of the second λ/4 line 34B. The third monitor line 78c has an end connected to the sixth monitor terminal 36f and the other end connected to the sixth termination terminal 38f.

As shown in FIG. 31, a sixth monitor circuit 50f is electrically connected between the sixth monitor terminal 36f and the sixth monitor output terminal 52f. The sixth monitor circuit 50f is a circuit for monitoring the level of an output signal from the Doherty amplifier 16, and is of the same arrangement as the first monitor circuit 50a.

The thirteenth combiner 10M is capable of monitoring a signal for AM/AM distortion (gain distortion) correction and a signal for AP/PM distortion (amplitude phase distortion) correction, of the Doherty amplifier 16. More specifically, as with the first combiner 10A, the thirteenth combiner 10M can monitor an output signal from the Doherty amplifier 16 highly accurately. Thus, gain distortion and phase distortion, which cause a problem in the Doherty amplifier 16, can be improved without reduction in the amplifier efficiency. Further, the stripline structure in the dielectric substrate 42 makes the thirteenth combiner 10M resistant to influence from external circuits, prevents a signal from leaking between the combining section and the directional coupler, and is effective in reducing the gain and phase distortions of the Doherty amplifier 16.

The thirteenth combiner 10M is also effective to reduce the number of parts required for reducing output and phase distortions of the Doherty amplifier 16, resulting in a reduction in the size and weight of the circuit for reducing the distortions of the Doherty amplifier 16. As a consequence, increase in the construction cost of a cellular telephone base station due to an increased number of devices on the antenna can be suppressed. Also, the reduced number of parts results in a reduced number of joints between the parts, and thus, reliability of the circuit is enhanced.

Figure 33:
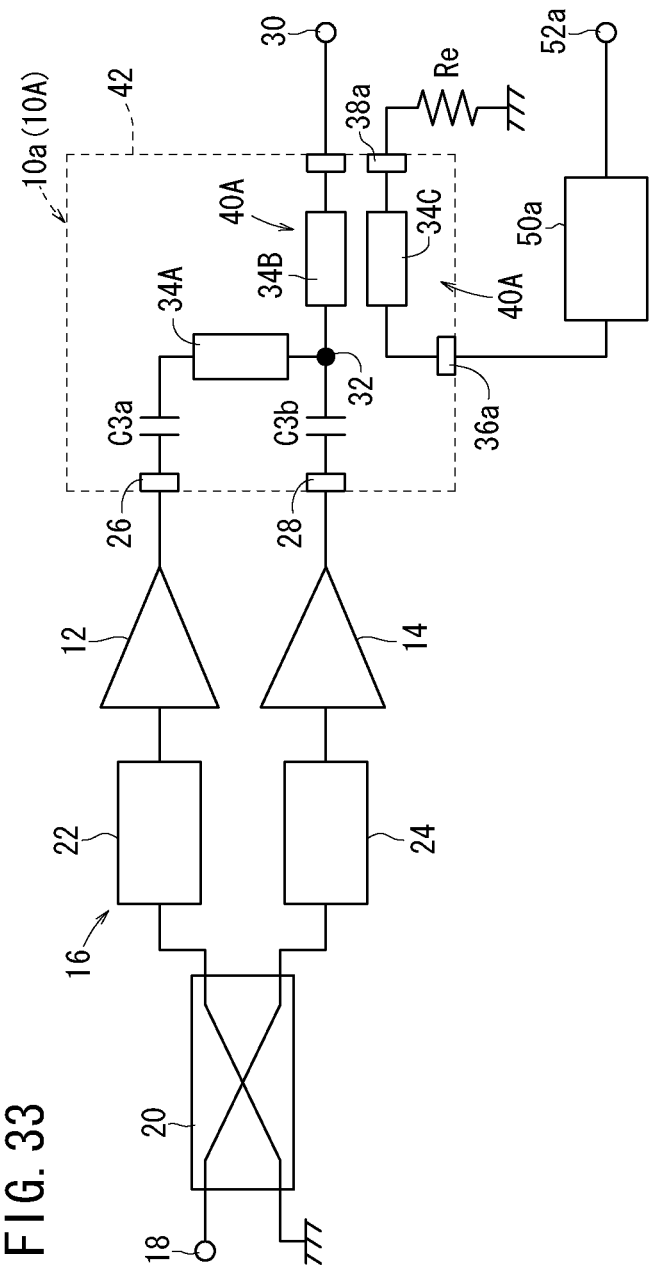
FIG. 33 is a block diagram showing a circuit arrangement of a combiner for a Doherty amplifier according to a first modification.

Two preferable modifications (first and second modifications) of the first through thirteenth combiners 10A through 10M will be described below with reference to FIGS. 33 and 34.

A combiner 10a according to a first modification, which is mainly applied as the first combiner 10A, for example, will be described below. As shown in FIG. 33, a first coupling capacitor C3a is connected between the carrier input terminal 26 and the first λ/4 line 34A, and a second coupling capacitor C3b is connected between the peak input terminal 28 and the first λ/4 line 34A.

The carrier amplifier 12 has a drain terminal connected to the carrier input terminal 26 of the first combiner 10A, and the peak amplifier 14 has a drain terminal connected to the peak input terminal 28 of the first combiner 10A. The first coupling capacitor C3a and the second coupling capacitor C3b which are connected as described above isolate DC electric power supplied to the drain terminals of the carrier amplifier 12 and the peak amplifier 14 from the first combiner 10A, but allow only high-frequency components to be input to the first combiner 10A. According to the first modification, the first λ/4 line 34A, the second λ/4 line 34B, and the third λ/4 line 34C are integrally formed with the first coupling capacitor C3a and the second coupling capacitor C3b in the dielectric substrate 42. Therefore, the first combiner 10A is small in size.

Figure 34:
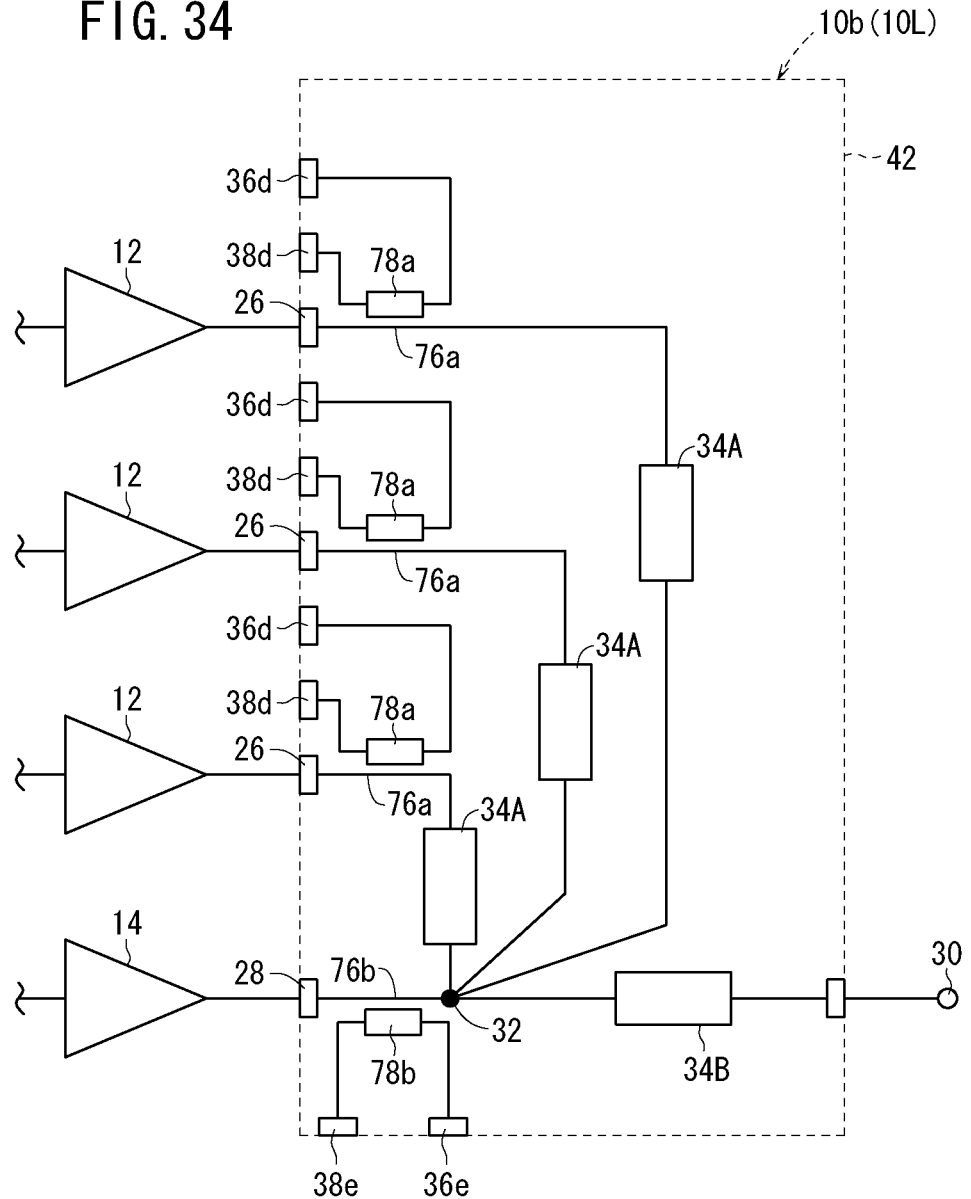
FIG. 34 is a block diagram showing a circuit arrangement of a combiner for a Doherty amplifier according to a second modification.

As shown in FIG. 34, a combiner 10b according to a second modification is connected to an N-way Doherty amplifier (N is an integer of 3 or greater) including a peak amplifier 14 and a plurality of parallel carrier amplifiers 12. The combiner 10b, which is mainly applied as the twelfth combiner 10L, for example, will be described below. The combiner 10b comprises a plurality of carrier input terminals 26 connected to the respective carrier amplifiers 12, a peak input terminal 28 connected to the peak amplifier 14, an output terminal 30, a plurality of first λ/4 lines 34A connected respectively between the carrier input terminals 26 and a combining point 32, and a second λ/4 line 34B connected between the combining point 32 and the output terminal 30.

The combiner 10b also includes a plurality of first monitor lines 78a extending parallel to respective first lines 76a between the carrier input terminals 26 and the corresponding first λ/4 lines 34A and electromagnetically coupled to the respective first lines 76a, and a second monitor line 78b extending parallel to a second line 76b between the peak input terminal 28 and the combining point 32 and electromagnetically coupled to the second line 76b.

The first monitor lines 78a have respective ends connected to corresponding fourth monitor terminals 36d and the respective other ends connected to corresponding fourth termination terminals 38d. The second monitor line 78b has an end connected to a fifth monitor terminal 36e and the other end connected to a fifth termination terminal 38e. Although not shown in FIG. 34, fourth monitor circuits 50d (see FIG. 29) are connected respectively to the fourth monitor terminals 36d for supplying respective signals to corresponding first controllers 74a. Similarly, a fifth monitor circuit 50e (see FIG. 29) is connected to the fifth monitor terminal 36e for supplying a signal to the second controller 74b.

Since the combiner 10b according to the second modification has the plural first λ/4 lines 34A connected respectively to the carrier amplifiers 12, the combiner 10b is capable of improving gain and phase distortions of the N-way Doherty amplifier which has a high efficiency in a wider output range, without a reduction in the amplifier efficiency thereof.

A combiner for a Doherty amplifier (hereinafter referred to as "fourteenth combiner 10N") according to a fourteenth embodiment of the present invention will be described below with reference to FIGS. 35 and 36.

Figure 35:
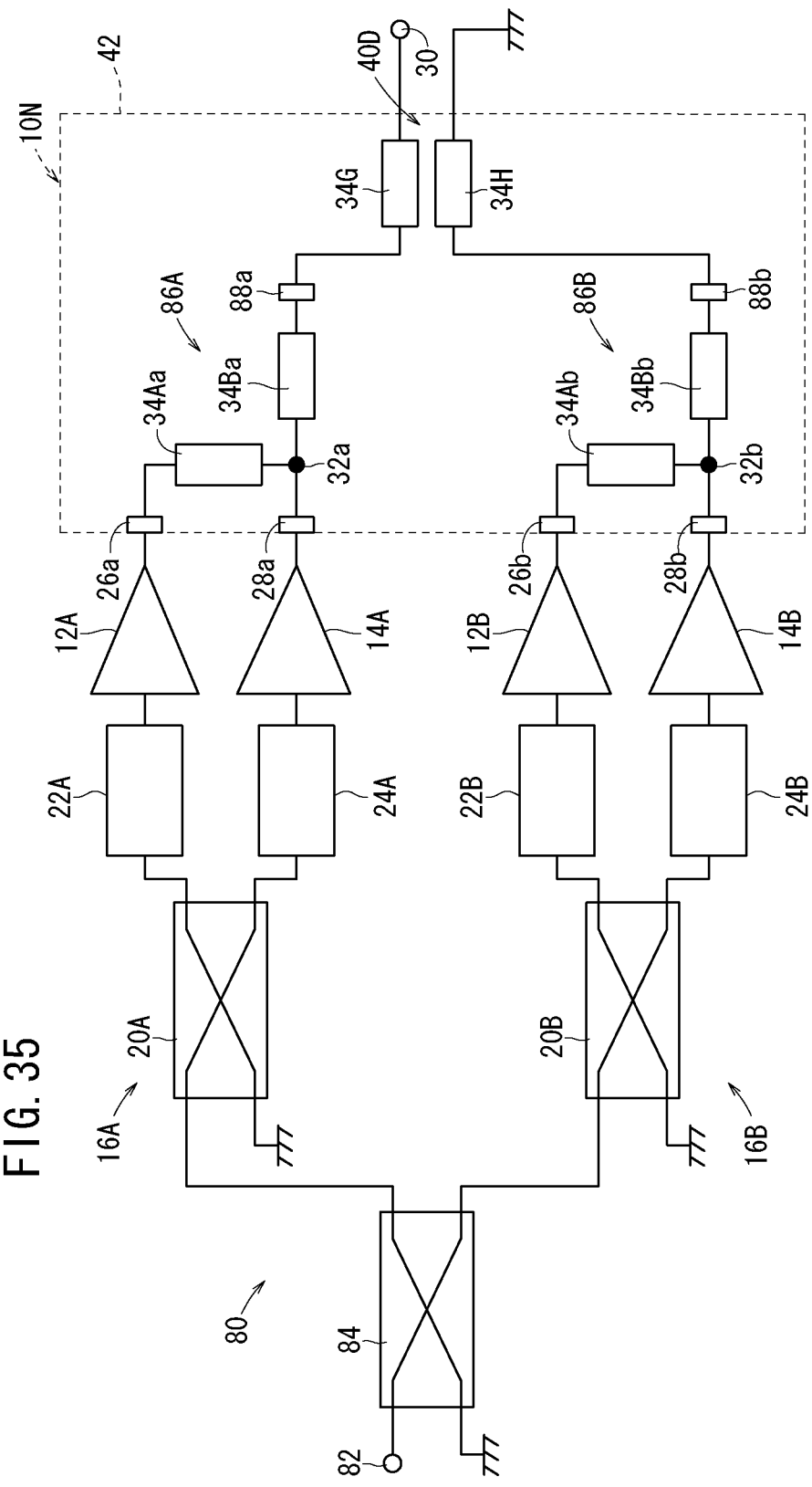
FIG. 35 is a block diagram showing a circuit arrangement of a combiner for a Doherty amplifier (fourteenth combiner) according to a fourteenth embodiment of the present invention.

As shown in FIG. 35, the fourteenth combiner 10N is a circuit connected to the output terminals of a composite Doherty amplifier 80 which comprises two parallel Doherty amplifiers (a first Doherty amplifier 16A and a second Doherty amplifier 16B), for combining an output signal from the first Doherty amplifier 16A and an output signal from the second Doherty amplifier 16B.

The composite Doherty amplifier 80 comprises a signal divider 84 for dividing an input signal from an input terminal 82 into two signals, the first Doherty amplifier 16A for being supplied with a first input signal from the signal divider 84, and the second Doherty amplifier 16B for being supplied with a second input signal from the signal divider 84.

The first Doherty amplifier 16A comprises a first signal divider 20A for dividing the first input signal into two signals, a first carrier amplifier 12A biased into class AB, a first carrier impedance matching section 22A for achieving impedance matching between one of the outputs of the first signal divider 20A and an input of the first carrier amplifier 12A, a first peak amplifier 14A biased into class B or class C, and a first peak impedance matching section 24A for achieving impedance matching between the other output of the first signal divider 20A and an input of the first peak amplifier 14A.

The second Doherty amplifier 16B comprises a second signal divider 20B, a second carrier amplifier 12B, a second peak amplifier 14B, a second carrier impedance matching section 22B, and a second peak impedance matching section 24B, which are identical respectively to the first signal divider 20A, the first carrier amplifier 12A, the first peak amplifier 14A, the first carrier impedance matching section 22A, and the first peak impedance matching section 24A of the first Doherty amplifier 16A.

The fourteenth combiner 10N includes a first combining section 86A connected to the first Doherty amplifier 16A and a second combining section 86B connected to the second Doherty amplifier 16B.

The first combining section 86A comprises a first carrier input terminal 26a for being supplied with an output signal from the first carrier amplifier 12A, a first peak input terminal 28a for being supplied with an output signal from the first peak amplifier 14A, a first combining point 32a where the output signal from the first carrier amplifier 12A and the output signal from the first peak amplifier 14A are combined, a first λ/4 line 34Aa connected between the first carrier input terminal 26a and the first combining point 32a, a first output node 88a for producing an output signal of the first combining section 86A, and a second λ/4 line 34Ba connected between the first combining point 32a and the first output node 88a.

The second combining section 86B comprises a second carrier input terminal 26b, a second peak input terminal 28b, a second combining point 32b, a first λ/4 line 34Ab, a second output node 88b, and a second λ/4 line 34Bb, which are identical respectively to the first carrier input terminal 26a, the first peak input terminal 28a, the first combining point 32a, the first λ/4 line 34Aa, the first output node 88a, and the second λ/4 line 34Ba of the first combining section 86A.

The fourteenth combiner 10N further includes a seventh λ/4 line 34G connected between the first output node 88a and an output terminal 30 and an eighth λ/4 line 34H connected between the second output node 88b and GND (ground) and electromagnetically coupled to the seventh λ/4 line 34G. The seventh λ/4 line 34G and the eighth λ/4 line 34H jointly make up a directional coupler (fourth directional coupler 40D).

The first combining section 86A, the second combining section 86B and the fourth directional coupler 40D are integrally formed with each other in a dielectric substrate 42.

Figure 36:
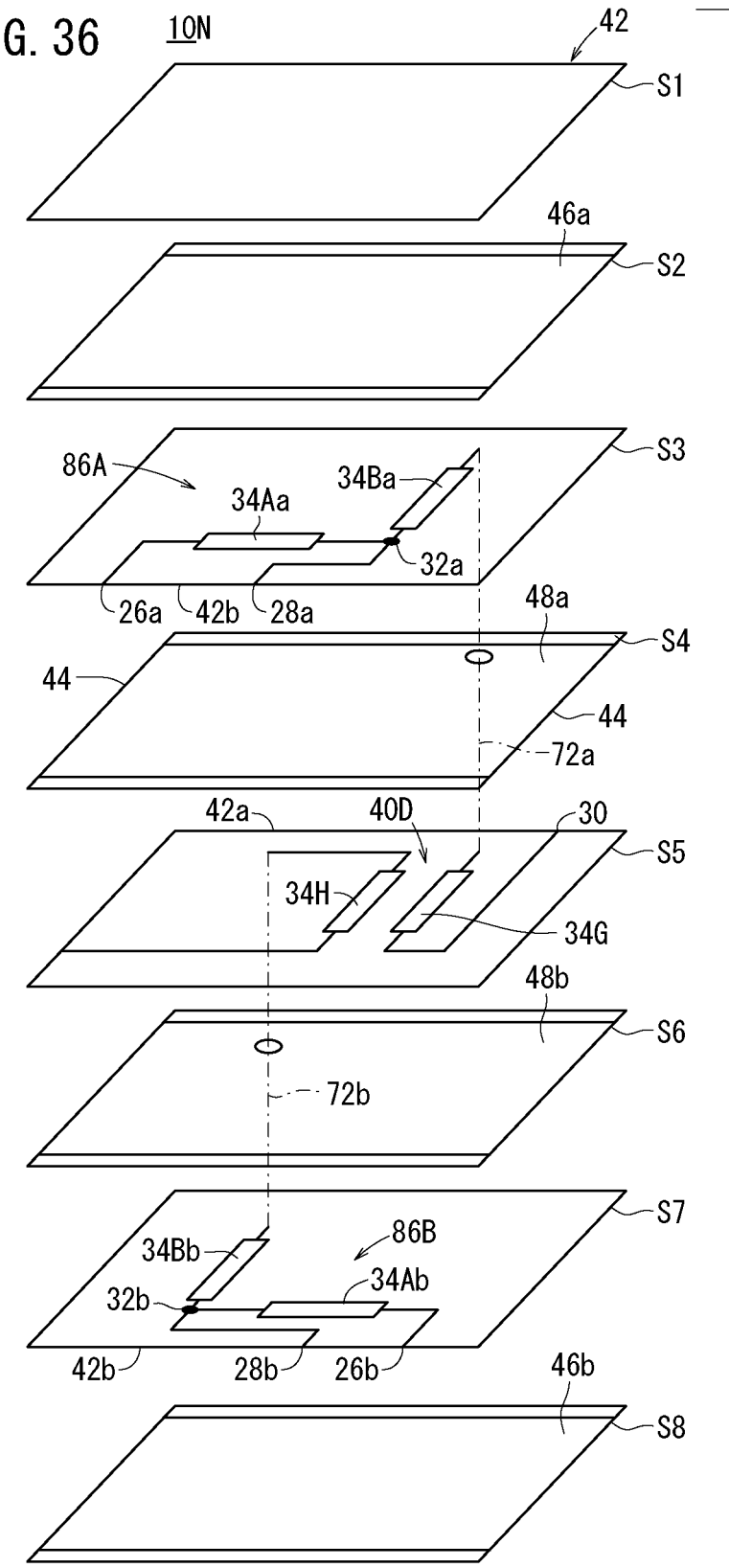
FIG. 36 is an exploded perspective view of the fourteenth combiner.

As shown in FIG. 36, at least the first carrier input terminal 26a, the first peak input terminal 28a, the second carrier input terminal 26b and the second peak input terminal 28b are disposed on the second side surface 42b of the dielectric substrate 42, and at least the output terminal 30 is disposed on the first side surface 42a of the dielectric substrate 42.

The dielectric substrate 42 comprises first through eighth dielectric layers S1 through S8, arranged successively from above, stacked together. Each of the first through eighth dielectric layers S1 through S8 comprises a single layer or a plurality of layers.

The first λ/4 line 34Aa, the second λ/4 line 34Ba and the first combining point 32a of the first combining section 86A are disposed on a principal surface of the third dielectric layer S3. The first inner-layer shield electrode 48a that is connected to the shield terminals 44 is disposed on a principal surface of the fourth dielectric layer S4. The seventh λ/4 line 34G and the eighth λ/4 line 34H of the fourth directional coupler 40D are disposed on a principal surface of the fifth dielectric layer S5. The second inner-layer shield electrode 48b that is connected to the shield terminals 44 is disposed on a principal surface of the sixth dielectric layer S6. The first λ/4 line 34Ab, the second λ/4 line 34Bb and the second combining point 32b of the second combining section 86B are disposed on a principal surface of the seventh dielectric layer S7.

The first λ/4 line 34Aa has an end connected to the first carrier input terminal 26a. The second λ/4 line 34Ba has an end connected through the first combining point 32a to the other end of the first λ/4 line 34Aa and the first peak input terminal 28a. The other end of the second λ/4 line 34Ba is connected to an end of the seventh λ/4 line 34G through a first via hole 72a defined through the third dielectric layer S3 and the fourth dielectric layer S4, and the other end of the seventh λ/4 line 34G is connected to the output terminal 30.

Similarly, the first λ/4 line 34Ab has an end connected to the second carrier input terminal 26b. The second λ/4 line 34Bb has an end connected through the second combining point 32b to the other end of the first λ/4 line 34Ab and the second peak input terminal 28b. The other end of the second λ/4 line 34Bb is connected to an end of the eighth λ/4 line 34H through a second via hole 72b defined through the fifth dielectric layer S5 and the sixth dielectric layer S6, and the other end of the eighth λ/4 line 34H is connected to the shield terminals 44.

Generally, there are a wide variety of cellular telephone base stations from high-power base stations placed in suburban areas to small-size base stations covering facilities only. Of those cellular telephone base stations, some base stations having large output power requirements employ a transmission amplifier having two parallel amplifiers such as the composite Doherty amplifier 80. A combiner for use with the composite Doherty amplifier 80 is required to have two combining sections to be connected respectively to the two Doherty amplifiers and a directional coupler for combining the output signals from the Doherty amplifiers. Since the composite Doherty amplifier handles greater output power than a single Doherty amplifier, the Doherty amplifiers tend to suffer serious problems such as an amplifier breakdown due to a slight mismatch or phase change and output reflections. When the composite Doherty amplifier is to be installed on a circuit board, it is necessary to take into account the positions where the components (the two combining sections, the directional coupler, etc.) are to be placed on the circuit board and effects of the circuit board on the components. Since design freedom is limited as described above, in order to achieve good characteristics for required specifications, many combiner prototypes have to be produced and analyzed repeatedly, and hence a large expenditure of labor and time is needed until a desired combiner is produced.

The fourteenth combiner 10N includes the first combining section 86A connected to the first Doherty amplifier 16A, the second combining section 86B connected to the second Doherty amplifier 16B and the fourth directional coupler 40D for combining the output signals from the first combining section 86A and the second combining section 86B, and the first combining section 86A, the second combining section 86B and the fourth directional coupler 40D are integrally formed with each other in the dielectric substrate 42. Therefore, the first combining section 86A, the second combining section 86B and the fourth directional coupler 40D may be mounted on the circuit board as one chip. As they are constructed in the form of striplines in the dielectric substrate 42, they are less affected by the circuit board, and can be designed with large freedom. It is thus easy to achieve good characteristics for required specifications and a desired output level.

Two preferable modifications (third and fourth modifications) of the first through fourteenth combiners 10A through 10N will be described below with reference to FIGS. 37 and 38.

Figure 37:
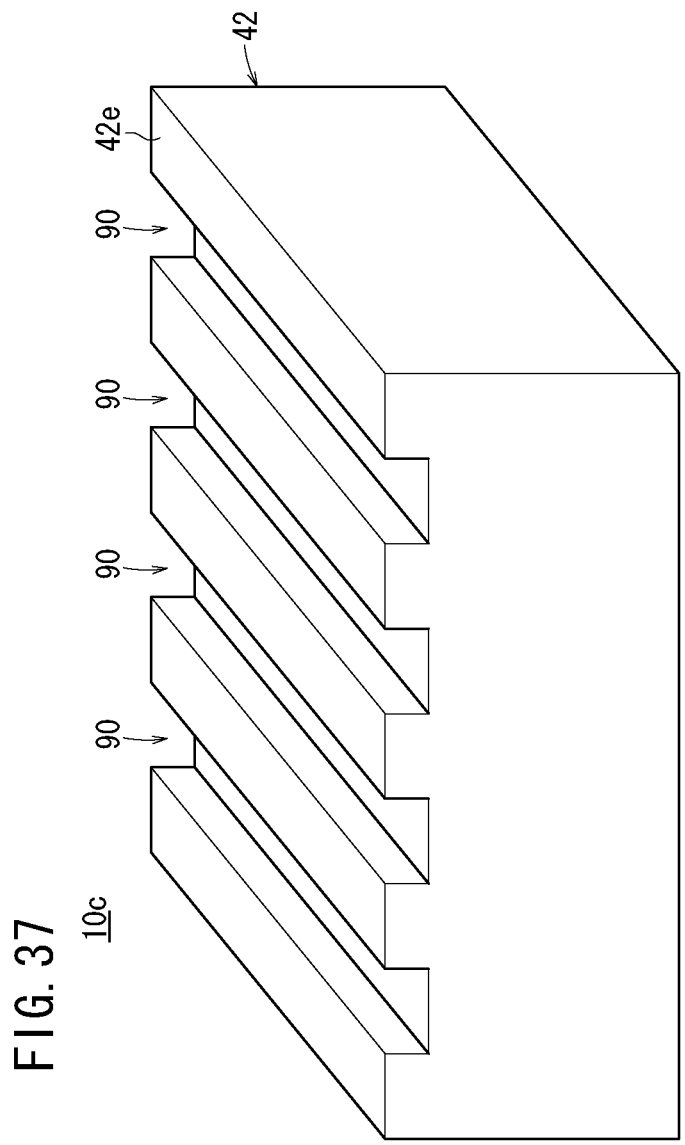
FIG. 37 is a perspective view of a combiner for a Doherty amplifier according to a third modification.

As shown in FIG. 37, a combiner 10c according to a third modification has a plurality of grooves 90 defined in a surface (e.g., an upper surface 42e) of the dielectric substrate 42 which is opposite to the surface on which the circuit board is placed.

Generally, Doherty amplifiers are liable to produce heat because of the high-frequency electric powers amplified by the carrier amplifier 12 and the peak amplifier 14 are combined therein. The grooves 90 defined in the dielectric substrate 42 are effective to dissipate the heat generated in the combiner 10c into the atmosphere. Therefore, the loss caused by the combiner 10c due to the heat is prevented from increasing, and hence the combiner 10c has a higher allowable input level.

Figure 38:
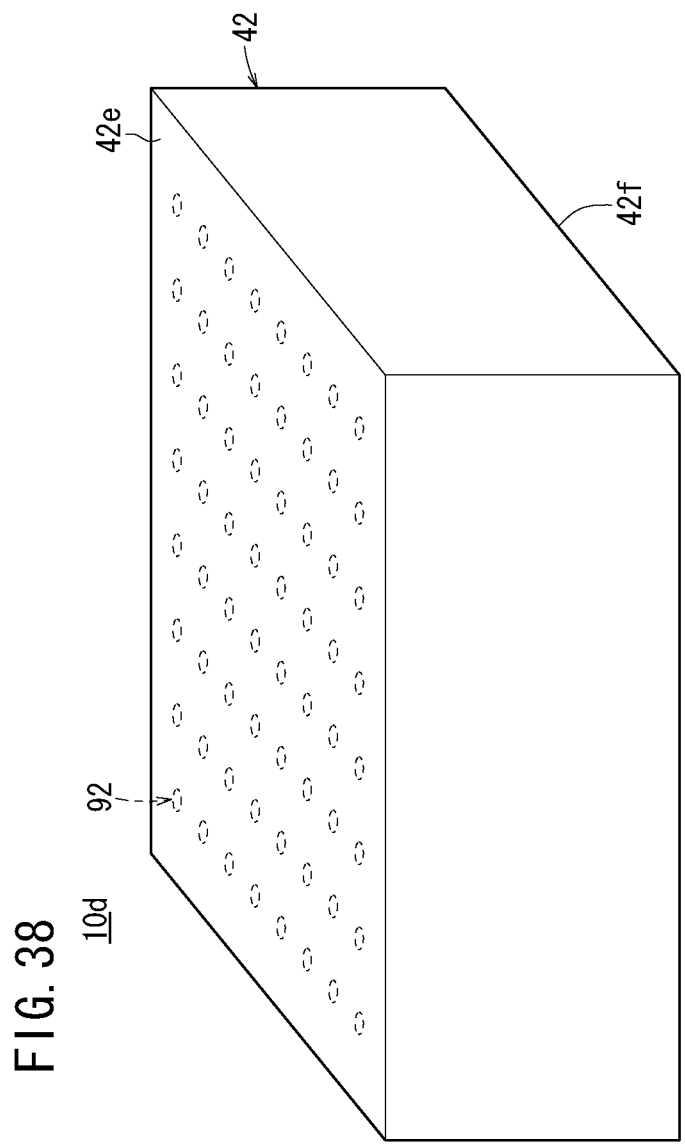
FIG. 38 is a perspective view of a combiner for a Doherty amplifier according to a fourth modification.

As shown in FIG. 38, a combiner 10d according to a fourth modification has a plurality of thermal vias 92 defined in the dielectric substrate 42. The thermal vias 92 may be defined in a region extending from the upper surface 42e of the dielectric substrate 42 to the upper shield electrode 46a (see FIG. 3), or a region extending from the lower surface 42f of the dielectric substrate 42 to the lower shield electrode 46b (see FIG. 3), or the like.

When signals from the carrier amplifier 12 and the peak amplifier 14 are input to the combiner 10d, the combiner 10d produces heat therein. The heat generated in the combiner 10d is dissipated through the thermal vias 92 into the atmosphere or the circuit board. Therefore, the loss caused by the combiner 10d due to the heat is prevented from increasing, and hence the combiner 10d has a higher allowable input level.

1st Example

The output characteristics of Comparative example 1 and Inventive examples 1 through 3 were confirmed.

Comparative Example 1

Figure 39:
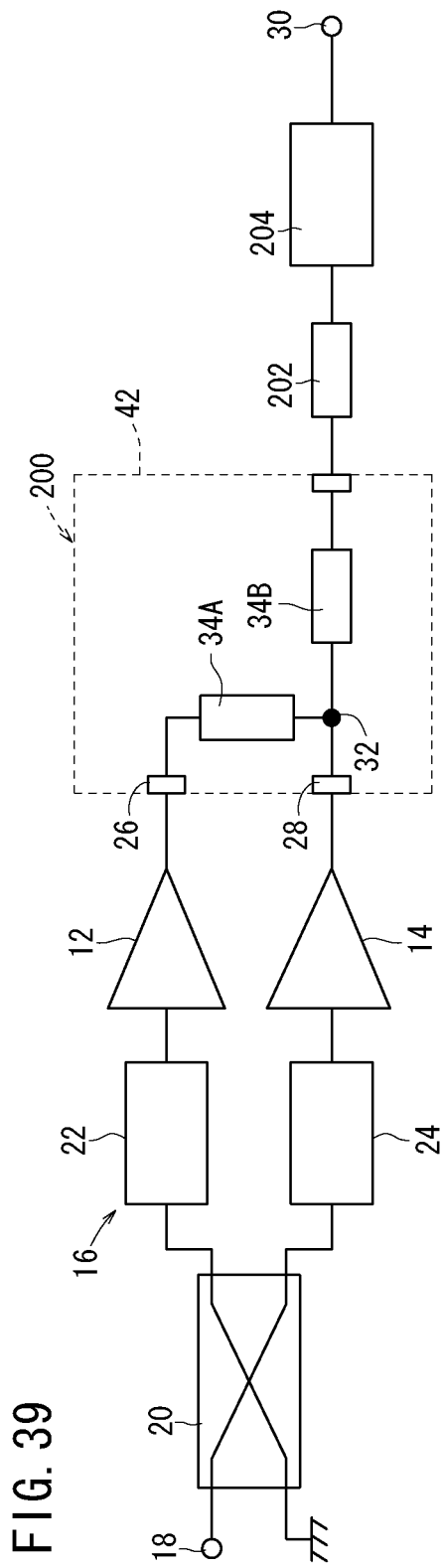
FIG. 39 is a block diagram showing a circuit arrangement of a combiner for a Doherty amplifier according to Comparative Example 1.

As shown in FIG. 39, a combiner 200 according to Comparative example 1 was connected to the output terminals of an ordinary Doherty amplifier 16 having a signal divider 20, a carrier impedance matching section 22, a peak impedance matching section 24, a carrier amplifier 12, and a peak amplifier 14, and a 30 dB directional coupler 204 was connected to the output terminal of the combiner 200 through a microstrip line 202 (1 cm) having a characteristic impedance of 50 ohms. Specifically, the Doherty amplifier 16, the combiner 200 according to Comparative example 1, the microstrip line 202 and the directional coupler 204 were mounted on a circuit board. The combiner 200 according to Comparative example 1 includes a first λ/4 line 34A, a combining point 32, and a second λ/4 line 34B which were constructed as a chip.

The gain and amplifier efficiency of the Doherty amplifier 16 were measured based on a signal output from an output terminal 30. The output signal from the combiner 200 according to Comparative example 1 was of 52.8 dBm.

Then, the insertion loss of an overall assembly including a microstrip line 202 and a 30 dB directional coupler 204 which were of the same length as those mounted on the circuit board was measured. The measured insertion loss was of 0.16 dB.

Therefore, a power loss caused by the microstrip line 202 and the directional coupler 204 was calculated at 7.1 W.

Inventive Example 1

An ordinary Doherty amplifier 16 and the ninth combiner 10I shown in FIGS. 23 and 24 were mounted on a circuit board, a carrier amplifier 12 was connected to the carrier input terminal 26 of the ninth combiner 10I, and a peak amplifier 14 was connected to the peak input terminal 28 of the ninth combiner 10I.

The gain and amplifier efficiency of the Doherty amplifier 16 were measured based on a signal output from the third monitor circuit 50c connected to the third monitor terminal 36c. The output signal from the ninth combiner 10I was of 52.9 dBm.

The ninth combiner 10I, which includes the combining section and the third directional coupler 40C integrally formed with each other in the dielectric substrate 42, caused a power loss of 3.9 W, which showed an improvement of 4.4 W over Comparative example 1. As the amplifier efficiency of the Doherty amplifier was of 45%, the electric power consumption was improved by 9.8 W. The improvement was considered to result from the fact that Inventive example 1 was free of the wiring loss caused by the mounted microstrip line 202 in Comparative example 1 and the interconnect length was minimized because the combining section including the first λ/4 line 34A, the combining point 32 and the second λ/4 line 34B, and the third directional coupler 40C were stacked vertically with the inner-layer shield electrode 48 being interposed therebetween, as shown in FIG. 24.

Inventive Example 2

An ordinary Doherty amplifier 16 and the first combiner 10A shown in FIGS. 1 through 3 were mounted on a circuit board, a carrier amplifier 12 was connected to the carrier input terminal 26 of the first combiner 10A, and a peak amplifier 14 was connected to the peak input terminal 28 of the first combiner 10A.

The gain and amplifier efficiency of the Doherty amplifier 16 were measured based on a signal output from the first monitor circuit 50a connected to the first monitor terminal 36a. The output signal from the first combiner 10A was of 52.95 dB, which showed an improvement of 6.7 W over Comparative example 1. The electric power consumption was improved by 14 W.

The improvement was considered to result from the fact that Inventive example 2 was free of the wiring loss caused by the mounted microstrip line 202 in Comparative example 1 and the loss caused by the added directional coupler 204.

Inventive Example 3

An ordinary Doherty amplifier 16 and the fourth combiner 10D shown in FIGS. 14 and 15 were mounted on a circuit board, a carrier amplifier 12 was connected to the carrier input terminal 26 of the fourth combiner 10D, and a peak amplifier 14 was connected to the peak input terminal 28 of the fourth combiner 10D.

The gate bias of the carrier amplifier 12 was controlled based on a signal (high-frequency signal envelope) output from the second monitor circuit 50b connected to the second monitor terminal 36b. When an ACLR (Adjacent Channel Leakage Ratio) was measured using a W-CDMA signal, the ACLR was found to be improved from −45 dBc by 2 dBc.

2nd Example

The output characteristics of Comparative example 2 and Inventive examples 11 through 12 were confirmed.

Comparative Example 2

Figure 40:
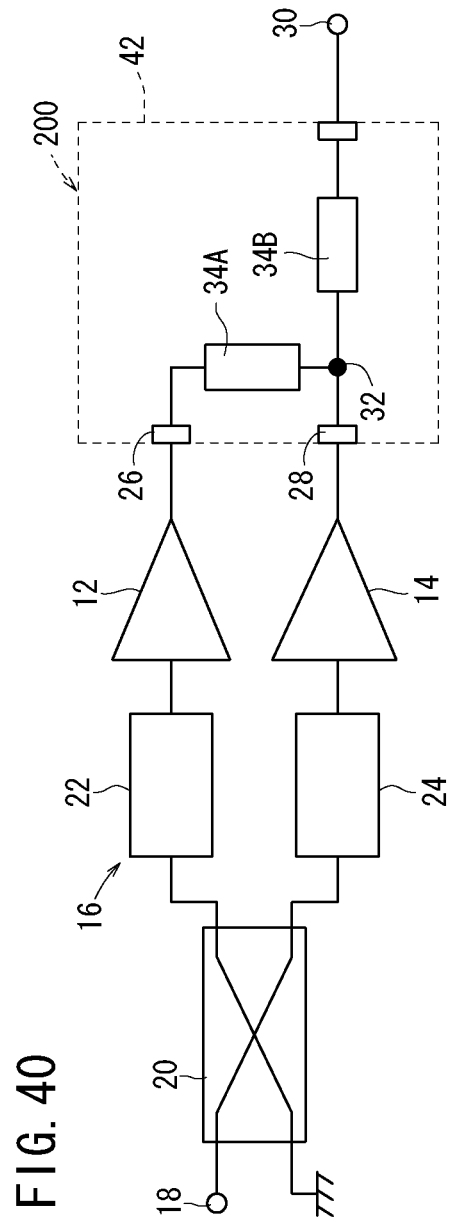
FIG. 40 is a block diagram showing a circuit arrangement of a combiner for a Doherty amplifier according to Comparative Example 2.

As shown in FIG. 40, a combiner 200 according to Comparative example 2 was connected to the output terminals of an ordinary Doherty amplifier 16 having a signal divider 20, a carrier impedance matching section 22, a peak impedance matching section 24, a carrier amplifier 12, and a peak amplifier 14. Specifically, the Doherty amplifier 16 and the combiner 200 according to Comparative example 2 were mounted on a circuit board. The combiner 200 according to Comparative example 2 includes a first λ/4 line 34A, a combining point 32, and a second λ/4 line 34B which were constructed as a chip.

Figure 41:
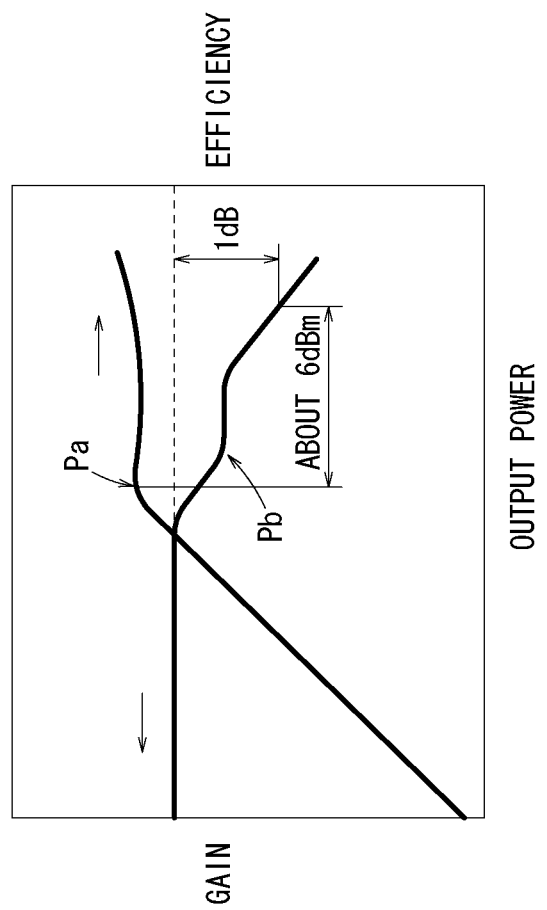
FIG. 41 is a graph showing gain and efficiency curves of Comparative Example 2.

The basic characteristics, i.e., gain and efficiency, of the Doherty amplifier 16 were measured. The measured gain and efficiency were represented by characteristic curves shown in FIG. 41. The Doherty amplifier 16 used a 3 dB hybrid coupler as the signal divider 20. Therefore, the efficiency curve had an inflection point Pa at an output level which was about 6 dB lower than the maximum output level (at which the gain was lowered by 1 dB). If the efficiency was to further increase from the inflection point Pa, then an inflection point Pb occurred in the gain curve.

Depending on the PAPR (Peak Average Power Ratio) of a signal handled by the Doherty amplifier 16, a signal divide ratio of the signal divider 20 can be optionally selected. For example, PAPR of 8 dB can be achieved by using a 5 dB asymmetrical coupler as the signal divider 20.

The distortions of the Doherty amplifier 16 were measured before and after the distortions were compensated by the DPD (Digital Pre Distortion) technology. The distortions were evaluated based on an ACLR (Adjacent Channel Leakage power Ratio) using a W-CDMA input signal.

According to Comparative example 2, the ACLR was of −45 dBc before the distortions were compensated, and −50 dBc after the distortions were compensated. Therefore, the distortions were improved by only −5 dBc when they were compensated.

Inventive Example 11

An ordinary Doherty amplifier 16 and the tenth combiner 10J shown in FIGS. 25 and 26 were mounted on a circuit board, a carrier amplifier 12 was connected to the carrier input terminal 26 of the tenth combiner 10J, and a peak amplifier 14 was connected to the peak input terminal 28 of the tenth combiner 10J. An output signal from the fourth monitor circuit 50d connected to the fourth monitor terminal 36d was input to the first controller 74a for controlling the gate bias voltage of the carrier amplifier 12 based on the amplitude level of the carrier signal from the carrier amplifier 12.

Figure 42:
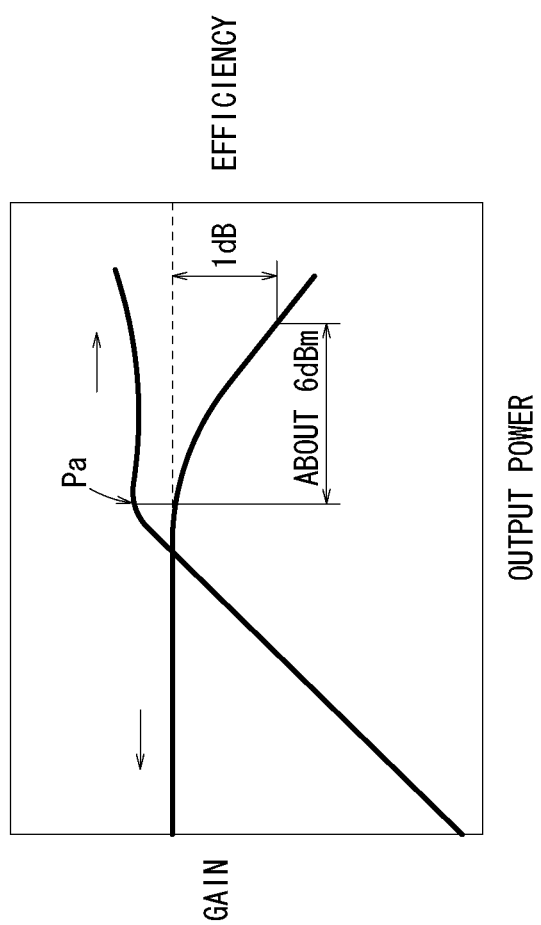
FIG. 42 is a graph showing gain and efficiency curves of Inventive Example 11.
Figure 45:
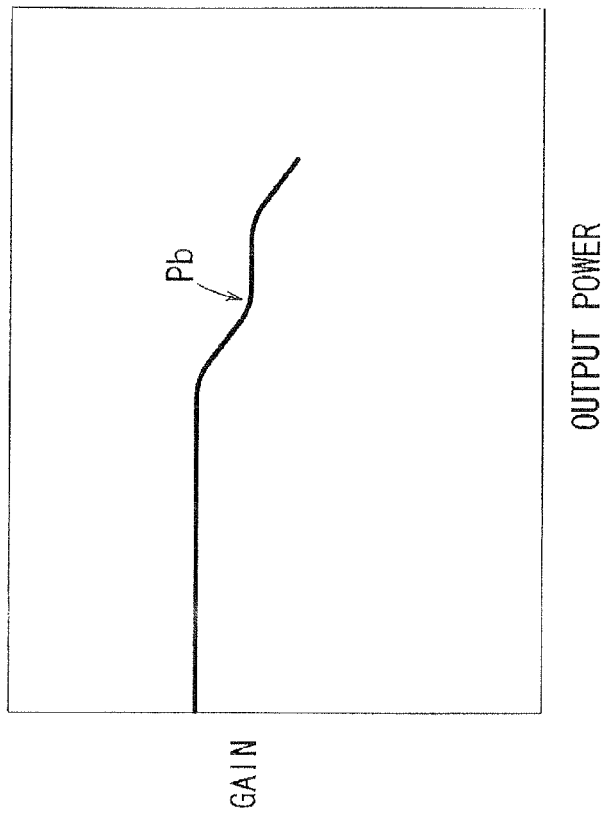
FIG. 45 is a graph showing an AM/AM distortion curve of a Doherty amplifier with emphasis on efficiency.

In Inventive example 11, the gain of the carrier amplifier 12 can be prevented from decreasing, by increasing the gate bias voltage of the carrier amplifier 12 in an output range where the gain of the carrier amplifier 12 starts to drop. Thus, the inflection point Pb (see FIGS. 41 and 45) of the gain curve of the ordinary Doherty amplifier 16 disappeared as shown in FIG. 42, thereby making it easy to compensate for the distortions according to the DPD technology.

Inventive example 11 was measured for estimation of distortions under the same conditions as with Comparative example 2. According to Inventive example 11, the ACLR was of −45 dBc before the distortions were compensated, and −56 dBc after the distortions were compensated. Therefore, the distortions were improved by −6 dBc compared with Comparative example 2.

Inventive Example 12

Figure 30:
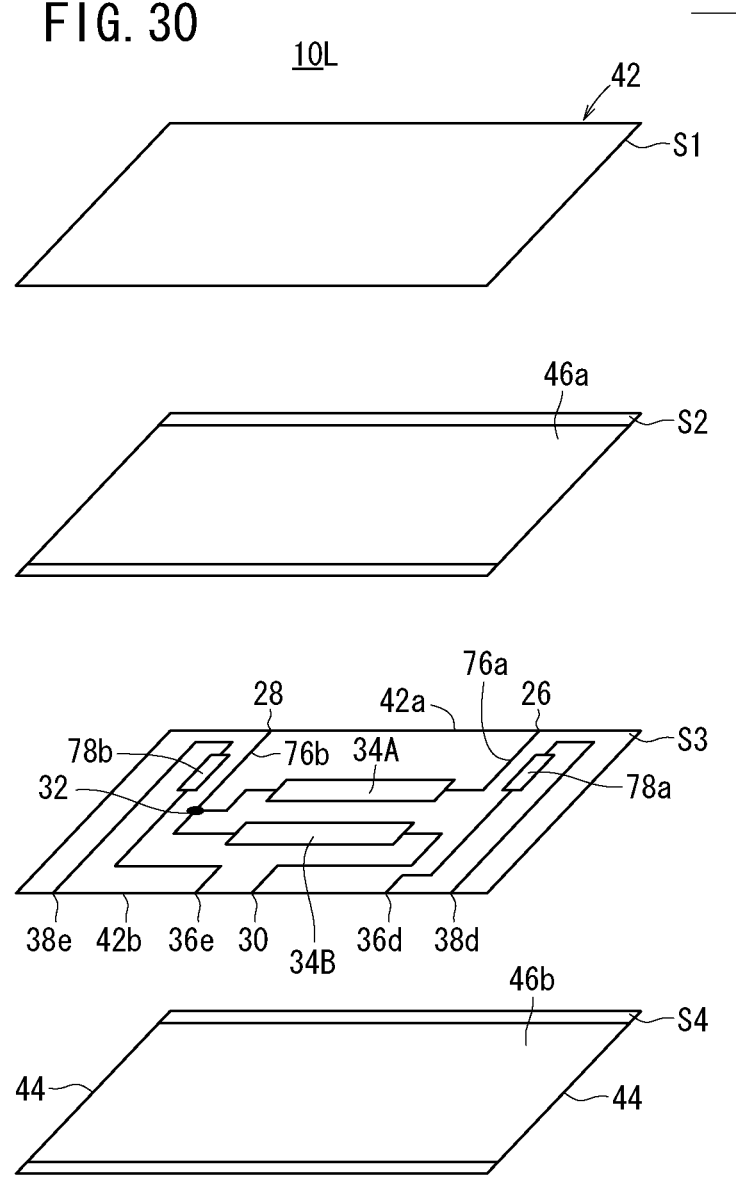
FIG. 30 is an exploded perspective view of the twelfth combiner.

An ordinary Doherty amplifier 16 and the twelfth combiner 10L shown in FIGS. 29 and 30 were mounted on a circuit board, a carrier amplifier 12 was connected to the carrier input terminal 26 of the twelfth combiner 10L, and a peak amplifier 14 was connected to the peak input terminal 28 of the twelfth combiner 10L. An output signal from the fourth monitor circuit 50d connected to the fourth monitor terminal 36d was input to the first controller 74a for controlling the gate bias voltage of the carrier amplifier 12 based on the amplitude level of the carrier signal from the carrier amplifier 12, and an output signal from the fifth monitor circuit 50e connected to the fifth monitor terminal 36e was input to the second controller 74b for controlling the gate bias voltage of the peak amplifier 14 based on the amplitude level of the peak signal from the peak amplifier 14.

Figure 43:
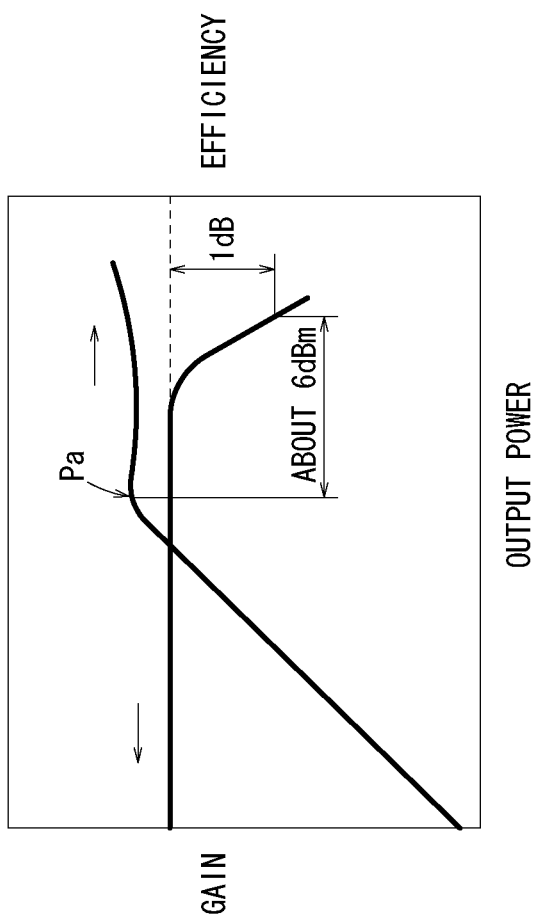
FIG. 43 is a graph showing gain and efficiency curves of Inventive Example 12.
Figure 44:
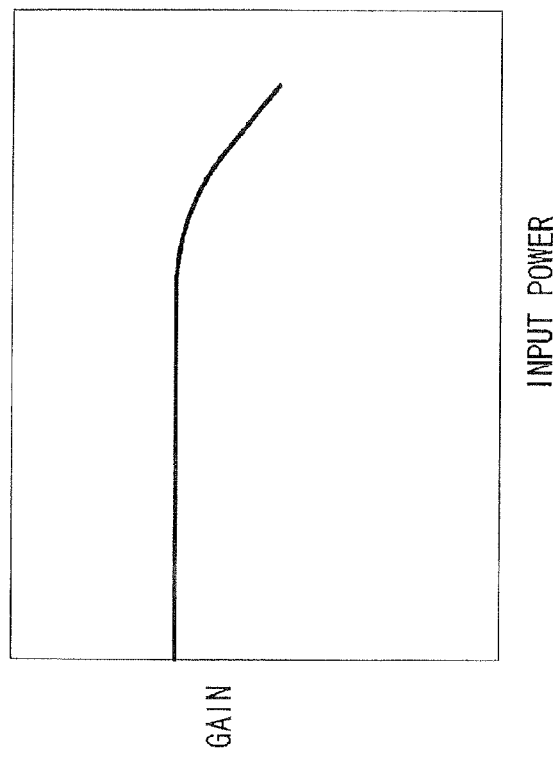
FIG. 44 is a graph showing a simple AM/AM distortion curve.

In Inventive example 12, the gain of the carrier amplifier 12 can be prevented from decreasing and the gain of the peak amplifier 14 can be also prevented from decreasing. Thus, the gain is further prevented from dropping in a high output range compared with Inventive example 11, as shown in FIG. 43. As a result, it is easier to compensate for the distortions according to the DPD technology.

Inventive example 12 was measured for estimation of distortions under the same conditions as with Comparative example 2. According to Inventive example 12, the ACLR was of −48 dBc before the distortions were compensated, and −61 dBc after the distortions were compensated. Therefore, the distortions were improved by −8 dBc compared with Comparative example 2.

Although certain preferred embodiments of the present invention have been shown and described in detail, it should be understood that various changes and modifications may be made therein without departing from the scope of the appended claims.

What is claimed is:

1. A combiner for a Doherty amplifier, for being connected to output terminals of the Doherty amplifier including a carrier amplifier and a peak amplifier and combining an output signal from the carrier amplifier and an output signal from the peak amplifier, the combiner comprising:

a first input terminal for being supplied with the output signal from the carrier amplifier;

a second input terminal for being supplied with the output signal from the peak amplifier;

an output terminal for outputting a signal obtained by combining the output signal from the carrier amplifier and the output signal from the peak amplifier;

a combining point for combining the output signal from the carrier amplifier and the output signal from the peak amplifier;

a first λ/4 line connected between the first input terminal and the combining point;

a second λ/4 line connected between the combining point and the output terminal;

signal monitoring means for monitoring at least one of a signal flowing from the first input terminal to the combining point, a signal flowing from the second input terminal to the combining point, and a signal flowing from the combining point to the output terminal; and a dielectric substrate comprising a plurality of stacked dielectric layers, wherein the signal monitoring means comprises a directional coupler, and the directional coupler has a third λ/4 line electromagnetically coupled to one of the first λ/4 line or the second λ/4 line that is to be monitored, a monitor terminal connected to an end of the third λ/4 line, and a termination resistor connected to another end of the third λ/4 line, wherein at least the first input tell final, the second input terminal, the output terminal and the monitor terminal are disposed on surfaces of the dielectric substrate, and the first λ/4 line, the second λ/4 line and the third λ/4 line are disposed in the dielectric substrate, and wherein an inner-layer shield electrode is disposed in the dielectric substrate, the inner-layer shield electrode lying between the first λ/4 line and the second λ/4 line, and the third λ/4 line lying on a side of the one to be monitored of the first λ/4 line and the second λ/4 line.

2. A combiner for a Doherty amplifier, for being connected to output terminals of the Doherty amplifier including a carrier amplifier and a peak amplifier and combining an output signal from the carrier amplifier and an output signal from the peak amplifier, the combiner comprising:

a first input terminal for being supplied with the output signal from the carrier amplifier;
a second input terminal for being supplied with the output signal from the peak amplifier;
an output terminal for outputting a signal obtained by combining the output signal from the carrier amplifier and the output signal from the peak amplifier;
a combining point for combining the output signal from the carrier amplifier and the output signal from the peak amplifier;
a first λ/4 line connected between the first input terminal and the combining point;
a second λ/4 line connected between the combining point and the output terminal;
signal monitoring means for monitoring at least one of a signal flowing from the first input terminal to the combining point, a signal flowing from the second input terminal to the combining point, and a signal flowing from the combining point to the output terminal; and
a dielectric substrate comprising a plurality of stacked dielectric layers,
wherein the signal monitoring means comprises a directional coupler; and
the directional coupler comprises:
a fifth λ/4 line connected between the second λ/4 line and the output terminal; and
a sixth λ/4 line electromagnetically coupled to the fifth λ/4 line,
the combiner further comprises a monitor terminal connected to an end of the sixth λ/4 line; and
a termination resistor connected to another end of the sixth λ/4 line; and
wherein at least the first input terminal, the second input terminal, the output terminal and the monitoring terminal are disposed on surfaces of the dielectric substrate;
the first λ/4 line, the second λ/4 line, the fifth λ/4 line and the sixth λ/4 line are disposed in the dielectric substrate; and
an inner-layer shield electrode disposed in the dielectric substrate and lying between the first λ/4 line and the second λ/4 line, and the fifth λ/4 line and the sixth λ/4 line.

3. A combiner for a Doherty amplifier, for being connected to output terminals of the Doherty amplifier including a carrier amplifier and a peak amplifier and combining an output signal from the carrier amplifier and an output signal from the peak amplifier, the combiner comprising:
a first input terminal for being supplied with the output signal from the carrier amplifier;
a second input terminal for being supplied with the output signal from the peak amplifier;
an output terminal for outputting a signal obtained by combining the output signal from the carrier amplifier and the output signal from the peak amplifier;
a combining point for combining the output signal from the carrier amplifier and the output signal from the peak amplifier;
a first λ/4 line connected between the first input terminal and the combining point;
a second λ/4 line connected between the combining point and the output terminal;
signal monitoring means for monitoring at least one of a signal flowing from the first input terminal to the combining point, a signal flowing from the second input terminal to the combining point, and a signal flowing from the combining point to the output terminal; and
a dielectric substrate comprising a plurality of stacked dielectric layers,
wherein at least the first input terminal, the second input terminal and the output terminal are disposed on surfaces of the dielectric substrate; and
the first λ/4 line and the second λ/4 line are disposed in the dielectric substrate, and
wherein the signal monitoring means comprises:
a first monitor terminal for outputting amplitude information of a carrier signal from the carrier amplifier;
a first monitor line extending parallel to a first line between the first input terminal and the first λ/4 line and electromagnetically coupled to the first line, the first monitor line being connected to the first monitor terminal;
a second monitor terminal for outputting amplitude information of a peak signal from the peak amplifier; and
a second monitor line extending parallel to a second line between the second input terminal and the first λ/4 line and electromagnetically coupled to the second line, the second monitor line being connected to the second monitor terminal.

4. The combiner according to claim 3, further comprising:
a first monitor circuit connected to the first monitor terminal, for monitoring an output signal from the first monitor line; and
a second monitor circuit connected to the second monitor terminal, for monitoring an output signal from the second monitor line,
wherein the first monitor circuit and the second monitor circuit include diodes, respectively.

5. A combiner for a Doherty amplifier, for being connected to output terminals of a Doherty amplifier including a plurality of carrier amplifiers and a peak amplifier and combining output signals from the carrier amplifiers and an output signal from the peak amplifier, the combiner comprising:
a plurality of first input terminals for being supplied with the output signals from the carrier amplifiers;
a second input terminal for being supplied with the output signal from the peak amplifier;
an output terminal for outputting a signal obtained by combining the output signals from the carrier amplifiers and the output signal from the peak amplifier;
a combining point for combining the output signals from the carrier amplifiers and the output signal from the peak amplifier;
a plurality of first λ/4 lines connected respectively between the first input terminals and the combining point;
a second λ/4 line connected between the combining point and the output terminal;
signal monitoring means for monitoring at least one of signals flowing from the first input terminals to the combining point, a signal flowing from the second input terminal to the combining point, and a signal flowing from the combining point to the output terminal; and
a dielectric substrate comprising a plurality of stacked dielectric layers,
wherein the first input terminals, the second input terminal and the output terminal are disposed on surfaces of the dielectric substrate,
the plurality of first λ/4 lines and the second λ/4 line are disposed in the dielectric substrate, and
the combiner further comprises inner-layer shield electrodes disposed in the dielectric substrate and lying respectively between the plurality of first λ/4 lines and between the plurality of first λ/4 lines and the second λ/4 line.

6. A combiner for a Doherty amplifier, for being connected to output terminals of the Doherty amplifier including a carrier amplifier and a peak amplifier and combining an output signal from the carrier amplifier and an output from the peak amplifier, the combiner comprising:
- a first input terminal for being supplied with the output signal from the carrier amplifier;
- a second input terminal for being supplied with the output signal from the peak amplifier;
- an output terminal for outputting a signal obtained by combining the output signal from the carrier amplifier and the output signal from the peak amplifier;
- a combining point for combining the output signal from the carrier amplifier and the output signal from the peak amplifier;
- a first $\lambda/4$ line connected between the first input terminal and the combining point;
- a second $\lambda/4$ line connected between the combining point and the output terminal;
- signal monitoring means for monitoring at least one of a signal flowing from the first input terminal to the combining point, a signal flowing from the second input terminal to the combining point, and a signal flowing from the combining point to the output terminal; and
- a dielectric substrate comprising a plurality of stacked dielectric layers,
- wherein at least the first input terminal, the second input terminal, and the output terminal are disposed on surfaces of the dielectric substrate; and
- the first $\lambda/4$ line, and the second $\lambda/4$ line are disposed in the dielectric substrate,
- wherein the signal monitoring means comprises a directional coupler,
- the directional coupler has a third $\lambda/4$ line electromagnetically coupled to one of the first $\lambda/4$ line or the second $\lambda/4$ line that is to be monitored, and
- the combiner further comprising a fourth $\lambda/4$ line connected to the third $\lambda/4$ line, for matching a characteristic impedance of the third $\lambda/4$ line to a characteristic impedance of the one to be monitored of the first $\lambda/4$ line and the second $\lambda/4$ line.

7. The combiner according to claim 6, wherein the third $\lambda/4$ line, the fourth $\lambda/4$ line, and the one to be monitored of the first $\lambda/4$ line and the second $\lambda/4$ line have respective characteristic impedances which are identical to each other.

8. The combiner according to claim 6, wherein the fourth $\lambda/4$ line has an end connected to an end of the third $\lambda/4$ line, the combiner further comprising:
- a monitor terminal connected to another end of the third $\lambda/4$ line; and
- a termination resistor connected to another end of the fourth $\lambda/4$ line.

9. The combiner according to claim 6, wherein the fourth $\lambda/4$ line has an end connected to an end of the third $\lambda/4$ line, the combiner further comprising:
- a termination resistor connected to another end of the third $\lambda/4$ line; and
- a monitor terminal connected to another end of the fourth $\lambda/4$ line.

10. The combiner according to claim 9,
- wherein the monitor terminal is disposed on the surface of the dielectric substrate; and
- the third $\lambda/4$ line and the fourth $\lambda/4$ line are disposed in the dielectric substrate.

11. The combiner according to claim 10, further comprising:
- a first inner-layer shield electrode disposed in the dielectric substrate and a second inner-layer shield electrode disposed in the dielectric substrate,
- the first inner-layer shield electrode lying between the first $\lambda/4$ line and the second $\lambda/4$ line;
- the third $\lambda/4$ line lying on a side of the one to be monitored of the first $\lambda/4$ line and the second $\lambda/4$ line; and
- the second inner-layer shield electrode lying between the fourth $\lambda/4$ line and the one to be monitored of the first $\lambda/4$ line and the second $\lambda/4$ line.

12. The combiner according to claim 10, wherein the third $\lambda/4$ line and the fourth $\lambda/4$ line are connected to each other through a via hole.

* * * * *